(12) United States Patent
Hill

(10) Patent No.: US 7,298,496 B2
(45) Date of Patent: Nov. 20, 2007

(54) APPARATUS AND METHODS FOR OVERLAY, ALIGNMENT MARK, AND CRITICAL DIMENSION METROLOGIES BASED ON OPTICAL INTERFEROMETRY

(75) Inventor: Henry Allen Hill, Tucson, AZ (US)

(73) Assignee: Zetetic Institute, Tucson, AZ (US)

( * ) Notice: Subject to any disclaimer, the term of this patent is extended or adjusted under 35 U.S.C. 154(b) by 348 days.

(21) Appl. No.: 11/135,605

(22) Filed: May 23, 2005

(65) Prior Publication Data

US 2005/0275848 A1 Dec. 15, 2005

Related U.S. Application Data

(60) Provisional application No. 60/573,196, filed on May 21, 2004.

(51) Int. Cl.
*G01B 11/02* (2006.01)
(52) U.S. Cl. .................... 356/512; 356/237.2
(58) Field of Classification Search ............ 356/511, 356/512, 237.2
See application file for complete search history.

(56) References Cited

U.S. PATENT DOCUMENTS

| | | |
|---|---|---|
| 3,628,027 A | 12/1971 | Brauss |
| 3,748,015 A | 7/1973 | Offner |
| 4,011,011 A | 3/1977 | Hemstreet et al. |
| 4,226,501 A | 10/1980 | Shafer |
| 4,272,684 A | 6/1981 | Seachman |
| 4,672,196 A | 6/1987 | Canino |
| 4,685,803 A | 8/1987 | Sommargren |
| 4,733,967 A | 3/1988 | Sommargren |
| 5,220,403 A | 6/1993 | Batchelder |
| 5,241,423 A | 8/1993 | Chiu et al. |
| 5,327,223 A | 7/1994 | Korth |
| 5,485,317 A | 1/1996 | Perissinotto |
| 5,602,643 A | 2/1997 | Barrett |
| 5,614,763 A | 3/1997 | Womack |
| 5,633,972 A | 5/1997 | Walt |
| 5,659,420 A | 8/1997 | Wakai |
| 5,699,201 A | 12/1997 | Lee |
| 5,757,493 A | 5/1998 | Vankerkhove |
| 5,760,901 A | 6/1998 | Hill |
| 5,828,455 A | 10/1998 | Smith |
| 5,894,195 A | 4/1999 | McDermott |
| 5,915,048 A | 6/1999 | Hill et al. |
| 5,923,423 A | 7/1999 | Sawatari et al. |
| 6,011,654 A | 1/2000 | Schweizer et al. |

(Continued)

OTHER PUBLICATIONS

U.S. Appl. No. 09/852,369, filed Jan. 3, 2002, Hill.

(Continued)

*Primary Examiner*—Roy M. Punnoose
(74) *Attorney, Agent, or Firm*—Wilmer Cutler Pickering Hale & Dorr LLP

(57) ABSTRACT

Methods and apparatus based on optical homodyne displacement interferometry, optical coherent-domain reflectometry (OCDR), and optical interferometric imaging are disclosed for overlay, alignment mark, and critical dimension (CD) metrologies that are applicable to microlithography applications and integrated circuit (IC) and mask fabrication and to the detection and location of defects in/on unpatterned and patterned wafers and masks. The metrologies may also be used in advanced process control (APC), in determination of wafer induced shifts (WIS), and in the determination of optical proximity corrections (OPC).

25 Claims, 25 Drawing Sheets

U.S. PATENT DOCUMENTS

| | | |
|---|---|---|
| 6,018,391 A | 1/2000 | Yosida |
| 6,052,231 A | 4/2000 | Rosenbluth |
| 6,091,496 A | 7/2000 | Hill |
| 6,124,931 A | 9/2000 | Hill |
| 6,271,923 B1 | 8/2001 | Hill |
| 6,330,065 B1 | 12/2001 | Hill |
| 6,445,453 B1 | 9/2002 | Hill |
| 6,447,122 B1 | 9/2002 | Kobayashi et al. |
| 6,469,788 B2 | 10/2002 | Boyd et al. |
| 6,480,285 B1 | 11/2002 | Hill |
| 6,552,805 B2 | 4/2003 | Hill |
| 6,552,852 B2 | 4/2003 | Hill |
| 6,597,721 B1 | 7/2003 | Hutchinson et al. |
| 6,606,159 B1 | 8/2003 | Hill |
| 6,667,809 B2 | 12/2003 | Hill |
| 6,714,349 B2 | 3/2004 | Nam |
| 6,717,736 B1 | 4/2004 | Hill |
| 6,753,968 B2 | 6/2004 | Hill |
| 6,771,374 B1 | 8/2004 | Rangarajan et al. |
| 6,775,009 B2 | 8/2004 | Hill |
| 6,806,959 B2 | 10/2004 | Tukker |
| 6,847,029 B2 | 1/2005 | Hill |
| 6,847,452 B2 | 1/2005 | Hill |
| 2002/0074493 A1 | 6/2002 | Hill |
| 2002/0131179 A1 | 9/2002 | Hill |
| 2003/0174992 A1 | 9/2003 | Levene |
| 2004/0201852 A1 | 10/2004 | Hill |
| 2004/0201853 A1 | 10/2004 | Hill |
| 2004/0201854 A1 | 10/2004 | Hill |
| 2004/0201855 A1 | 10/2004 | Hill |
| 2004/0202426 A1 | 10/2004 | Hill |
| 2004/0227950 A1 | 11/2004 | Hill |
| 2004/0227951 A1 | 11/2004 | Hill |
| 2004/0228008 A1 | 11/2004 | Hill |
| 2004/0246486 A1 | 12/2004 | Hill |
| 2004/0257577 A1 | 12/2004 | Hill |
| 2005/0036149 A1 | 2/2005 | Hill |
| 2005/0111006 A1 | 5/2005 | Hill |
| 2005/0111007 A1 | 5/2005 | Hill |
| 2005/0254063 A1* | 11/2005 | Hill ............................ 356/512 |

OTHER PUBLICATIONS

U.S. Appl. No. 09/917,402, filed Jul. 27, 2001, Hill.
U.S. Appl. No. 10/765,254, filed Jan. 27, 2004, Hill.
U.S. Appl. No. 10/765,368, filed Jan. 27, 2004, Hill.
U.S. Appl. No. 60/442,858, filed Jul. 27, 2002, Hill.
U.S. Appl. No. 60/442,982, filed Jan. 29, 2003, Hill.
U.S. Appl. No. 60/443,980, filed Jan. 31, 2003, Hill.
U.S. Appl. No. 60/444,707, filed Jan. 4, 2003, Hill.
U.S. Appl. No. 60/445,739, filed Feb. 7, 2003, Hill.
U.S. Appl. No. 60/447,254, filed Feb. 13, 2003, Hill.
U.S. Appl. No. 60/448,250, filed Jan. 19, 2003, Hill.
U.S. Appl. No. 60/448,360, filed Feb. 19, 2003, Hill.
U.S. Appl. No. 60/459,425, filed Apr. 11, 2003, Hill.
U.S. Appl. No. 60/459,493, filed Apr. 1, 2003, Hill.
U.S. Appl. No. 60/460,129, filed Apr. 3, 2003, Hill.
U.S. Appl. No. 60/485,255, filed Jul. 7, 2003, Hill.
U.S. Appl. No. 60/485,507, filed Jul. 7, 2003, Hill.
U.S. Appl. No. 60/501,666, filed Sep. 10, 2003, Hill.
U.S. Appl. No. 60/506,715, filed Sep. 26, 2003, Hill.
U.S. Appl. No. 60/507,675, filed Oct. 1, 2003, Hill.
U.S. Appl. No. 60/568,774, filed May 6, 2004, Hill.
U.S. Appl. No. 60/569,807, filed May 11, 2004, Hill.
U.S. Appl. No. 60/571,967, filed May 18, 2004, Hill.
U.S. Appl. No. 60/573,196, filed May 21, 2004, Hill.

* cited by examiner

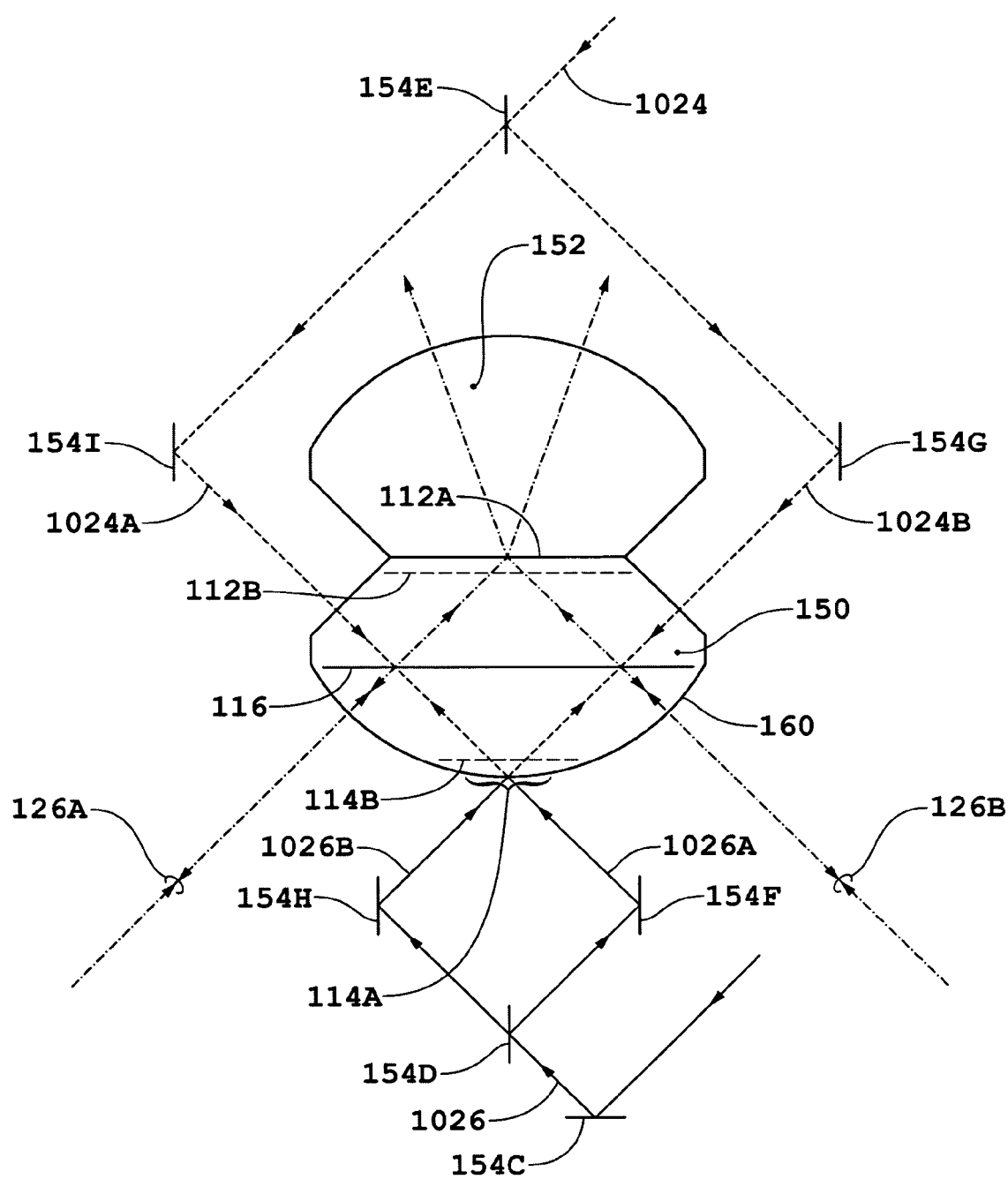
Fig. 1*l*

APPARATUS AND METHODS FOR OVERLAY, ALIGNMENT MARK, AND CRITICAL DIMENSION METROLOGIES BASED ON OPTICAL INTERFEROMETRY

This application claims the benefit of U.S. Provisional Application No. 60/573,196, filed May 21, 2004, incorporated herein by reference.

RELATED APPLICATIONS

The following patents and patent applications are related to the present application: U.S. Pat. No. 6,445,453, entitled "Canning Interferometric Near-Field Confocal Microscopy" (ZI-14); and U.S. patent application Ser. No. 10/778,371, filed Feb. 13, 2004, entitled "Transverse Differential Interferometric Confocal Microscopy," (ZI-40); Ser. No. 10/782,057, filed Feb. 19, 2004, entitled "Longitudinal Differential Interferometric Confocal Microscopy for Surface Profiling," (ZI-41); Ser. No. 10/782,058, filed Feb. 19, 2004, entitled "Method and Apparatus for Dark Field Interferometric Confocal Microscopy," (ZI-42); Ser. No. 10/771,785, filed Feb. 4, 2004, entitled "Compensation For Effects Of Mismatch In Indicies Of Refraction At A Substrate-Medium Interface In Non-Confocal, Confocal, And Interferometric Confocal Microscopy" (ZI-44); Ser. No. 10/816,180, filed Apr. 1, 2004, entitled "Apparatus and Method for Joint Measurement Of Fields Of Scattered/Reflected or Transmitted Orthogonally Polarized Beams By An Object In Interferometry," (ZI-50); Ser. No. 10/816,172, filed Apr. 1, 2004, entitled "Apparatus and Method for Measurement Of Backscattered and Forward Scattered/Reflected By An Object In Interferometry," (ZI-51); Ser. No. 10/886,010, filed Jul. 7, 2004, entitled "Apparatus And Method For High Speed Scan For Sub-Wavelength Defects And Artifacts In Semiconductor Metrology," (ZI-52); Ser. No. 10/886,157, filed Jul. 7, 2004, entitled "Apparatus And Method For Ellipsometric Measurements With High Spatial Resolution" (ZI-53); Ser. No. 10/954,625, filed Sep. 30, 2004, entitled "Method And Apparatus For Enhanced Resolution Of High Spatial Frequency Components Of Images Using Standing Wave Beams In Non-Interferometric And Interferometric Microscopy" (ZI-55); Ser. No. 60/568,774, filed May 6, 2004, entitled "Apparatus And Methods For Measurement Of Critical Dimensions Of Features And Detection Of Defects In UV, VUV, And EUV Lithography Masks," (ZI-60); Ser. No. 60/569,807, filed May 11, 2004, entitled "Apparatus And Methods For Measurement Of Critical Dimensions Of Features And Detection Of Defects In UV, VUV, And EUV Lithography Masks," (ZI-61); and Ser. No. 60/571,967, filed May 18, 2003, entitled "Apparatus And Methods For Measurement Of Critical Dimensions Of Features And Detection Of Defects In UV, VUV, And EUV Lithography Masks," (ZI-63).

TECHNICAL FIELD

This invention is generally in the field of manufacturing of multi-layer structures, such as semiconductor wafers, ICs, and non-EUV and EUV masks and relates to measuring pattern overlay alignment accuracy, measuring location of alignment marks, detecting defects on wafers and masks, and measuring CDs of pattern features through the use of displacement interferometric metrology systems and interferometric imaging metrology systems operating in the IR to VUV and EUV and the use of measured properties of electromagnetic fields in the IR to VUV and EUV that are reflected/scattered by measurement objects comprising unpatterned and patterned wafers and masks augmented with results of inversion analyses based on rigorous treatment of electromagnetic fields reflected/scattered by the measurement objects.

BACKGROUND OF THE INVENTION

Aerial imaging overlay technology has been a reassuringly familiar feature of semiconductor manufacturing for years, experiencing little change. The wafers are loaded, special box-in-box (BiB) structures or targets are examined using a white-light microscope, and the images are then processed to determine overlay error. Although this has worked well, there are several issues as the industry moves toward implementing deep nanometer process levels with for example image overlay tools, location of alignment marks used in a stage metrology system of lithography tool or inspection tool, and measurement of properties such as CDs.

With respect to overlay metrology, one of these issues has to do with the traditionally used BiB structures which tend to have large geometries and typically consist of bars microns in size that do not correspond to circuit feature sizes. Additionally, the BiB structures tend to have large areas of low feature density which polish at different rates than circuit areas with high feature density. As increasingly smaller features are being produced, it has become apparent that the behavior of these traditional BiB targets does not accurately reflect that of the circuit features themselves.

This imaging overlay uncertainty has been tolerable because process windows have not had to be too tight and the available precision and accuracy have been adequate. Now, smaller geometries are resulting in accuracy issues that must be addressed in imaging overlay tools, in particular the tool-induced shift (TIS). For imaging overlay tools, TIS can be on the order of several nanometers. At the 65 nm node, 2 or 3 nm of TIS is a significant measurement uncertainty.

Imaging overlay makes it difficult to reduce TIS because it is critically dependent upon residual aberrations in the imaging overlay optics with the most critical one being the microscope objective. Strehl ratios as high as 0.9 often do not provide the TIS performance required for advanced design rules. Thus, the technology faces not only optical problems but the fact that traditional overlay marks do not represent the actual behavior of circuit features that are orders of magnitude smaller.

Overlay metrology is the art of checking the quality of alignment after lithography. Overlay error is defined as the offset between two patterned layers from their ideal relative position. An overlay error is a vector quantity with two components in the plane of the wafer. Depending on the context, overlay error may signify one of the components or the magnitude of the vector.

Overlay metrology saves subsequent process steps that would be built on a faulty foundation in case of an alignment error. Overlay metrology provides the information that is necessary to correct the alignment of the stepper-scanner and thereby minimize overlay error on subsequent wafers. Moreover, overlay errors detected on a given wafer after exposing and developing the photoresist can be corrected by removing the photoresist and repeating the lithography step on a corrected stepper-scanner. If the measured error is minor, parameters for subsequent steps of the lithography process could be adjusted based on the output of the overlay metrology to avoid excursions. If overlay error is measured subsequently, e.g. after the etch step that typically follows the develop step, it can be used to "scrap" severely misprocessed wafers, or to adjust process equipment for better performance on subsequent wafers, i.e. APC.

As the CD in IC device reduces, the total overlay budget needs to be more stringent. Typically, the allowable overlay error is ⅓ of the CD in the IC device. In this case, robustness of alignment mark is critical as accurate signal is required by the scanner's alignment system to precisely align a pattern of a layer to the pattern of the previous layer. Alignment issue is more severe in a back-end process partly due to the influence of CMP, which contributes to the asymmetric or total destruction of the alignment marks. The corresponding error in overlay accuracy has been called wafer induced shift (WIS).

Alignment marks and patterns used in overlay metrology can be placed on/in the scribe-line between die sites on a wafer in order not to waste the usable area on the wafer. Dimensions of a standard scribe-line are 80 microns. Preferably, the alignment marks and the patterns should be as small as possible so as to create the option of reducing the size of scribe-lines and subsequently lead to an increase in the usable area on the wafer.

However, reduced physical size of alignment marks and of overlay patterns used in overlay metrology reduces the magnitude of the diffracted signals detected in determination of alignment marks and overlay errors, respectively. Thus it is desirable to have an alignment mark metrology system and an overlay metrology system that meet the overlay accuracy requirements, have reduced TIS, can compensate for WIS, and reduces the area required for the alignment marks and the overlay patterns.

The problems that arise in an optical measurement of a CD can also include those introduced by TIS and WIS. Thus an overlay metrology system and an alignment mark metrology system that successfully address the affects of TIS and WIS for a given technology node can be adapted for use in an improved CD metrology system.

Defects of different types can affect the performance of overlay, alignment mark, and CD metrology systems. Accordingly, it is desirable for the respective metrology systems to be able to detect the presence of defects and take appropriate measures when the presence of a defect is detected.

Prior overlay metrology methods use built-in test patterns etched or otherwise formed into or on the various layers during the same set of lithography steps that form the patterns for circuit elements on the wafer. The typical BiB pattern consists of two concentric squares, formed on a lower and an upper layer, respectively. "Bar-in-bar" is a similar pattern with just the edges of the "boxes" demarcated, and broken into disjoint line segments. Typically one is the upper pattern and the other is the lower pattern, i.e. corresponding to earlier and later steps in the process. There are other patterns used for overlay metrology. The squares or bars are formed by lithographic and other processes used to make planar structures, e.g., CMP. Currently, the patterns for the boxes or bars are stored on lithography masks and projected onto the wafer. Other methods for putting the patterns on the wafer are possible, e.g. direct electron beam writing from computer memory, etc.

In one form of the prior art, a high performance microscope imaging system combined with image processing software estimates overlay error for the two layers. The image processing software uses the intensity of light at a multitude of pixels. Obtaining the overlay error accurately requires a high quality imaging system and means of focusing it. Some of this prior art is reviewed by the article "Semiconductor Pattern Overlay", by Neal T. Sullivan, *Handbook of Critical Dimension Metrology and Process Control*, Kevin M. Monahan, ed., *SPIE* Optical Engineering Press, CR52, pp 160. A. Starikov, D. J. Coleman, P. J. Larson, A. D. Lapata, and W. A. Muth in "Accuracy of Overlay Measurements: Tool and Mark Asymmetry Effects," *Optical Engineering*, 31, pp 1298 (1992), teach measuring overlay at one wafer orientation, rotating the wafer by 180°, measuring overlay again and attributing the difference to tool errors and overlay mark asymmetry.

One requirement for the optical system is very stable positioning of the optical system with respect to the sample. Relative vibration would blur the image and degrade the performance. This is a difficult requirement to meet for overlay metrology systems that are integrated into a process tool. The tool causes potentially large accelerations (vibrations), e.g. due to high acceleration wafer handlers. The tight space requirements for integration preclude bulky isolation strategies.

The imaging based overlay measurement precision can be two orders of magnitude smaller than the wavelength of the light used to image the target patterns of concentric boxes or bars. At such small length scales, the image does not have well determined edges because of diffraction. The determination of the edge, and therefore the overlay measurement, is affected by any factor that changes the diffraction pattern. CMP is a commonly used technique to planarize the wafer surface at intermediate process steps before depositing more material. CMP can render the profile of the trenches or lines that make up the overlay measurement targets asymmetric. The asymmetry in target changes the diffraction pattern, thus potentially causing an overlay measurement error.

In U.S. Pat. No. 4,757,207, Chappelow, et al. teach obtaining the quantitative value of the overlay offset from the reflectance of targets that consists of identical line gratings that are overlaid upon each other on a planar substrate. Chappelow et al. approximate the reflectance of the overlapping gratings as the average of the reflectances of four film stacks weighted by their area-fractions. This approximation, which neglects diffraction, has some validity when the lines and spaces are larger than largest wavelength of the reflectometer. The reflectance of each of the four film stacks is measured at a so called macro-site close to the overlay target. Each macro-site has a uniform film stack over a region that is larger than the measurement spot of the reflectometer. A limitation of U.S. Pat. No. 4,757,207 is that spatial variations in the film thickness that are caused by CMP and resist loss during lithography will cause erroneous overlay measurements.

Another limitation of U.S. Pat. No. 4,757,207 is that reflectance is measured at eight sites in one overlay metrology target, which increases the size of the target and decreases the throughput of the measurement. Another limitation of U.S. Pat. No. 4,757,207 is that the lines and spaces need to be large compared to the wavelength, but small compared to the measurement spot which limits the accuracy and precision of the measurement.

Another limitation of U.S. Pat. No. 4,757,207 is that the light intensity is measured by a single photodiode. The dependence of the optical properties of the sample is not measured as a function of wavelength, or angle of incidence, or polarization, which limits the precision of the measurement.

The "average reflectivity" approximation for the interaction of light with gratings, as employed by U.S. Pat. No. 4,757,207, greatly simplifies the problem of light interaction with a grating but neglects much of the diffraction physics.

The model used to interpret the data has four distinct regions whose respective reflectivities are determined by the combination of layers formed by the substrate and the overlaid patterns and by the respective materials in the substrate and patterns. Eq. (1) in the U.S. Pat. No. 4,757,207 clearly indicates that these regions do not interact, i.e. via diffraction, as the total reflectivity of the structure is a simple average of the four reflectivities with area weighting.

IBM Technical Disclosure Bulletin 90A 60854/GE8880210, March 1990, pp 170, teaches measuring offset between two patterned layers by overlapping gratings. There are four sets of overlapping gratings to measure the x-offset and another four sets of overlapping gratings to measure the y-offset. The four sets of gratings, which are measured by a spectroscopic reflectometer, have offset biases of 0, ¼, ½, ¾-pitch. GE880210 does not use a model that accounts for the diffraction of light by the gratings or the multiple scattering of the light by the two gratings, and it has no provision to handle non-rectangular line profiles.

In U.S. Pat. No. 6,150,231, Muller et al. teach measuring overlay by Moire patterns. The Moire pattern is formed by overlapping gratings patterns, one grating on the lower level, another on the upper level. The two grating patterns have different pitches. The Moire pattern approach requires imaging the overlapping gratings and estimating their offset from the spatial characteristics of the image.

In U.S. Pat. Nos. 6,023,338 and 6,079,256, Bareket teaches an alternative approach in which two complementary periodic grating structures are produced on the two subsequent layers that require alignment. The two periodic structures are arranged adjacent to and in fixed positions relative to one another, such that there is no overlap of the two structures. The two gratings are scanned, either optically or with a stylus, so as to detect the individual undulations of the gratings as a function of position. The overlay error is obtained from the spatial phase shift between the undulations of the two gratings.

Smith et al. in U.S. Pat. No. 4,200,395 and Ono in U.S. Pat. No. 4,332,473 teach aligning a wafer and a mask by using overlapping diffraction gratings and measuring higher order, i.e. non-specular, diffracted light. One diffraction grating is on the wafer and another one is on the mask. The overlapping gratings are illuminated by a normally incident light and the intensities of the positive and negative diffracted orders, e. g. 1st and −1st orders, are compared. The difference between the intensities of the 1st and −1st diffracted orders provides a feedback signal which can be used to align the wafer and the mask. These inventions are similar to the International (PCT) Application Publication No. WO 02/065545 A2 in that they use overlapping gratings on two layers. However, the U.S. Pat. No. 4,200,395 and U.S. Pat. No. 4,332,473 patents are applicable to mask alignment but not to overlay metrology. They do not teach how to obtain the quantitative value of the offset from the light intensity measurements. U.S. Pat. Nos. 4,200,395 and 4,332,473 are not applicable to a measurement system that only uses specular, i.e. zeroth-order diffracted light.

WO 02/065545 A2 teaches measuring overlay by scatterometry. Measurements of structural parameters of a diffracting structure from optical characterization are now well known in the art as scatterometry. With such methods, a measurement sample is illuminated with optical radiation, and the sample properties are determined by measuring characteristics of the scattered radiation (e.g. intensity, polarization state, or angular distribution). A diffracting structure consists of one or more layers that may have lateral structure within the illuminated and detected area, resulting in diffraction of the reflected (or transmitted) radiation. If the lateral structure dimensions are smaller than the illuminating wavelengths, then diffracted orders other than the zeroth order may all be evanescent and not directly observable. But the structure geometry can nevertheless significantly affect the zeroth-order reflection, making it possible to make optical measurements of structural features much smaller than the illuminating wavelengths.

In one type of measurement process of WO 02/065545 A2, a microstructure is illuminated and the intensity of reflected or diffracted radiation is detected as a function of the radiation's wavelength, the incidence direction, the collection direction, or polarization state (or a combination of such factors). Direction is typically specified as a polar angle and azimuth, where the reference for the polar angle is the normal to the wafer and the reference for the azimuth is either some pattern(s) on the wafer or other marker, e.g. a notch or a flat for silicon wafers. The measured intensity data is then passed to a data processing machine that uses some model of the scattering from possible structures on the wafer. For example, the model may employ Maxwell's equations to calculate the theoretical optical characteristics as a function of measurement parameters (e.g. film thickness, line width, etc.), and the parameters are adjusted until the measured and theoretical intensities agree within specified convergence criteria. The initial parameter estimates may be provided in terms of an initial "seed" model of the measured structure. Alternatively, the optical model may exist as pre-computed theoretical characteristics as a function of one or more measurement parameters in tabular form, i.e. a "library", that associates collections of parameters with theoretical optical characteristics. The "extracted" structural model has the structural parameters associated with the optical model which best fits the measured characteristics, e.g. in a least-squares sense.

Conrad (U.S. Pat. No. 5,963,329) uses scatterometry to measure the line profile or topographical cross-sections. The direct application of Maxwell's equations to diffracting structures, in contrast to non-diffracting structures (e.g. unpatterned films), is much more complex and time-consuming, possibly resulting in either a considerable time delay between data acquisition and result reporting and/or the need to use a physical model of the profile which is very simple and possibly neglects significant features.

Scheiner et al. (U.S. Pat. No. 6,100,985) teaches a measurement method that is similar to that of Conrad, except that Scheiner's method uses a simplified, approximate optical model of the diffracting structure that does not involve direct numerical solution of Maxwell's equations. This avoids the complexity and calculation time of the direct numerical solution. However, the approximations inherent in the simplified model make it inadequate for grating structures that have period and line width dimensions comparable to or smaller than the illumination wavelengths.

In an alternative method taught by McNeil et al. (U.S. Pat. No. 5,867,276) the calculation time delay is substantially reduced by storing a multivariate statistical analysis model based on calibration data from a range of model structures. The calibration data may come from the application of Maxwell's equations to parameterized models of the structure. The statistical analysis is applied to the measured diffraction characteristics and returns estimates of the parameters for the actual structure.

The measurement method taught by McNeil et al. uses diffraction characteristics consisting of spectroscopic intensity data. A similar method can also be used with ellipsometric data, using ellipsometric parameters such as $\tan \psi$ and cos Δ, in lieu of intensity data. For example, X. Niu in "Specular Spectroscopic Scatterometry in DUV Lithography," Proc. *SPIE* 3677, pp. 159 (1999), uses a library approach. The library method can be used to simultaneously measure multiple model parameters (e.g. linewidth, edge slope, film thickness).

In International (PCT) Application Publication No. WO 99/45340, Xu et al. disclose a method for measuring the parameters of a diffracting structure on top of laterally homogeneous, non-diffracting films. The disclosed method first constructs a "reference database" based on a priori information about the refractive index and film thickness of underlying films, e.g. from spectroscopic ellipsometry or reflectometry. The reference database has "diffracted light fingerprints" or "signatures" (either diffraction intensities, or alternatively ellipsometric parameters) corresponding to various combinations of grating shape parameters. The grating shape parameters associated with the signature in the reference database that matches the measured signature of the structure are then reported as the grating shape parameters of the structure.

In International (PCT) Application Publication No. WO 02/065545 A2 by A. Sezginer, K. Johnson, and F. E. Stanke and entitled "Overlay Alignment Metrology Using Diffraction Gratings," alignment accuracy between two patterned layers is measured using a metrology target comprising substantially overlapping diffraction gratings formed in a test area of the layers being tested. An optical instrument illuminates all or part of the target area and measures the optical response. The instrument can measure transmission, reflectance, and/or polarization of the illumination and detected light. Overlay error or offset between those layers containing the test gratings is determined by a processor programmed to calculate an optical response for a set of parameters that include overlay error, using a model that accounts for diffraction by the gratings and interaction to the gratings with each others' diffracted field. The model parameters might also take account of manufactured asymmetries. The calculated and measured responses are iteratively compared and the model parameters changed to minimize the difference.

In International (PCT) Application Publication No. WO 02/069390 by X. Niu and N. Jakatdar and entitled "Grating Test Patterns And Methods For Overlay Metrology," a metrology is described for determining bias or overlay error in lithographic processes. The metrology includes a set of diffraction test patterns, optical inspection techniques using spectroscopic ellipsometer or reflectometer, and a method of test pattern profile extraction. The metrology uses a set of diffraction gratings as the test patterns and thin film metrology equipment, such as spectroscopic ellipsometer or spectroscopic reflectometer. The profiles of the test patterns in the two successive layers are analyzed. Overlay information are obtained after processing the profile data. In procedure, a line-on-line overlay grating test patterns structure is described in which a second layer mask is placed in the center of a clear line in a first layer mask. In a second procedure, a line-on-line overlay grating test patterns structure is described in which a second layer mask is placed in the center of a dark line in the first mask.

In International (PCT) Application Publication No. WO 02/24723 A2 by B. Brill, M. Finarov, and D. Scheiner and entitled "Lateral Shift Measurement Using An Optical Technique," a method is described for controlling alignment of layers in a multi-layer sample, such as in semiconductor wafers based on detecting a diffraction efficiency of radiation diffracted from the patterned structures located one above the other in two different layers of the sample.

OCDR is used to measure surface profiles of wafers such as described in the article "Optical Coherency-Domain Reflectometry: A New Optical Evaluation Technique" by R. C. Youngquist, S. Carr, and D. E. N. Davies, *Opt. Lett.*, 12. pp. 158 (1987). OCDR of prior art yields accurate information about the height profile of a surface but does not yield corresponding accurate information about the transverse location of features on a patterned wafer.

SUMMARY OF THE INVENTION

Methods and apparatus based on optical homodyne displacement interferometry, OCDR, and optical interferometric imaging are disclosed for overlay, alignment mark, and CD metrologies that are applicable to microlithography applications and IC and mask fabrication and to the detection of defects in unpatterned and patterned wafers and masks. The metrologies may also be used for example in advanced APC, in determination of WIS, and in the determination of OPC.

With optical homodyne displacement interferometry, conjugated quadratures of optical fields generated by reflection/scattering of measurement beams by patterns on wafers and masks are measured interferometrically for the four different metrologies. The relative phases of the measured conjugated quadratures are used, i.e. analyzed and/or inverted, to obtain information about the relative locations of features for overlay error determination, alignment mark position determination, and CD determination and for other properties of pattern features.

With OCDR which is based on white-light interferometry, the intensity of an electrical interference signal generated by the detection of coherently mixed reference and reflected/scattered measurement beams from patterns on wafers is measured as a function of optical path length of the measurement beam and/or the reference beam. The resulting intensity function is analyzed for information about the locations of an array of features comprising the patterns. In addition, other properties of the conjugated quadratures, e.g. values of differential conjugated quadratures, are measured as required as a function of scattering angle of respective reflected/scattered beams and inverted to obtain information about properties of features of the patterns relevant to overlay error, alignment mark position, and CD determination such as asymmetries in the features caused by CMP.

The measurement beams of certain embodiments may exhibit at the features of the patterns and at defects far-field properties using a low numerical aperture (NA) or high NA beam delivery system, evanescent-field properties using non-confocal imaging systems, and/or near-field properties using sub-wavelength apertures to generate the respective measurement beam. The measurement beam may comprise one or more components with different wavelengths in the IR, visible, UV, VUV, and EUV in one or more states of polarization.

The high precision of the overlay metrology system of at least some embodiments does not require the analysis of fields of beams generated by one or more reflections/scatterings by each of two stacked gratings such as in prior art. The associated analysis of the fields of beams generated by one or more reflections/scatterings by each of two stacked gratings is generally more complex and lengthy. In comparison, the analysis of the relative phase information may involve a simple determination of displacements corresponding to a particular phase shift value or a spectral analysis such as a fast Fourier transform (FFT) for high precision results. The inversions of the phase information, intensity profiles such as obtained in OCDR, and of the other properties of the conjugated quadratures are based on an iterative procedure using an application of scattering theory and an iteration of assumed feature properties.

Generally, speed of acquisition of phase information, speed of analysis of the phase information, and accuracy of information subsequently obtained with at least some embodiments exceeds in each of the three categories the corresponding performance based on the other properties of the conjugated quadratures that requires an inversion. Generally, speed of acquisition of the other properties of the conjugated quadratures, speed of inversion of the other properties of the conjugated quadratures, and accuracy of information subsequently obtained exceeds in each of the three categories the corresponding performance of prior art based on measurement and inversion of intensity properties of the corresponding reflected/scattered beams. Also, the speed of acquisition of the intensity profiles and the analysis of the intensity profiles generally exceeds in each of the two respective categories the corresponding performance of prior art based on measurement and inversion of intensity properties of the corresponding reflected/scattered beams.

At least some embodiments are is further distinct from prior art in that the techniques of linear displacement interferometry are used to obtain information about relative locations in three dimensions and properties of portions of patterns on a wafer or mask for the four different overlay, alignment mark, CD, and defect detection metrologies. In addition, at least some embodiments distinguish themselves from prior art by measuring other properties of the amplitudes and phases, i.e. differential properties of conjugated quadratures, of fields reflected/scattered by the portions of the patterns and inverting the measured other properties to obtain information about properties of portions of the patterns such as asymmetries caused by CMP. The prior art measures only intensities and/or ellipsometric properties of fields reflected and/or scattered by patterns and obtains information about overlay error of two patterns from properties of the measured intensities and/or ellipsometric properties.

At least some embodiments are distinct from prior art in that the high precision of the overlay metrology system does not require the analysis of fields of a beam generated by one or more reflections/scatterings by each of two stacked gratings such as in prior art. The associated analysis of the fields of beam generated by one or more reflections/scatterings by each of two stacked gratings for determination of overlay error is generally complex and lengthy. In comparison, the analysis of the relative phase information of at least some embodiments may comprise a simple determination of relative displacements corresponding to a relative phase shift or to a particular phase shift value such as $2\pi$ or a spectral analysis such as a FFT to obtain high precision results.

The conjugated quadratures and differential conjugated quadratures are measured using interferometric techniques. Differential conjugated quadratures may be measured as a function of scattering angle in one or two dimensions, as a function of wavelength, and as a function of the polarization state of the measurement beam. The information about the relative location of a pattern may be with reference to a second pattern on the same interface layer of a wafer, to a second pattern on a different interface layer of the wafer, to a relative reference frame established by a simultaneous measurement of an array of conjugated quadratures corresponding to an array of sites on the wafer, or to a reference frame of a lithography or inspection stage metrology system.

At least some embodiments are also distinct from prior art in that the different types of information about the conjugated quadratures may be obtained as joint measurements.

At least some embodiments are also distinct from prior art in that the high precision transverse position information about features may be obtained using OCDR.

Generally, TIS is either eliminated or greatly reduced because the effects of optical aberrations of imaging systems used in interferometric metrology systems generally cancel out in relative phase measurements.

At least some embodiments are also distinct from prior art in that a pattern being imaged may contain a single element or an array of elements wherein the number of elements is two or more. Accordingly, the size of the patterns used in the metrology systems can have areas of reduced sizes with linear dimensions of the order of $\lambda$ or larger.

At least some embodiments are also distinct from prior art in that the patterns under measurement are scanned for the presence of defects that could cause an error in an overlay measurement, in the measured location of an alignment mark, in a CD measurement, or in other measured properties.

The calibrations of the measurement scales used for the four different metrologies are traceable to independently calibrated standards.

At least some embodiments are also distinct from prior art in that the interferometric metrologies may use bi- or quad-homodyne detection techniques or variants thereof to obtain joint measurements of arrays of conjugated quadratures or differential conjugated quadratures of fields reflected/or scattered by defects and/or features of a wafer or a mask and the elements of arrays of the conjugated quadratures or differential conjugated quadratures are measured simultaneously leading to advantages of reduced sensitivity to vibrations and to a high throughput.

In addition, information about the properties of a feature or a defect with respect to the real and complex components n and k, respectively, of the refractive index may be obtained using different polarization states and/or wavelengths of measurement beams in the interferometric metrologies.

The procedures of at least some embodiments require general knowledge of the feature geometry of patterned wafers. However, the procedures generally do not require detailed knowledge of the properties of the fields reflected/scattered by the features of a reference or standard patterned wafer or mask, e.g. angular distributions of reflected/scattered measurement beams or phase shifts introduced by reflections/scattering of measurement beams, wherein the reference or standard wafer or mask is one that meets requirements with respect to overlay errors, alignment mark locations, values of CDs, and presence of defects.

The lateral resolution used in detection of CD errors for features characterized by dimensions larger than the optical resolution used in the CD metrology can be matched respectively to the typical size of defects so as to maximize the respective detection efficiency and can also be matched to dimensions of subsections of features that is optimum for use of CD errors in OPC analysis. The precision to which such CDs are measured can be sub-nanometer, the profile of a surface can be measured to an accuracy of the order of 0.1 nm, and the mean size of particle defects detected and the size of dimensions of the subsections of features measured may be for example of the order of 35 nm for a VUV measurement beam.

UV, VUV, and EUV measurement beams can be used effectively in at least some embodiments for the different metrologies for the technology nodes of hp65 nm, hp45 nm, hp32 nm, and 22 nm nodes as set out in the International Technology Roadmap for Semiconductors (ITRS), 2003 Edition.

In general, in one aspect the invention features an interferometry system for examining a surface of an object. The system includes: a source assembly that generates a first measurement beam and a second measurement beam; a detector assembly that includes a first detector element and a second detector element; an interferometer that includes a source imaging system that focuses the first measurement beam onto a first spot on a first plane that is in or on the object and focuses the second measurement beam onto a second spot on second plane below the first plane and an object imaging system that images the first spot onto the first detector element as a first interference beam to generate a first interference signal therefrom and images the second spot onto the second detector element as a second interference beam to generate a second interference signal therefrom, the object imaging system combining a first return measurement beam coming from the first spot with a first reference beam to produce the first interference beam and combining a second return measurement beam coming from the second spot with a second reference beam to produce the second interference beam, wherein the first measurement beam upon interaction with the object produces a first backscattered component and a first forward-scattered component and the second measurement beam upon interaction with the object produces a second backscattered component and a second forward-scattered component; and a processor programmed to determine oblique angle-of-incidence information about a feature of the object by using the first and second backscattered components but not either of the first and second forward scattered components.

Other embodiments have one or more of the following features. The source assembly has an optical axis and includes a pinhole array beam splitter that has a first portion and a second portion that is displaced from the first portion in a direction that is along the optical axis, wherein the first portion produces the first measurement beam and the second portion produces the second measurement beam. The first portion is located in a plane that is conjugate to the first plane and the second portion is locate in a plane that is conjugate to the second plane. The object imaging system has an optical axis and includes a pinhole array beam combiner that has a first portion and a second portion that is displaced from the first portion in a direction that is along the optical axis, wherein the first portion combines the first return measurement beam with the first reference beam and the second portion combines the second return measurement beam with the second reference beam. The first portion is located in a plane that is conjugate to the first plane and the second portion is locate in a plane that is conjugate to the second plane. The object imaging system is configured to collect the first and second backscattered components but not the first and second forward scattered components to generate the first and second return measurement beams. The source imaging system generates the first measurement beam such that it has an angle of incidence relative to the surface of the object that range between $\theta_1$ and $\theta_2$, wherein $\theta_1$ and $\theta_2$ are angles that are less than 90° and wherein $\theta_1<\theta_2$. The interferometer is a linear displacement interferometer or a scanning, linear displacement interferometer. The interferometry system also includes a catadioptric imaging system that implements at least part of both the source imaging system and the object imaging system. The feature is overlay alignment on the object.

In general, in another aspect, the invention features another interferometry system for examining a surface of an object. The system includes: a source assembly that generates a first measurement beam and a second measurement beam; a detector assembly that includes a first detector element and a second detector element; and an interferometer that includes a source imaging system that focuses the first measurement beam onto a first spot on a first plane on or in the object and focuses the second measurement beam onto a second spot on a second plane that is below the first plane and an object imaging system that images the first spot onto the first detector element as a first interference beam to generate a first interference signal therefrom and images the second spot onto the second detector element as a second interference beam to generate a second interference signal therefrom, said object imaging system combining a first return measurement beam coming from the first spot with a first reference beam to produce the first interference beam and combining a second return measurement beam coming from the second spot with a second reference beam to produce the second interference beam, wherein the source imaging system causes the first and second measurement beams that arrive at the surface of the object to have average angles of incidence that are oblique to the surface of object, wherein each of the first and second measurement beams upon interaction with the object produces corresponding first and second backscattered and forward-scattered components, and wherein the object imaging system is configured to collect the first and second backscattered components but not either of the first and second forward scattered components to generate the first and second return measurement beams, respectively.

Other embodiments include one or more o the following features. The object imaging system is configured to collect the first and second backscattered components but not the first and second forward scattered components to generate the first and second return measurement beams. The source imaging system generates the first measurement beam such that it has an angle of incidence relative to the surface of the object that range between $\theta_1$ and $\theta_2$, wherein $\theta_1$ and $\theta_2$ are angles that are less than 90° and wherein $\theta_1<\theta_2$. The interferometer is a linear displacement interferometer or a scanning, linear displacement interferometer. The interferometry system also includes a catadioptric imaging system that implements at least part of both the source imaging system and the object imaging system.

In general, in still another aspect the invention features still another interferometry system for examining a surface of an object. The system includes: a source assembly that generates a first array of measurement beams and a second array of measurement beams; a detector assembly that includes a first array of detector elements and a second array of detector elements; an interferometer that includes a source imaging system that focuses the first array of measurement beams onto a first array of spots on a first plane on or in the object and focuses the second array of measurement beams onto a second array of spots on a second plane that is below the first plane and an object imaging system that images the first array of spots onto the first array of detector elements as a first array of interference beams and images the second array of spots onto the second array of detector elements as a second array of interference beams, said object imaging system combining a first array of return measurement beams coming from the first array of spots with a first array of reference beams to produce the first array of interference beams and combining a second array of return measurement beams coming from the second array of spots with a second array of reference beams to produce the second array of interference beams, wherein the first and second arrays of measurement beams upon interaction with the surface of the object produce corresponding first and second arrays of backscattered components and corresponding first and second arrays of forward-scattered components; and a processor programmed to determine oblique angle-of-incidence information about a feature on the object by using the first and second arrays of backscattered components but not the first and second arrays of forward scattered components.

Other embodiments include one or more of the following features. The source assembly has an optical axis and includes a pinhole array beam splitter that has a first portion and a second portion that is displaced from the first portion in a direction that is along the optical axis, wherein the first portion produces the first array of measurement beams and the second portion produces the second array of measurement beams. The first portion is located in a plane that is conjugate to the first plane and the second portion is locate in a plane that is conjugate to the second plane. The object imaging system assembly has an optical axis and includes a pinhole array beam combiner that has a first portion and a second portion that is displaced from the first portion in a direction that is along the optical axis, wherein the first level combines the first array of return measurement beams with the first array of reference beams and the second portion combines the second array of return measurement beams with the second array of reference beams. The first portion is located in a plane that is conjugate to the first plane and the second portion is locate in a plane that is conjugate to the second plane. The feature is overlay alignment on the object.

In general, in still yet another aspect, the invention features a method of interferometrically examining a surface of an object. The method involves: generating a measurement beam; focusing the measurement beam onto a first spot on a first plane on or in the object wherein upon interaction with the surface of the object at the first spot the measurement beam produces a backscattered component and a forward-scattered component; combining a return measurement beam from the first spot with a reference beam to generate an interference beam; generating an interference signal from the interference beam for the first spot; focusing the measurement beam onto a second spot on a second plane on or in the object that is below the first plane wherein upon interaction with the surface of the object at the second spot the measurement beam produces a backscattered component and a forward-scattered component; combining a return measurement beam from the second spot with a reference beam to generate an interference beam; generating an interference signal from the interference beam for the second spot; by using at least the interference signals for the first and second spots, determining oblique angle-of-incidence information about a feature of the object, wherein determining involves using the backscattered components but none of the forward scattered components from the first and second spots.

Other embodiments include one or more of the following features. The method also involves, for the first spot, collecting the backscattered component from the surface of the object but not the forward scattered component to generate the return measurement beam for the first spot and, for the second spot, collecting the backscattered component from the surface of the object but not the forward scattered component to generate the return measurement beam for the second spot.

Various embodiments of the invention have one or more of the following advantages:

an increase in information about properties of features of patterned wafers and masks through the measurement of the conjugated quadratures and differential conjugated quadratures of fields reflected/scattered by the features;

an increased signal-to-noise ratio for measured quantities through the use of interferometric techniques to measure the conjugated quadratures and the differential conjugated quadratures;

reduced systematic errors in measured overlay errors, alignment mark locations, CDs, and other properties;

reduced statistical errors in measured overlay errors, alignment mark locations, CDs, and other properties;

joint measurement of the conjugated quadratures and the differential conjugated quadratures;

joint measurement of arrays of conjugated quadratures and differential conjugated quadratures that are each measured jointly;

a reduced sensitivity of the measurement of overlay errors, alignment mark locations, CDs, defects, and other properties to vibrations;

high throughput in measurement of overlay errors, alignment mark locations, CDs, and other properties and defect detection;

high precision is obtained in the overlay metrology using gratings that are spatially resolved by the interferometric imaging system;

joint measurement of angular dependence on reflecting/scattering angle of differential conjugated quadratures;

joint measurement of the dependence of the conjugated quadratures on the polarization states of measurement beams;

the use of normal or non-oblique angle of incidence and non-normal or oblique angle of incidence measurement beams;

IR., visible, UV, VUV, and EUV measurement beams are used;

the option to use a small site size of patterns in measurement of alignment mark locations, overlay errors, CD errors, and of other properties, i.e. the site size may have linear dimensions of the order of $\lambda$ or larger;

alignment mark errors, overlay errors, CD errors, and errors in other properties can be used in APC;

measured CD errors can be used in OPC analysis;

overlay errors can be measured during an exposure cycle of an in process wafer with a minimal impact on throughput of a lithography tool;

alignment mark locations can be used to monitor the stability of a wafer during an exposure cycle of an in process wafer;

the alignment mark metrology system can be used as an off-axis alignment mark detector in registering a wafer relative to a stage metrology system:

the alignment mark metrology system can be used in registering a wafer/wafer chuck system at the exposure position of a dual stage lithography tool relative to the stage of the lithography tool or to a stage metrology system;

CDs of features of a patterned wafer can be measured;

sub-wavelength defects in or on a patterned or non-patterned wafer or mask can be detected;

the metrology systems can operate in both reflection and transmission modes;

the precision of overlay errors, of alignment mark location measurements, and of CD measurements can be sub-nanometer;

the overlay, alignment mark, CD metrology systems, and defect metrology systems are of the non-contact type;

the measurements for overlay errors, locations of alignment marks, CDs, and other properties can be made with a large working distance; and the techniques of OCDR can be used in alignment, overlay, and CD metrologies.

BRIEF DESCRIPTION OF THE DRAWINGS

FIG. 1l is a diagram of a system for introducing measurement and reference beams into an interferometric metrology system.

DETAILED DESCRIPTION

Figure 1A:
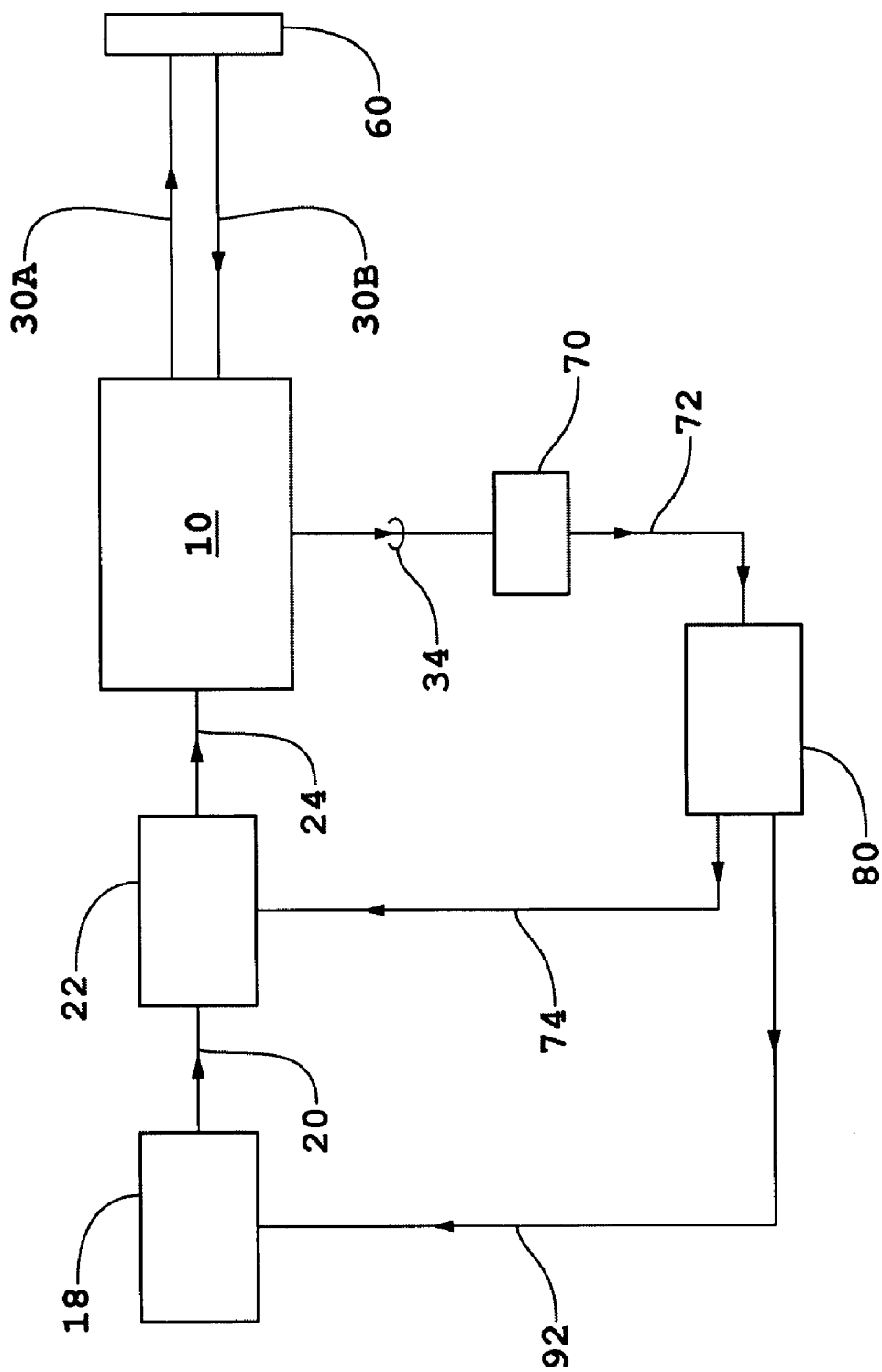
FIG. 1a is a diagram of an interferometric system.

In one group of embodiments of the present invention, selected portions of a wafer or mask are scanned by a displacement interferometric metrology system for a measurement of an error in an overlay, the location of an alignment mark, an error in a CD, or an error in another property. The presence of defects may introduce errors in the measurements made by the displacement interferometric metrology system wherein the defects may be for example in the form of either an error in the profile of an associated surface and/or an error in the form of a particle. After the measurements used in determining the errors in an overlay, the location of an alignment mark, the error in a CD, or an error in another property are obtained, an interferometric microscopy system, e.g. differential interferometric microscopy system, may be used in an end use application to determine if there are defects present whose affects must be accounted for. The sensitivities of the results of the scan by the displacement interferometric metrology system and the subsequent measurements to determine the forms of errors are different with respect to each other. As a consequence, the results of the scan by the displacement interferometric metrology system and the subsequent measurements can be inverted if required and the nature with respect to form of each error determined. The differential interferometric microscopy systems may comprise either an interferometric confocal or interferometric non-confocal microscopy system.

In a second group of embodiments of the present invention, there are two complete independent scans of selected portions of a wafer or mask. The first scan of the selected portions of the wafer or mask is made using for example a differential interferometric microscopy system for the detection of defects in the forms for example of either an error in the profile of an associated surface and/or an error in the form of a particle. The first scan is followed by the second scan of the portions of the wafer or mask by a displacement interferometric metrology system for measurements relevant to an error in an overlay, to location of an alignment mark, to an error in a CD, or to an error in another property. The results of the two scans are processed in the same manner as that of the first group of embodiments.

The embodiments of the second group of embodiments generally require a longer time for completion of an inspection of selected portions of a wafer or mask with a concomitant reduction in throughput. However, the second group of embodiments may offer the better overall throughput when the inspection for errors in overlay, for locations of alignment marks, for errors in CDs, and for errors in the another property and inspection for defects are used in APC.

Embodiments of the interferometric systems will first be described for embodiments comprising an interferometric confocal microscopy system with embodiments of interferometric non-confocal microscopy systems subsequently described.

In the four interferometric metrology system embodiments and the OCDR system embodiment, an imaging system may be used in the generation of measurement beams, in the imaging of a wafer, a mask or a substrate, and/or in the generation of reference beams. The imaging systems may be used in either a confocal configuration or a non-confocal configuration.

A general description is first given for the point spread function of an imaging system that may be used in the four interferometric metrology system embodiments and the OCDR system embodiment to image spots or sites comprising features of a measurement object or comprising sub-wavelength apertures used when generating near-field probe beams and detecting near-field return measurement beams.

Point Spread Function

Figure 5:
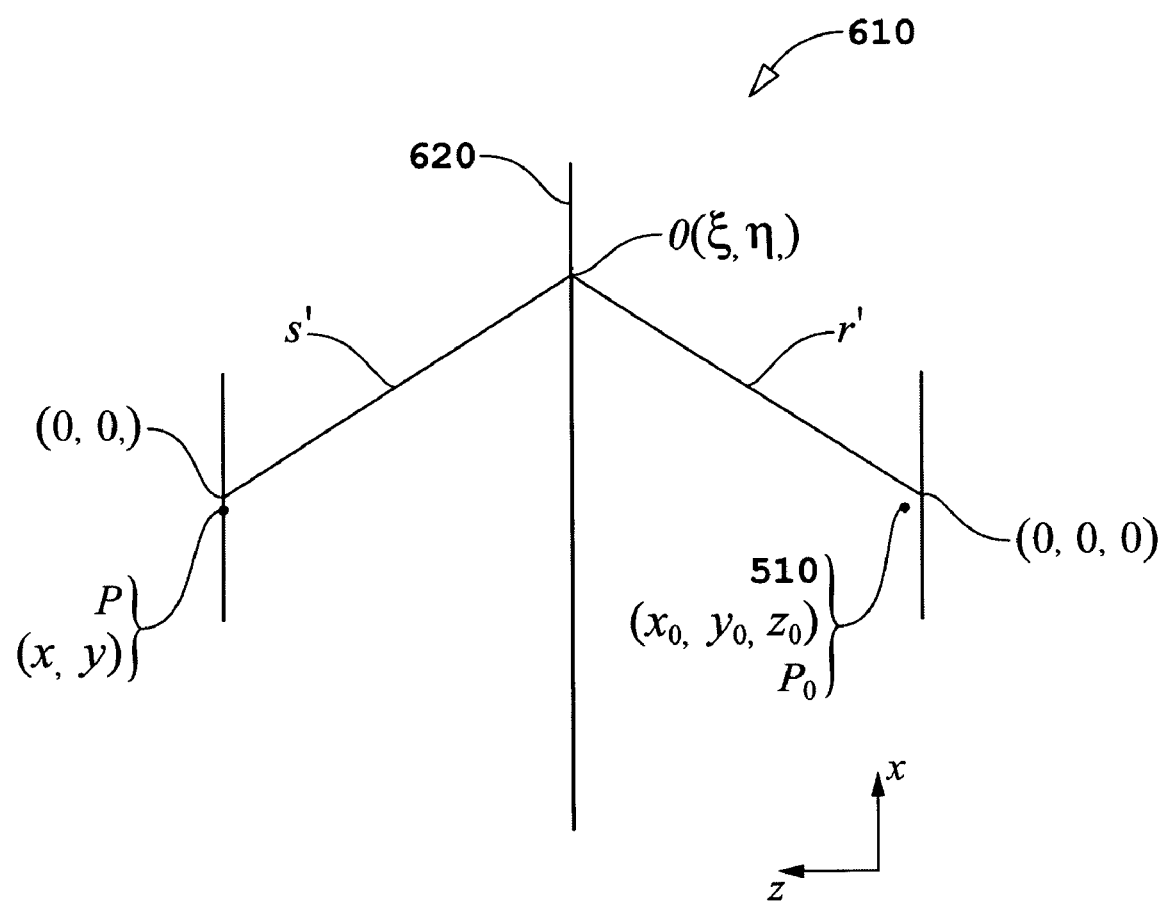
FIG. 5 is a schematic diagram of an imaging system comprising a single lens element.

The point spread function is generally designed so that the interferometric metrology system embodiments yield relative phases of measured conjugated quadratures that are robust with respect to small displacements of a detector element in the image plane of the imaging system. The image comprises fields of measurement beams reflected/scattered by features at an array of the spots on a measurement object. Each of the spots comprises an array of one or more sub-wavelength elements. In FIG. 5, the imaging system of a linear displacement interferometric metrology system is represented by an imaging system indicated by element number 610 comprising a single lens element 620. Also shown diagrammatically in FIG. 5 is the location of a single element comprising for example a Porro type prism element or measurement object 510. The complex amplitude $U(P)$ in the image plane at point P with coordinates (x, y) for a source in the object space at point $P_0$ with coordinates ($x_0$, $y_0$, $z_0$) is given by the equation $$U(P) = Ce^{ik(r'+s')} \int_\eta \int_\xi e^{-ik(p\xi+q\eta)+ik(\xi^2+\eta^2)\frac{z_0}{r'^2}} d\xi d\eta \quad (1)$$

where C is a constant, $\xi$ and $\eta$ are the x and y coordinates of point O in the pupil, $z_0$ is the location of point $P_0$ in the z direction from the plane from which r' is measured, $k=2\pi/\lambda$ is the free space wavenumber for free space wavelength $\lambda$, r' and s' are defined in FIG. 5, and $$p = \frac{x}{s'} + \frac{x_0}{r'},$$
$$q = \frac{y}{s'} + \frac{y_0}{r'}, \quad (2)$$

(see Born and Wolff, *Principles Of Optics*, Pergamon Press). The quantities p and q are also written as $$p = l - l_0,$$
$$q = m - m_0, \quad (3)$$

where $$l_0 = -\frac{x_0}{r'}, \quad l = \frac{x}{s'}, \quad (4)$$
$$m_0 = -\frac{y_0}{r'}, \quad m = \frac{y}{s'}.$$

The features of a spot comprising a single feature element or an array of elements forming a grating used in overlay, alignment mark, and CD metrology systems generally comprise high aspect ratios with respect to element lengths and separations. This property is used to advantage by specifying the pupil of the imaging system to be rectangular in cross-section with the boundaries of the rectangle aligned with the boundaries of the elements and selecting the aspect ratio of the rectangle to optimize performance of the linear displacement interferometric metrology system.

The use of a pupil that is rectangular in cross-section makes it possible to decouple the properties of the measured conjugated quadratures of the fields reflected/scattered by the elements with respect to the $\xi$ and $\eta$ coordinates. As a consequence, it is simpler to optimize a design of an imaging system in the linear displacement interferometric metrology system and makes it possible to achieve a better performance with respect to signal-to-noise ratios.

The component of a measurement beam that is generated by reflecting/scattering a measurement beam by the elements will generally comprise two components, a backscattered component and a forward scattered component. The conjugated quadratures of the backscattered component are measured interferometrically and accordingly, the phase of the conjugated quadratures contains information about the location of the array of elements in one or more of the x, y, and z directions.

Two procedures may be used to measure the backscattered component generated. One procedure is to restrict the range of values in $\xi$ in Eq. (1) to eliminate both the forward reflected/scattered component and to either limit the contribution to the measured conjugated quadrature to a single diffraction order from the arrays of elements comprising more than one element or in the case of an array comprising a single element, to prevent the generation of undesired contributions to the reflected/scattered component by multiple reflections between widely separated elements.

Another procedure is to not eliminate the contribution of forward reflected/scattered component in the measured conjugated quadratures but to restrict the range of values in $\xi$ in Eq. (1) to either limit the contribution to the measured conjugated quadrature to a single diffraction order from the arrays of elements comprising more than one element or in the case of an array comprising a single element, to prevent the generation of undesired contributions to the reflected/scattered component by multiple reflections between widely separated elements. The contributions of the forwarded/scattered components and the backscattered component are separated in the another procedure by the use of a form of phase sensitive detection such as described in commonly owned U.S. patent application Ser. No. 10/816,172 (ZI-51) wherein both are entitled "Apparatus and Method for Measurement of Fields of Forward Scattered/Reflected and Backscattered Beams by an Object in Interferometry" and both of which are by Henry A. Hill. The contents of both the provisional and non-provisional patent applications are herein incorporated in their entirety by reference.

The subsequent general description of the properties in the image plane of a linear displacement interferometric metrology system will be restricted to the first procedure wherein the range of values in $\xi$ is restricted, i.e. $\xi_2 > \xi_1$ and $\xi_1 \geq 0$ and $\xi_2$ and $\xi_1$ selected to either limit the contribution to the measured conjugated quadrature to a single diffraction order from the arrays of elements comprising more than one element or in the case of an array comprising a single element, to prevent the generation of undesired contributions to the reflected/scattered component by multiple reflections between widely separated elements.

Figure 6:
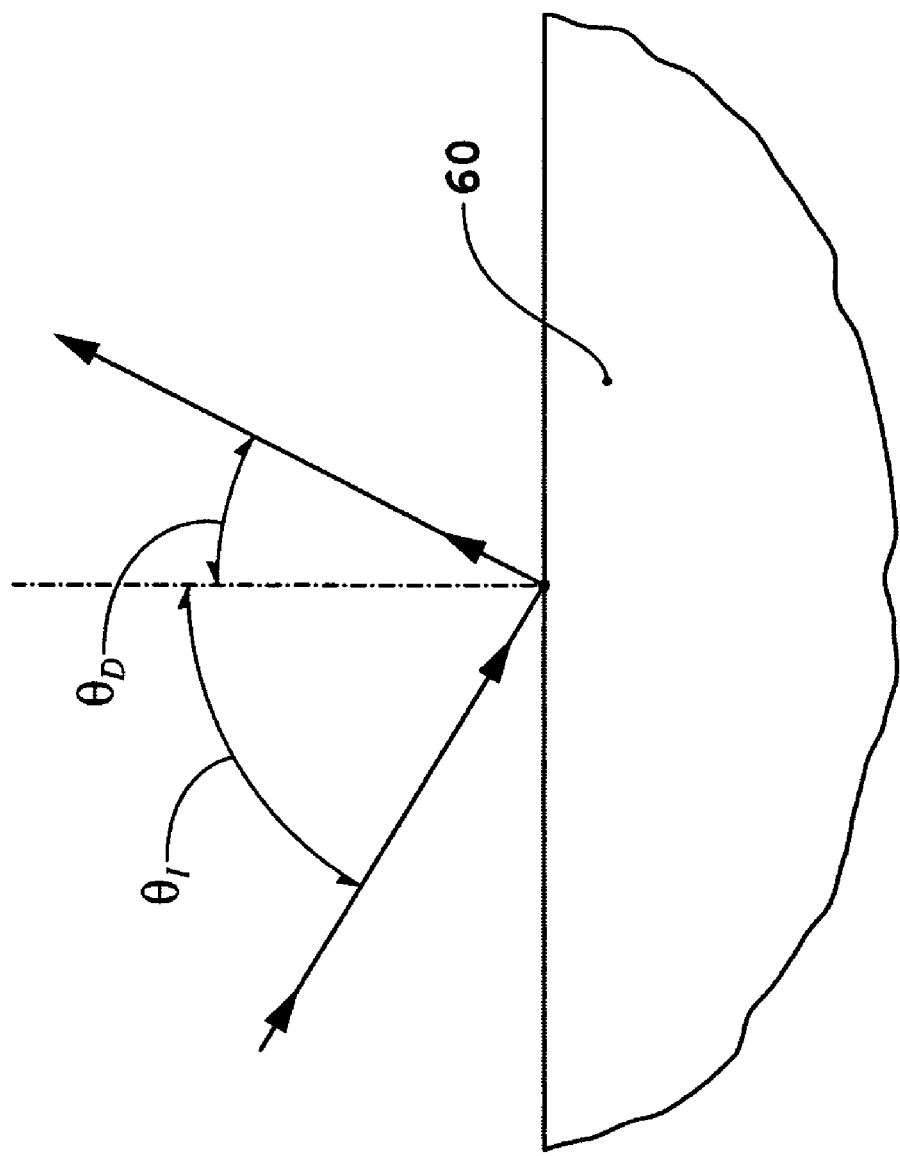
FIG. 6 is diagram of the angles of incidence and diffraction at a surface.

In the case of the array of elements comprising more than one element, i.e. the characteristic size of the spot being imaged is larger than the pitch of the array, the diffracted reflected/scattered beam will be preferentially diffracted at a particular set of angles. For a given optical wavelength $\lambda$ for a measurement beam, the particular set of angles at which a spatial frequency component of the substrate reflected/scattered beam by the spot will diffract the beam is given by a grating equation $$\Lambda[\sin\theta_I - \sin\theta_D] = m\lambda \quad (5)$$

where $\theta_I$ and $\theta_D$ are angles of incidence and diffraction as shown diagrammatically in FIG. 6, m is the diffraction order, and $\Lambda$ is the pitch or fundamental spatial wavelength component. It is evident from Eq. (5) that in order to obtain the smallest $\Lambda$ for a given optical wavelength $\lambda$, that $$\theta_D \cong -\theta_I, \quad (6)$$

$$\theta_I \approx 1. \quad (7)$$

The width $\Delta\theta$ of the beam diffracted in a specific diffraction order by the array of elements will be determined by an autocorrelation length l, i.e. the corresponding linear dimension of the array of elements, of the reflected/scattered beams as $$\Delta\theta \cong \frac{\lambda}{l} \sec\theta_D. \quad (8)$$

The values of $(\xi_2+\xi_1)/2$ and $(\xi_2-\xi_1)$ are determined in this case by $\theta_D$ and $\Delta\theta$, respectively.

Figure 4A:
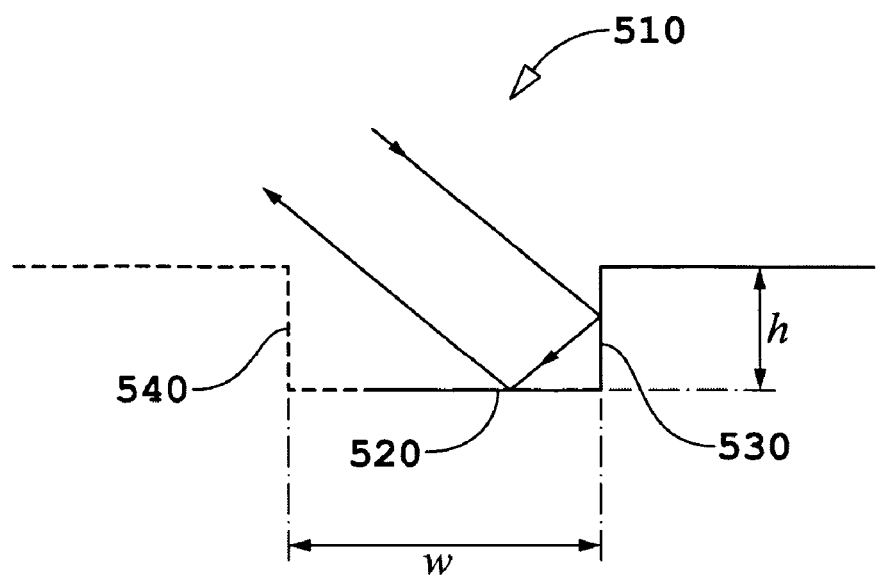
FIG. 4a is a diagrammatic representation of a Porro type prism element formed by surfaces of a mask feature with a beam making two reflections in the Porro type prism.
Figure 4B:
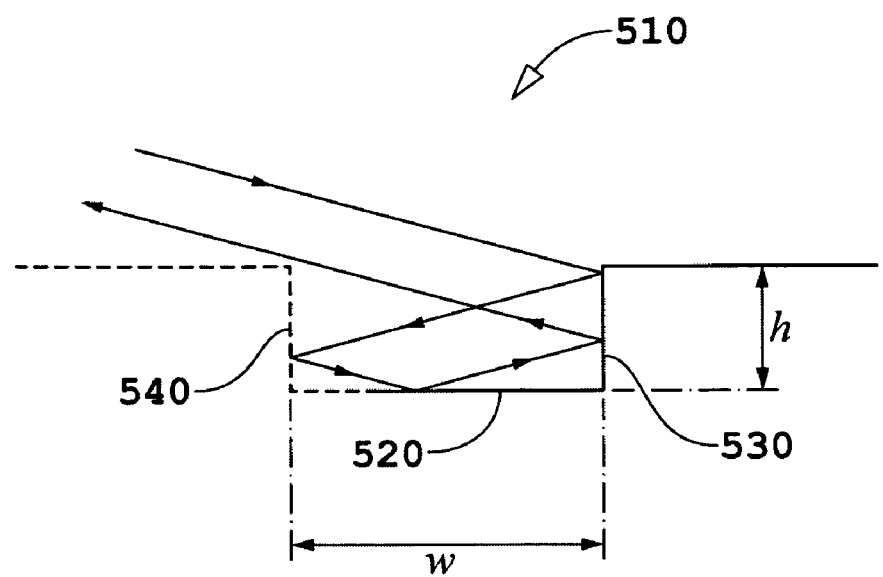
FIG. 4b is a diagrammatic representation of an open feature in a mask comprising a Porro type prism element with a beam making four reflections at the surfaces of the open feature.

In the case of the array of elements comprising a single element, one limiting value of $\xi_2$ will be determined by the height of the wall of the feature relative to the respective width of the feature and consideration of the amplitude of a component generated by four reflections at surfaces of the feature (see FIG. 4b). For a height h and a width w (see FIG. 4b), the corresponding value limiting value $\xi_{2,lim}$ is given by the relationship $$\left(\frac{\xi_{2,\lim}}{s'}\right) = \left(\frac{3}{2}\right)\left(\frac{w}{h}\right). \quad (9)$$

For the example of h=100 nm and w=200, the corresponding limiting value $\xi_{2,lim}$ is $$\xi_{2,lim} = 3s' \quad (10)$$

with $$\arctan\left(\frac{\xi_{2,\lim}}{s'}\right) = 71.6 \text{ degrees}. \quad (11)$$

A value of 71.6 degrees corresponds to a NA=0.95 which is compatible with imaging system designs.

It is important to note that the relative large value for arctan ($\xi_{2,lim}/s'$) makes it possible to achieve a significant spatial resolution at the feature being imaged corresponding to the $\xi$ direction.

Eq. (1) is evaluated for U(P) based on a rectangular aperture at the pupil and using a power series representation for the respective integrand. The leading terms from that evaluation are $$U(P) = 4a_\xi a_\eta C e^{ik(r'+s')-ik\left[(p\xi_0+q\eta_0)-\frac{1}{2}(\xi_0^2+\eta_0^2)\frac{z_0}{r'^2}\right]} \times \quad (12)$$

$$\left\{\begin{array}{l} \mathrm{sinc}k\alpha_\xi a_\xi \,\mathrm{sinc}k\alpha_\eta a_\eta - k\left(\frac{\beta a_\xi^2}{2}\right)^2 f_2(k\alpha_\xi a_\xi) - \\ k\left(\frac{\beta a_\eta^2}{2}\right)^2 f_2(k\alpha_\eta a_\eta) - \\ 2k\left(\frac{\beta a_\xi^2}{2}\right)\left(\frac{\beta a_\eta^2}{2}\right) f_1(k\alpha_\eta a_\eta)\, f_1(k\alpha_\eta a_\eta) + \ldots + \\ i\left[k\left(\frac{\beta a_\xi^2}{2}\right) f_1(k\alpha_\xi a_\xi) + k\left(\frac{\beta a_\eta^2}{2}\right) f_1(k\alpha_\eta a_\eta)\right] + \ldots \end{array}\right\}$$

where $$\beta = \frac{z_0}{r'^2}, \quad (13)$$

$$\xi_0 = \frac{(\xi_2+\xi_1)}{2}, \quad \eta_0 = \frac{(\eta_2+\eta_1)}{2},$$

$$\alpha_\xi = p - \xi_0\beta, \quad \alpha_\eta = q - \eta_0\beta,$$

$$a_\xi = \frac{(\xi_2-\xi_1)}{2}, \quad a_\eta = \frac{(\eta_2-\eta_1)}{2}.$$

and $$f_1(k\alpha a) = \mathrm{sinc}k\alpha a - 2\left[\frac{\cos k\alpha a - \mathrm{sinc}k\alpha a}{(k\alpha a)^2}\right] \quad (14)$$

$$= \frac{1}{3} - \frac{(k\alpha a)^2}{5} + \ldots,$$

$$f_2(k\alpha a) = \mathrm{sinc}k\alpha a + 4[\cos k\alpha a - 3f_1(k\alpha a)] \quad (15)$$

$$= \frac{1}{5} + \ldots$$

The properties of the measurement and reference beams are described in the context of specific embodiments of the present invention. However, it is appropriate to describe here a general property of at least some embodiments of the present invention that is achieved through the design of the reference beams used in the linear displacement interferometric metrology systems. The general property is that the reference beam is generated with properties such that the phase $\Phi$ of conjugated quadratures corresponding to the interference cross-term in the electrical interference signal values between the reference beam and the reflected/scattered measurement beam from a given Porro type prism element or feature generated by detection of mixed output beams of the linear displacement interferometric metrology systems has no dependence on either x or y.

The point spread function represented by Eq. (12) for the imaging system can be used to derive the image plane dependence of the phase Φ of a spot being imaged by the interferometric imaging system. For apertures 62 of pinhole array 12 that are less than or of the order of the size of the resolution of the imaging system 100, the image plane dependent contribution $\Phi_{(x,y)}$ to phase Φ is determined to a good approximation as the image plane dependent contribution to the phase of U(P) given by Eq. (12) minus the corresponding phase of the reference beam. The result is expressed as $$\Phi_{(x,y)} = -k\left(\frac{x\xi_0 + y\eta_0}{s'}\right) + k(x \sin \vartheta_\xi + y \sin \vartheta_\eta) \quad (16)$$

where the term $(x \sin \upsilon_\xi + y \sin \upsilon_\eta)$ corresponds to the phase contribution of the reference beam and $\upsilon_\xi$ and $\upsilon_\eta$ are the angles of incidence of the reference beam at the image plane, respectively. It is evident on inspection of Eq. (16) that the x and y dependence of phase Φ will be eliminated when the phase term $(x \sin \upsilon_\xi + y \sin \upsilon_\eta)$ for the reference beam is designed such that $$\sin \vartheta_\xi = \frac{\xi_0}{s'}, \quad (17)$$

$$\sin \vartheta_\eta = \frac{\eta_0}{s'}. \quad (18)$$

Eqs. (17) and (18) represent a condition that is met in at least some embodiments and accordingly, the general property is a property of those embodiments. However, other embodiments may also be configured so as to not implement the general property without departing from the scope and spirit of the present invention.

This is an important feature since the phase represented in conjugated quadratures is a function only of the reflecting properties and location of the Porro type prism element or feature in addition to a fixed offset error in the linear displacement interferometric metrology systems. A corollary statement is that the accuracy to which the location of a surface of an open or filled transparent feature can be measured is not affected by displacements of a pinhole corresponding to a detector or of a detector pixel used in measuring the respective conjugated quadratures.

The spots on the wafer that are being examined may contain a single pattern element or an array of two or more pattern elements in the form for example of a grating. It is beneficial to further describe the application of aspects of the present invention to the two cases from a pedagogical perspective and because the respective processing of measured conjugated quadratures can be formally different in certain aspects.

Location of an Alignment Mark: Single Element Type

The measurement of an error in an overlay, a location of an alignment mark, or an error in a CD in a spot comprising a single pattern feature is based in part on a linear displacement interferometric measurement wherein the measurement and/or the reference object comprises a Porro type prism element such as described in commonly owned U.S. Provisional patent applications Ser. No. 60/568,774 (ZI-60), Ser. No. 60/569,807 (ZI-61), and Ser. No. 60/573,196 (ZI-63) and the corresponding U.S. patent application (T.B.D.) (ZI-63) filed May 6, 2005 wherein all four are entitled "Apparatus And Methods For Measurement Of Critical Dimensions Of Features And Detection Of Defects In UV, VUV, And EUV Lithography Masks" and each are by Henry A. Hill. The contents of each of the four cited applications are herein incorporated in their entirety by reference. The Porro type prism element or a measurement and/or reference object is formed by two partially reflecting surfaces of an open or filled transparent feature in the mask or wafer which may be contiguous or spatially separated. The two partially reflecting surfaces of the Porro type prism element are nominally orthogonal with respect to each other but may be at some other angle in a given end use application, e.g. 60 degrees or 80 degrees, without departing from the scope and spirit of the present invention.

An example of the measurement and/or reference object comprising the Porro type prism element is shown diagrammatically as element 510 in FIG. 4a. Element 510 comprises two surfaces, a partially reflecting horizontal surface 520 forms one of the two reflecting surfaces and one of the partially reflecting nominally vertical surfaces of a feature in a mask 530 forms the second of the two reflecting surfaces. The feature comprises surface elements 520, 530, and 540.

A defect in the reflecting substrate 520 in the form of a foreign particle will introduce an error in inferred position of the measurement object in addition to the error introduced by an error in either the profile of surface 520 and/or in a respective CD associated with surfaces 530 and 540. Thus a detected error in the relative locations of respective surfaces of a feature forming a Porro type prism element may be due to either an error in the physical location one or both of the respective feature surfaces and/or due to the presence of a defect, e.g. a particle or an error in the height profile of a surface, within the feature. Accordingly, it is necessary to examine the feature with a different diagnostic tool in order to isolate the contribution of an error in a CD to the linear displacement measurement, i.e. if there is detected an error in the apparent location of a Porro type prism element or measurement object formed by boundaries of an open or filled transparent feature, a check may be required to eliminate the possibility that a defect exists in the horizontal surface profile or in the form of a particle in the interior of the feature that may be generating the detected error in part or in whole.

The different diagnostic tool comprises a differential interferometric confocal and/or an interferometric non-confocal microscopy system preferentially operating in a dark field mode. The differential interferometric microscopy systems may in addition be used to detect defects in any one of the reflecting surfaces of a mask, i.e. a reflecting substrate, the surface of a buffer, the surface of a phase-shifting layer, and/or the surface of an absorber at different points in the fabrication of the mask.

A CD corresponding to the spacing between two opposing walls of an open or filled transparent feature are measured when using the linear displacement interferometric metrology systems by comparing the respective locations of the respective Porro type prism elements formed by the horizontal and vertical surfaces of the open or filled transparent feature. Thus the measurement of the CD is a differential technique. As a consequence, the value of the measured CD is independent of the refractive indices of the media forming the surfaces of the open or filled transparent feature.

The pitch of a parallel array of elongated features corresponding to the spacing of corresponding walls of two contiguous open or filled transparent features are measured using the linear displacement interferometric metrology systems by comparing the respective locations of the respective Porro type prism elements formed by the horizontal and vertical surfaces of the open or filled transparent features of the array of elongated features. Thus the measurement of the pitch is a differential technique. As a consequence, the value of the measured pitch is independent of the refractive indices of the media forming the surfaces of the open or filled transparent features when the open or filled transparent features are identical or substantially the same with respect to composition.

The calibration of the pitch scale is based on the use of a reference or standard parallel array and/or on the use of a stage metrology system. The accuracy of a pitch measurement will depend in part on the accuracy to which the surface profile of the array of horizontal reflecting surfaces of the open or filled transparent features are measured or known. The profile can be measured.

Multiple Element Pattern: Grating Response

The point spread function represented by Eq. (12) for the imaging system of a spot can be used to derive the dependence of the phase $\Phi_m$ of a measured conjugated quadratures or differential conjugated quadratures on the translation of a grating pattern through the spot being imaged by the interferometric imaging system. Including the effects of the imaging system for delivering the measurement beam to the spot and with the conditions expressed by Eqs. (17) and (18) met, phase $\Phi_m$ can be expressed to a good approximation for apertures 62 of pinhole array 12 that are less than or of the order of the size of the resolution of the imaging system 100 as $$\Phi_m = -k\left[\frac{(x_0(\xi_0+\xi_0')+y_0(\eta_0+\eta_0'))}{r'}\right] + k\frac{1}{2}(\xi_0^2+\xi_0'^2+\eta_0^2+\eta_0'^2)\frac{z_0}{r'^2} + \quad (19)$$
$$\arctan\left\{\frac{kz_0}{6\operatorname{sinc}k\alpha_\xi a_\xi \operatorname{sinc}k\alpha_\eta a_\eta}\frac{(a_\xi^2+a_\eta^2)}{r'^2}\right\} + \ldots +$$
$$\arctan\left\{\frac{kz_0}{6\operatorname{sinc}k\alpha_\xi' a_\xi' \operatorname{sinc}k\alpha_\eta a_\eta'}\frac{(a_\xi'^2+a_\eta'^2)}{r'^2}\right\} + \ldots$$

where $\xi_0$ and $\xi_0'$ are determined by $\theta_I$ and $\theta_D$, respectively, $\alpha_\xi$ will be set by the NA of the input beam delivery system of the measurement beam, and $\alpha_\xi'$ will be determined by the NA of the imaging system used for generating an image of a spot with the reflected/scattered measurement beam.

Sensitivity: Displacement $x_0$ in Terms of $\Phi_m$

The evaluation of the sensitivity of $x_0$ in terms of $\Phi_m$ is obtained from Eq. (19) with the result $$x_0 = -\lambda\left(\frac{r'}{\xi_0+\xi_0'}\right)\left(\frac{\Phi_m}{2\pi}\right) + \ldots \quad (20)$$

where $$\frac{1}{3} \leq \left(\frac{r'}{\xi_0+\xi_0'}\right) \leq 1. \quad (21)$$

The ratio of the pitch $\Lambda$ of a grating to the wavelength $\lambda$ is $$\frac{\Lambda}{\lambda} = \frac{r'}{\xi_0+\xi_0'} + \ldots \quad (22)$$

Therefore for example, the measurement of the phase $\Phi_m$ to an accuracy of 6 milliradian for a $\lambda=200$ nm and a $\Lambda=100$ nm would yield a relative position accuracy of 0.1 nm mod $\Lambda$ for the portion of the grating in the spot. The displacement redundancy of $\Lambda$ is a consequence of the phase redundancy of $2\pi$ in $\Phi_m$.

Measurement of Grating Pitch $\Lambda$

The average pitch $\Lambda$ of the portion of the grating in the spot is measured as the change in displacement $x_0$ that will produce a $2\pi$ phase shift in $\Phi_m$.

Location of an Alignment Mark: Grating Type

The relative location of an alignment mark is determined by first scanning the respective portion of wafer corresponding to the alignment mark with two different alignment mark metrology system configurations and recording the respective displacements of $x_0$ as a function of $\Phi_m$. The values of $\theta_I$ and $\theta_D$ for the two different configurations of the interferometric imaging system of the alignment mark metrology system are equal in magnitude, respectively, but have opposite signs, respectively. The displacements in $x_0$ are measured by the stage metrology system of the lithography tool for which information about the location of the alignment mark is being determined. It is assumed herein that the performance with respect to accuracy of the lithography stage metrology system matches the accuracy required to meet the accuracy of the overlay budget of the lithography tool/specific process.

The location of the alignment mark is obtained as the average value of the two measured values of $x_0$ if the spot contains a single scattering element and the average value of $x_0$ mod $\Lambda$ if the spot contains a portion of a grating. The offset error in the case of the spot containing a single scattering element is calibrated by using a pair of Porro type prism elements on a calibration wafer separated by a distance larger than the size of the spot and the separation of the two Porro type prism elements measured by an independent procedure. The independent procedure may be based for example on measurements with a scanning Atomic Force Microscope (AFM).

The removal of the redundancy with respect to $\Lambda$ is achieved by incorporating one or more additional gratings wherein the relative values of the pitches of the additional gratings form for example a geometric progression, i.e. 1,2,4,8, . . . , and the locations of each of the additional gratings are determined mod respective values of pitch. The number of additional gratings (N−1) required for each of two coordinate system axes will be determined by the ratio of the linear dimension of the spot to $\Lambda$. Accordingly, N≧3 based on the domain expressed in Eq. (21).

The measurements of the respective values of $x_0$ and corresponding values of $\Phi_m$ are obtained simultaneously for the one or more gratings and as a consequence, the additional measurements required to remove the pitch redundancy does not affect the throughput of the respective lithography tool.

The area required for the alignment mark and the additional gratings is approximately $\geq(N\lambda)_x(N\lambda)_y/3$ depending on the linear dimensions of the spot where the subscripts refer to the x and y axes of a coordinate system. For the example of $\lambda=200$ nm and N=4, the area required for the alignment mark and additional gratings is approximately 0.05 $(\mu m)^2$.

Relative Location of Two Gratings Located on Same Process Layer of Wafer

The relative location of two gratings located on the same process layer of a wafer is determined by scanning the respective portions of wafer corresponding to the two gratings and recording the spatial separation in $x_0$ that corresponds to a change in $\Phi_m$ mod $2\pi$. The relative location of the two gratings corresponds to the measured spatial separation in $x_0$ mod $\Lambda$. The pitch redundancy generally will not present a problem when the measured separation mod $\Lambda$ is used in an overlay metrology system. If however it is desired to remove the pitch redundancy, an array of additional gratings may be used in the manner described herein in the section entitled "Location Of An Alignment Mark: Grating Type" for the removal of the pitch redundancy encountered in the alignment mark determination.

If the profile of the wafer surface is not flat, there will be an error introduced in the measured spatial separation in $x_0$ mod $\Lambda$. The sensitivity function $\partial\Phi_m/\partial z_0$ is obtained from Eq. (19) with the result $$\frac{\partial \Phi_m}{\partial z_0} = k\frac{1}{2}[\xi_0^2 + \xi_0'^2 + \eta_0^2 + \eta_0'^2]\frac{1}{r'^2} + \frac{k}{6\mathrm{sinc}\,k\alpha_\xi a_\xi \mathrm{sinc}\,k\alpha_\eta a_\eta}\left[\frac{(a_\xi^2 + a_\eta^2)}{r'^2} + \frac{(a_\xi'^2 + a_\eta'^2)}{r'^2}\right] + \ldots \quad (23)$$

evaluated at $z_0=0$. The difference in the height of the surface of the wafer at the sites of the two gratings is measured by the use of a differential interferometric confocal and/or an interferometric non-confocal microscopy system preferentially operating in a dark field mode. The differential interferometric microscopy systems are such as described herein in the section entitled "Differential Interferometric Microscopy Systems." The differential interferometric microscopy systems may in addition be used to detect defects at either of the two sites.

The measured difference in height and the sensitivity function $\partial\Phi_m/\partial z_0$ given by Eq. (23) is used to compute the correction that needs to be made to the spatial separation in $x_0$ to obtain a corrected value of the separation of the two gratings.

The results of the relative locations are used in an overlay and CD metrology systems which can further be used in APC. The results of CD measurements can be used in OPC.

Figure 1B:
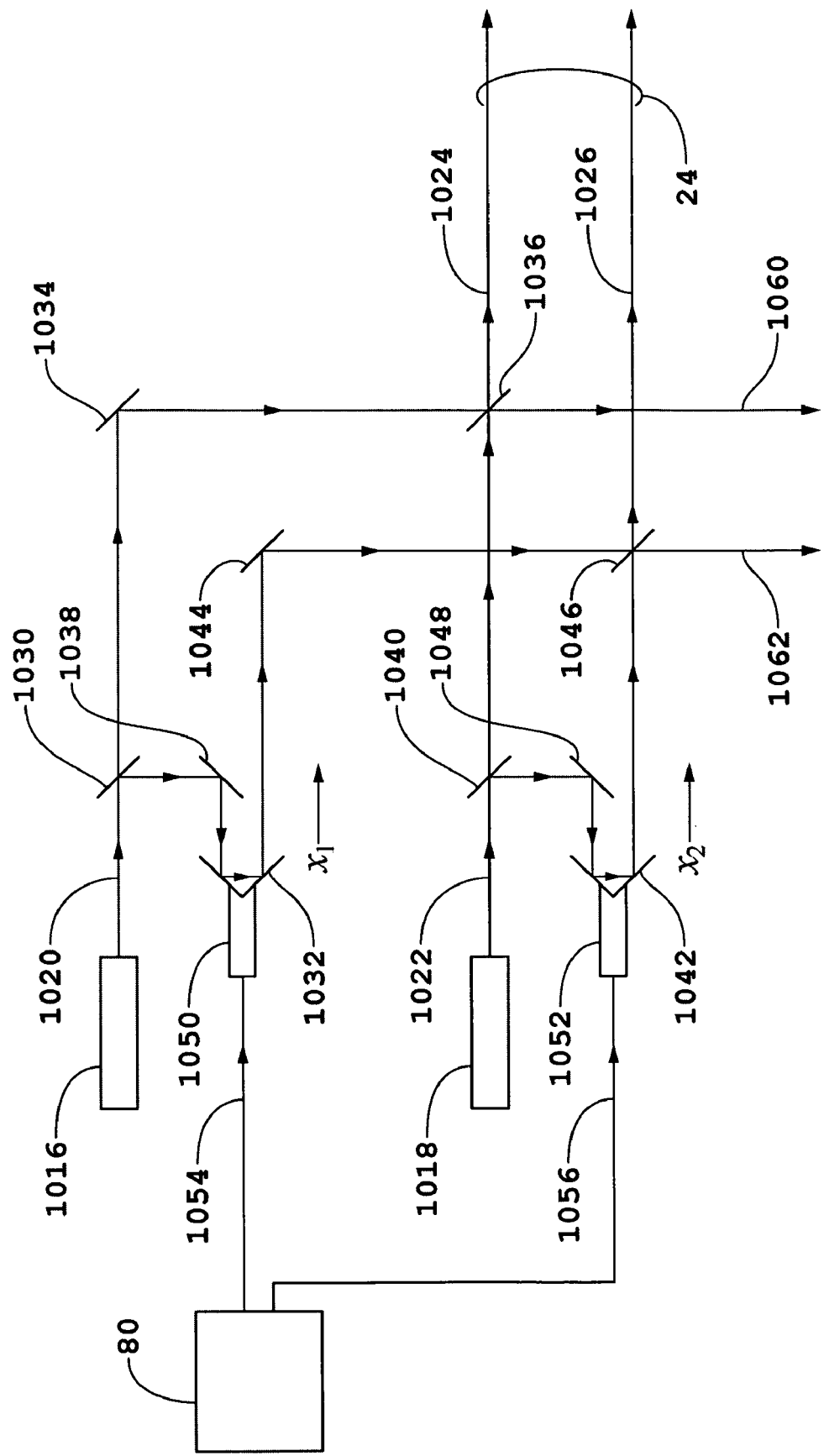
FIG. 1b is a diagram of a source and beam-conditioner.
Figure 1C:
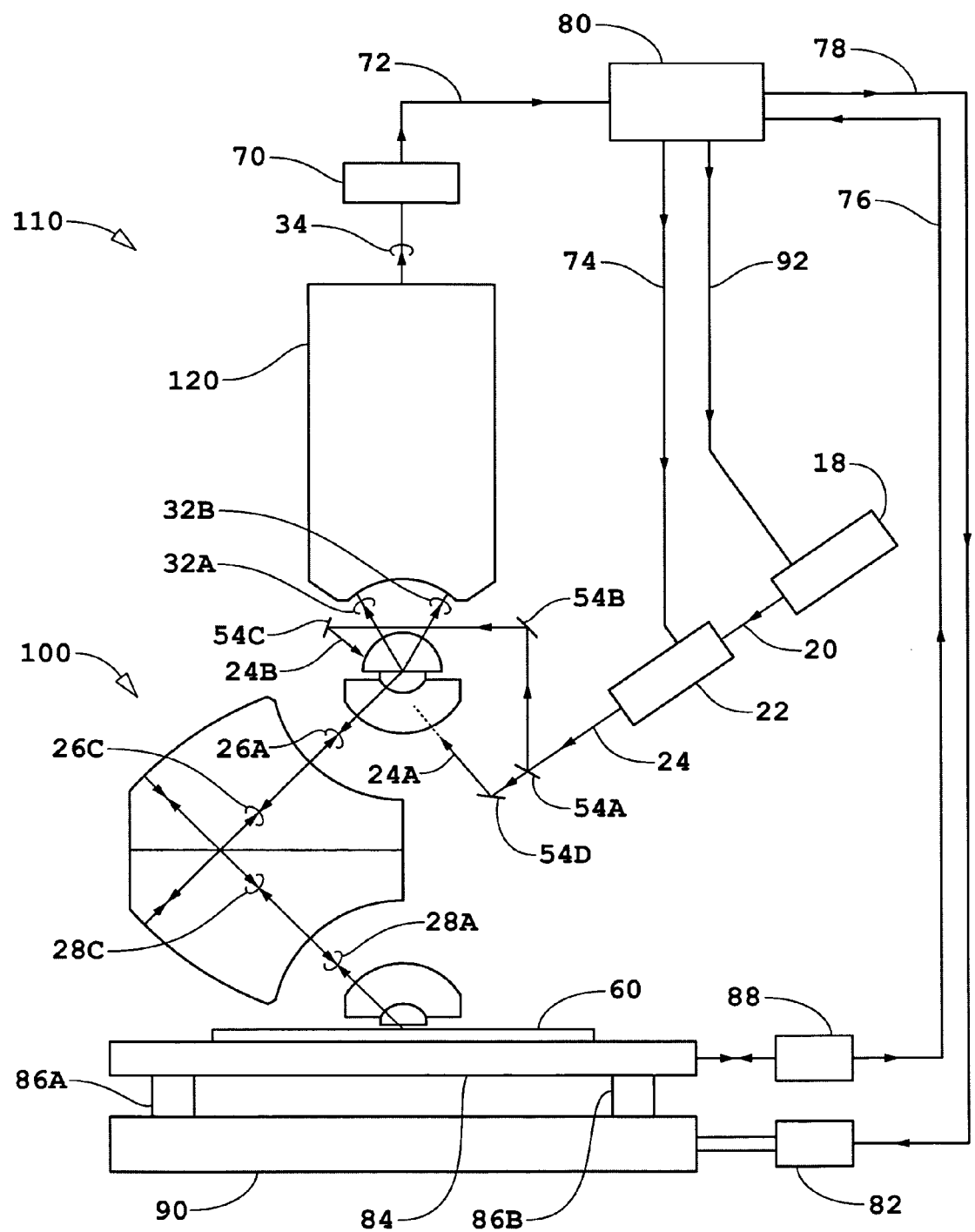
FIG. 1c is a diagram of an interferometric metrology system comprising a catadioptric imaging system.
Figure 1D:
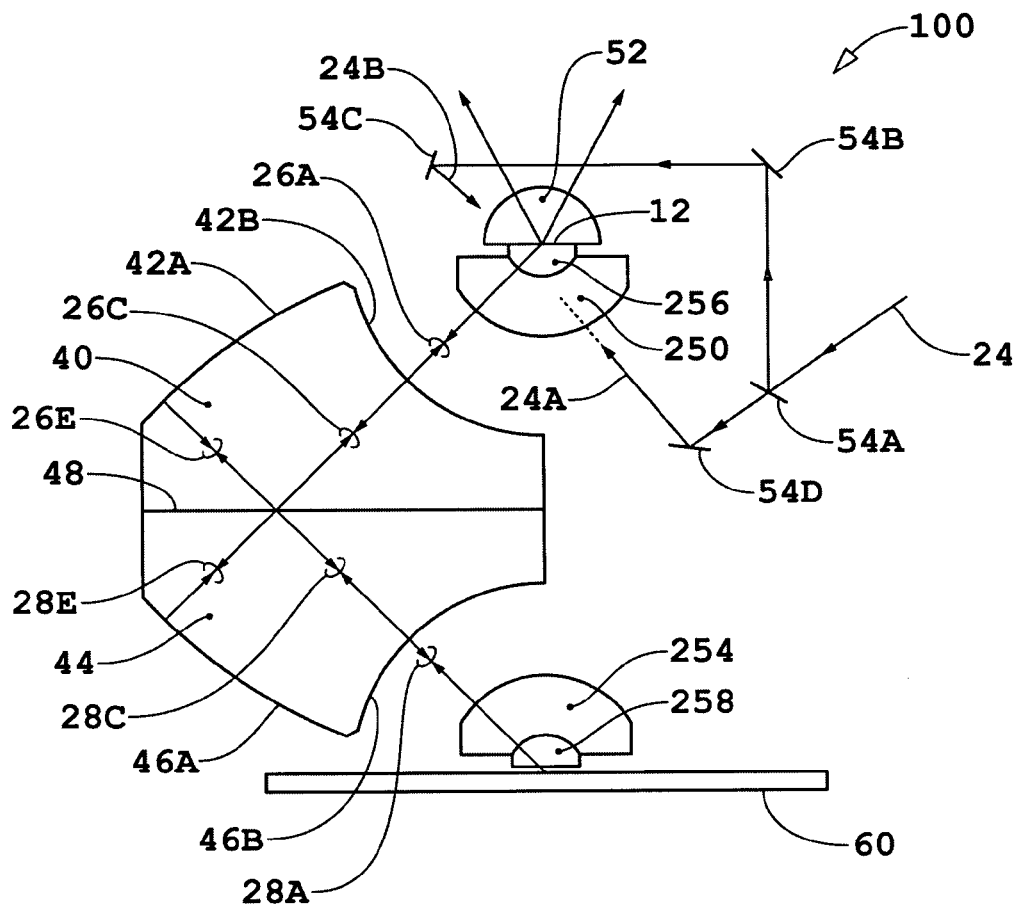
FIG. 1d is a diagram of a catadioptric imaging system.
Figure 1E:
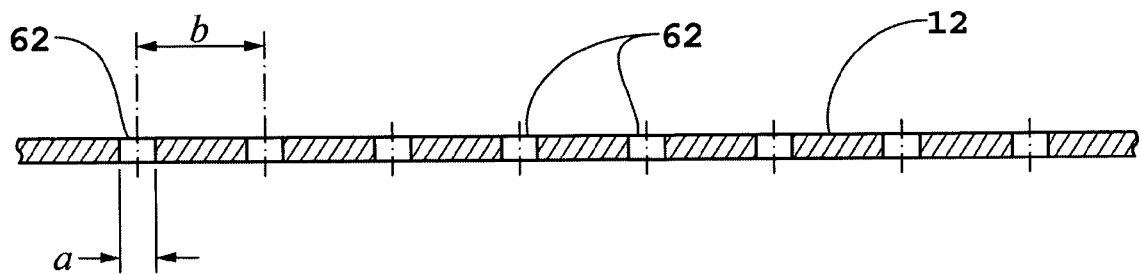
FIG. 1e is a diagram of a pinhole array beam-splitter.
Figure 1F:
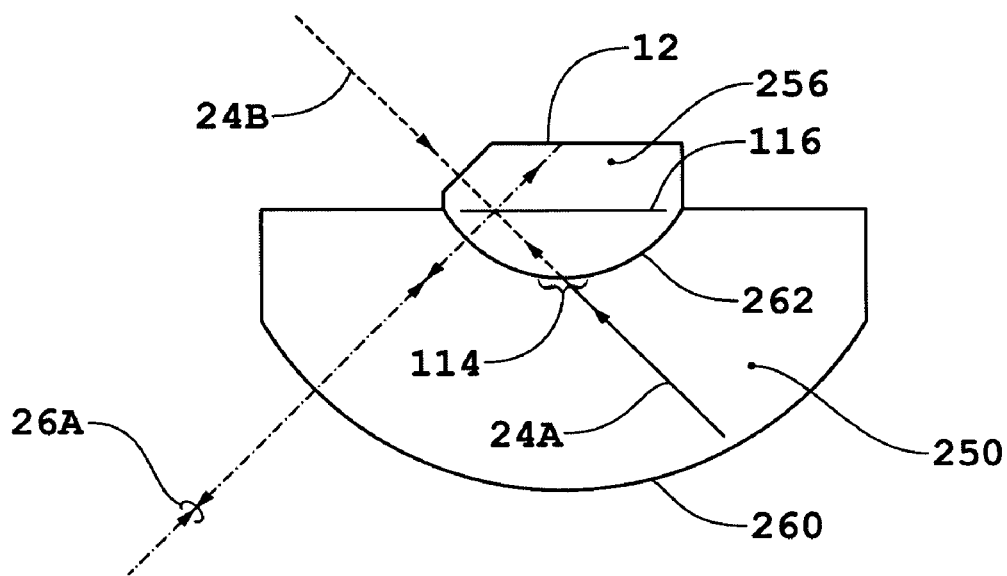
FIG. 1f is a diagram of a beam-splitter system for introducing measurement and reference beams into an interferometric metrology system.
Figure 1G:
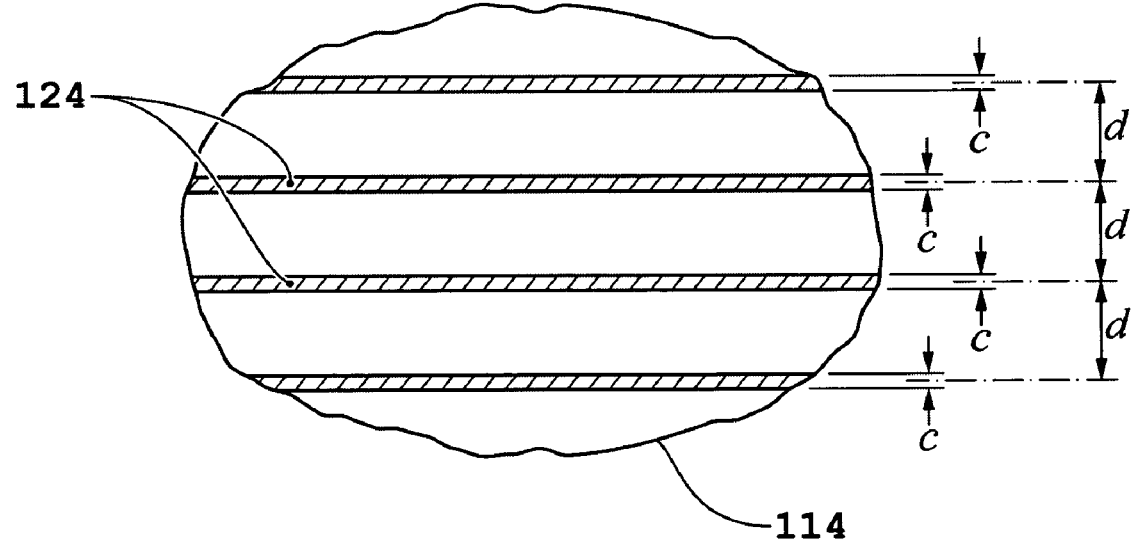
FIG. 1g is a diagram of a beam-splitter comprising an array of parallel slits.
Figure 1H:
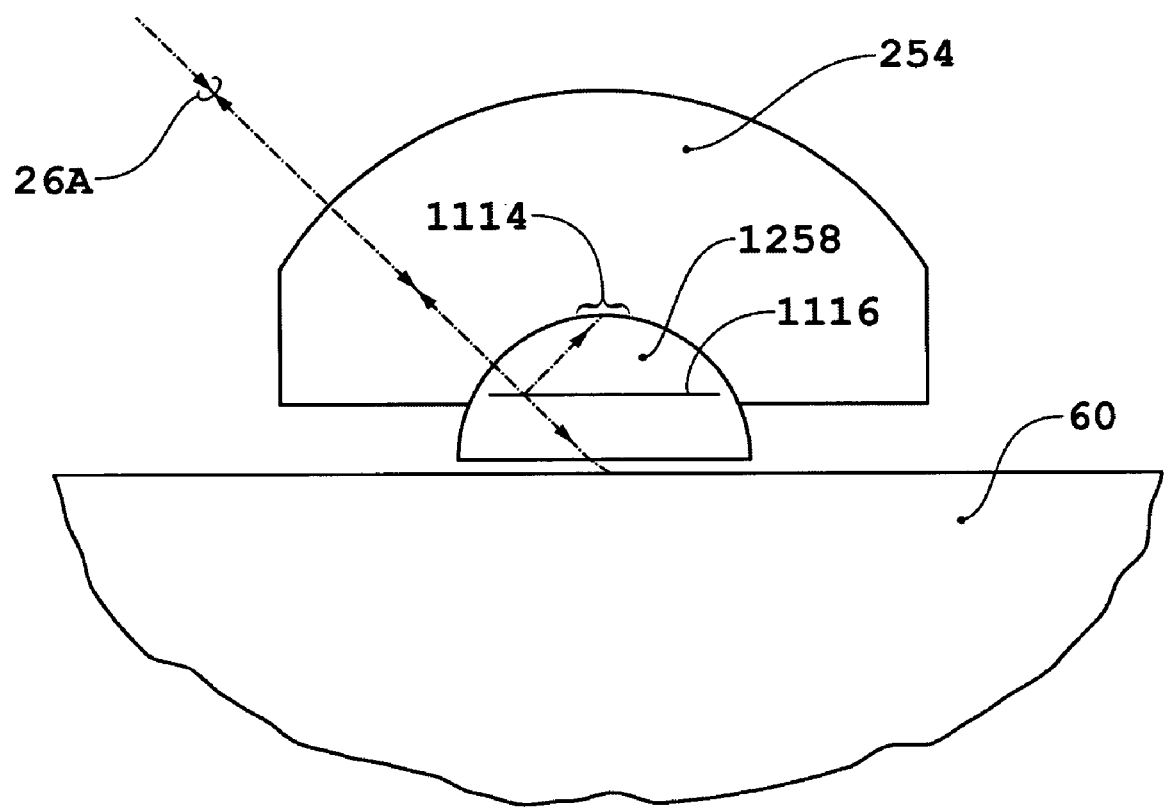
FIG. 1h is a diagram of a beam-splitter system for introducing measurement and reference beams into an interferometric OCDR system.
Figure 1I:
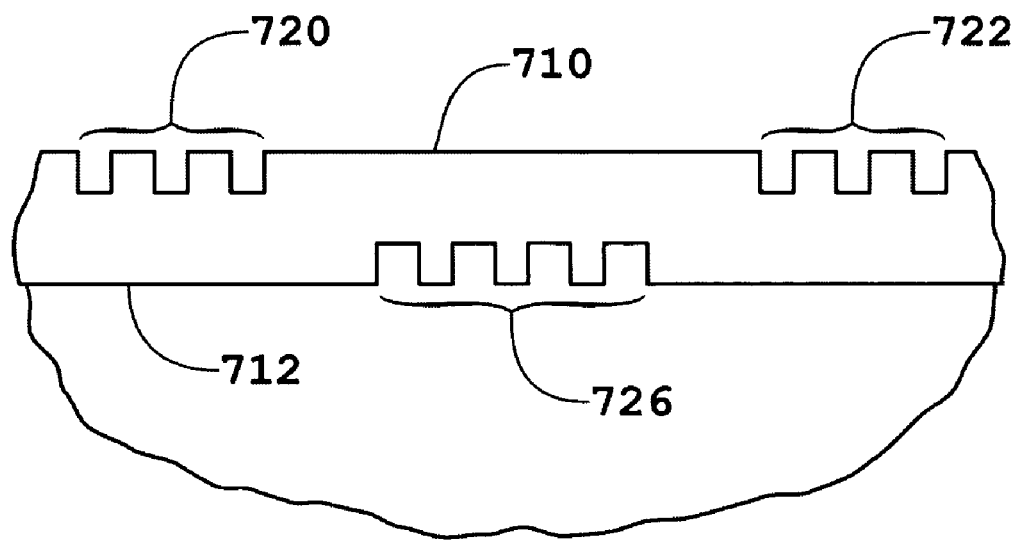
FIG. 1i is a diagram of gratings located on two different process layers of a wafer that are not superimposed.

Relative Location of Non-Superimposed Gratings Located on Two Different Process Layers of Wafer The relative location of non-superimposed gratings such as shown in FIG. 1i located on different process layers of a wafer is determined from measurements obtained by scanning the respective portions of wafer corresponding to two gratings and recording the spatial separation in $x_0$ that corresponds to a change in $\Phi_m$ mod $2\pi$ for two different configurations of the respective metrology system. The values of $\theta_I$ and $\theta_D$ for the two different configurations of the interferometric imaging system of the metrology system are equal in magnitude, respectively, but have opposite signs, respectively. The displacements in $x_0$ are measured by the stage metrology system of the lithography tool for which information about the location of the alignment mark is being determined. It is assumed herein that the performance with respect to accuracy of the lithography stage metrology system matches the accuracy required to meet the accuracy of the overlay budget of the lithography tool/specific process.

With reference to FIG. 1i, two gratings 720 and 722 are located in process layer 710 and grating 726 is located laterally in between gratings 720 and 722 in process layer 712.

Different pinholes of pinhole array 12 are used to obtain the respective measured values of $\Phi_m$ wherein the portion of the interferometric imaging system imaging the grating located on the interior process layer is compensated for the aberrations introduced by the object space being located interior to the surface of the wafer. The compensation uses the technique described in commonly owned U.S. patent application Ser. No. 10/771,785 (ZI-44), entitled "Compensation for Effects of Mismatch in Indices of Refraction at a Substrate-Medium Interface in Confocal and Interferometric Confocal Microscopy" to Henry A. Hill. The contents of the non-provisional patent application is herein incorporated in its entirety by reference.

The pitch redundancy generally will not present a problem when the measured separation mod $\Lambda$ is used in an overlay metrology system. If however it is desired to remove the pitch redundancy, an array of additional gratings may be used in the manner described herein for the removal of the pitch redundancy encountered in the alignment mark determination in the section entitled "Location of an Alignment Mark; Grating type".

The relative location of the two gratings is obtained as the average value of the two measured values of $x_0$ if the spots each contain a single scattering element and the average value of $x_0$ mod $\Lambda$ if the spots each contain a portion of a grating.

There may be an offset error as a result of the affect of imaging of a spot interior of the wafer in each of the two scans of the wafer. However, the offset error will cancel out to a high level in computing the average of the two measured values of $x_0$. The degree to which the offset errors cancel out can be checked by adapting the procedure described herein in the section entitled "Location of an Alignment Mark: Grating type" for spots comprising a single scattering element. In this case, the independent procedure can be for example based on a Scanning Electron Microscope (SEM).

A higher level of cancellation of the offset error can be achieved by using a set of an even number of gratings on one process layer and an odd number of gratings on the second process layer with the gratings on the two process layers interleaved transversely such as shown in FIG. 1i.

If the profiles of either or both of the two respective wafer surfaces are not flat, there will be an error introduced in the average value of the two measured values of $x_0$ that are used in the determination of the spacing of the two gratings. The difference in the height of the two surfaces of the wafer at the sites of the two gratings is measured by the use of a differential interferometric confocal and/or an interferometric non-confocal microscopy system preferentially operating in a dark field mode. The differential interferometric microscopy systems are such as described herein in the section entitled "Differential Interferometric Microscopy Systems."

The differential interferometric microscopy systems may in addition be used to detect defects at either of the two sites.

To obtain a corrected value of the separation of the two gratings, the measured difference in height and the sensitivity function $\partial\Phi_m/\partial z_0$ given by Eq. (23) are used to compute the correction that needs to be made to the average value of the two measured values of $x_0$ used in the determination of the spacing of the two gratings.

The results of the relative locations are used in an overlay and CD metrology systems which can further be used in APC. The results of CD measurements can be used in OPC.

Figure 1J:
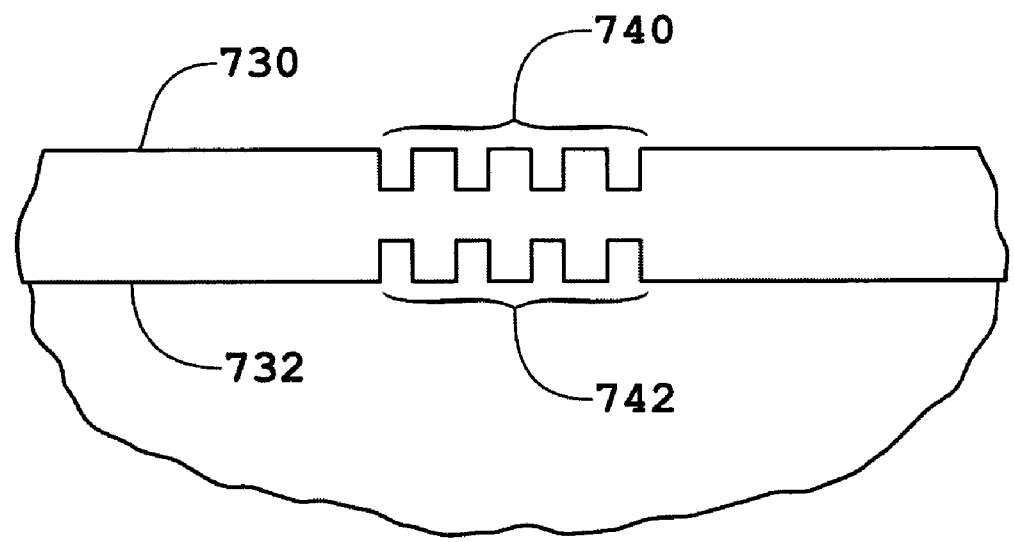
FIG. 1j is a diagram of gratings located on two different process layers of a wafer that are superimposed.

Relative Location of Superimposed Gratings Located on Two Different Process Layers of Wafer The relative location of superimposed gratings such as shown in FIG. 1*j* is determined by measurement of other properties of the conjugated quadratures, e.g. values of differential conjugated quadratures as a function of scattering angle of respective reflected/scattered beams and inverting the measured quantities to obtain information about the relative location of the superimposed gratings. With reference to FIG. 1*j*, the two superimposed gratings 740 and 742 are located in process layers 730 and 732, respectively. The inversion procedure is based on a rigorous treatment of scattering and iterating the assumed properties of the superimposed gratings until the computed other properties of the conjugated quadratures matches the measured other properties of the conjugated quadratures to a requisite level.

The rigorous treatment of scattering includes the affects of fields of beams generated by one or more reflections/scatterings by each of two stacked gratings.

The results of the relative locations are used in an overlay metrology system which can further be used in APC. The results of CD measurements can be used in OPC.

Measurement of WIS

The affect of WIS may be determined by measurement of phase shifts or from the analysis of properties of the differential conjugated quadratures based on a rigorous treatment of scattering and an iteration of the assumed properties of the features of patterns on a patterned wafer.

The procedure based on the measurement of phases is the preferred procedure when there is a choice between the two procedures. The procedure based on measurement of phases generally is generally more accurate, less sensitive to assumed properties of a pattern, does not require extensive inversion analyses, and leads to a higher throughput.

The procedure based on the measurement of phases is generally an option when the pattern under measurement is etched into a multilayer stack comprising two or more layers and the reflection properties of the different layers is different for s and p polarization states of measurement beams.

The pitch $\Lambda$ of a portion of a grating, a CD of a pattern feature, or the spacing between two distinct gratings is measured using s and p polarization states of the measurement beam. The affect of WIS will be to introduce an asymmetry in the respective patterns by altering the top layer or layers of the multilayer stacks. Accordingly, the asymmetry will introduce a difference in the pitch $\Lambda$ of a portion of a grating, a CD of a pattern feature, or the spacing between two distinct gratings is measured using s and p polarization states of the measurement beam. Information about the affect of WIS can be determined from the measured difference by taking into account the different reflectivities of the layers with respect to state of polarization of the measurement beam. The most accurate information about the affect of WIS is obtained when the affect of WIS is confined to a single top layer.

In the following description of the different embodiments, many elements of the different embodiments perform like functions and are indicated with the same numerals in different respective figures of the embodiments.

The results of the measurements of WIS can be used in an overlay and CD metrology systems which can further be used in APC. The results of CD measurements can be used in OPC.

Referring to FIG. 1*a*, an interferometer system is shown diagrammatically comprising an interferometer 10, a source 18, a beam-conditioner 22, detector 70, an electronic processor and controller 80, and a measurement object 60. Source 18 is a pulsed or shuttered source that generates input beam 20 comprising one or more frequency components. Beam 20 is incident on and exits beam-conditioner 22 as input beam 24 that comprises a single polarized component or two orthogonally polarized components. Each of the polarized components comprises one or more different frequency components. The measurement beam components of the frequency components of input beam 24 are coextensive in space and have the same temporal window function and the corresponding reference beam components are coextensive in space and have the same temporal window function. The measurement beam components and the reference beam components may be coextensive in space or not coextensive in space.

Reference and measurement beams may be generated in either beam-conditioner 22 from a set of beams from source 18 or in interferometer 10 for each of the frequency components of input beam 24. Measurement beam 30A generated in either beam-conditioner 22 or in interferometer 10 is incident on measurement object 60. Measurement beam 30B is a return measurement beam generated as either a portion of measurement beam 30A reflected and/scattered or transmitted by measurement object 60. Return measurement beam 30B is combined with the reference beam in interferometer 10 to form output beam 34.

Output beam 34 is detected by a quantum detection process by detector 70 to generate one or more electrical interference signals per source pulse for the homodyne detection method used and transmitted as signal 72. Detector 70 may comprise an analyzer to select common polarization states of the reference and return measurement beam components of beam 34 to form a mixed beam. Alternatively, interferometer 10 may comprise an analyzer to select common polarization states of the reference and return measurement beam components such that beam 34 is a mixed beam.

In practice, known phase shifts are introduced between the reference and measurement beam components of output beam 34 by two different techniques. In the first technique, phase shifts are introduced between corresponding reference and measurement beam components for each of the frequency components of output beam 34 as a consequence of a non-zero optical path difference between the reference and measurement beam paths in interferometer 10 and corresponding frequency shifts introduced to the frequency components of input beam 24 by beam-conditioner 22 and/or source 18 as controlled by signals 74 and 92, respectively, from electronic processor and controller 80. In the second technique, phase shifts are introduced between the reference and measurement beam components for each of the frequency components of input beam 24 by beam-conditioner 22 and/or source 18 as controlled by signals 74 and 92, respectively, from electronic processor and controller 80.

There are different ways to configure source 18 and beam-conditioner 22 to meet the input beam requirements of the different embodiments of the present invention.

Examples of beam-conditioners that may be used in either first or the second technique comprise combinations of a two frequency generator and phase shifting type of beam-conditioner such as described in commonly owned U.S. patent application Ser. No. 10/765,369, filed Jan. 27, 2004, entitled "Apparatus And Method For Joint Measurements Of Conjugated Quadratures Of Fields Of Reflected/Scattered Beams By An Object In Interferometry" (ZI-47). Other examples of beam-conditioners that may be used in either the first or the second technique comprise combinations of multiple frequency generators and phase shifting types of beam-conditioners such as described for example in commonly owned U.S. patent application Ser. No. 10/816,180, filed Apr. 1, 2004, entitled "Apparatus and Method for Joint Measurement of Fields of Scattered/Reflected Orthogonally Polarized Beams by an Object in Interferometry." The two U.S. patent applications are by Henry A. Hill and their contents are incorporated herein by reference.

With a continuation of the description of different ways to configure source 18 and beam-conditioner 22 to meet the input beam requirements of different embodiments of the present invention, source 18 will preferably comprise a pulsed source. There are a number of different ways for producing a pulsed source [see Chapter 11 entitled "Lasers", *Handbook of Optics*, 1, 1995 (McGraw-Hill, New York) by W. Silfvast]. Each pulse of source 18 may comprise a single pulse or a train of pulses such as generated by a mode locked Q-switched Nd:YAG laser. A single pulse train is referenced herein as a pulse and a pulse and a pulse train are used herein interchangeably.

Source 18 may be configured in certain embodiments of the present invention to generate two or more frequencies by techniques such as described in a review article entitled "Tunable, Coherent Sources For High-Resolution VUV and XUV Spectroscopy" by B. P. Stoicheff, J. R. Banic, P. Herman, W. Jamroz, P. E. LaRocque, and R. H. Lipson in *Laser Techniques for Extreme Ultraviolet Spectroscopy*, T. J. McIlrath and R. R. Freeman, Eds., (American Institute of Physics) p 19 (1982) and references therein. The techniques include for example second and third harmonic generation and parametric generation such as described in the articles entitled "Generation of Ultraviolet and Vacuum Ultraviolet Radiation" by S. E. Harris, J. F. Young, A. H. Kung, D. M. Bloom, and G. C. Bjorklund in *Laser Spectroscopy I*, R. G. Brewer and A. Mooradi, Eds. (Plenum Press, New York) pp 59, (1974) and "Generation of Tunable Picosecond VUV Radiation" by A. H. Kung, *Appl. Phys. Lett.* 25, pp 653 (1974). The contents of the three cited articles are herein incorporated in their entirety by reference.

The output beams from source 18 comprising two or more frequency components may be combined in beam-conditioner 22 by beam-splitters to form coextensive measurement and reference beams that are either spatially separated or coextensive as required in at least some embodiments. The frequency shifting of the various components required in certain embodiments may be introduced in source 18 for example by frequency modulation of input beams to parametric generators and the phase shifting of reference beams relative to measurement beams in beam-conditioner 22 may be achieved by phase shifters of the optical-mechanical type comprising for example prisms or mirrors and piezoelectric translators or of the electro-optical modulator type.

An embodiment of the optical-mechanical type of beam-conditioner and two frequency generator that may be used in the phase shifting of reference beams relative to measurement beams in beam-conditioner 22 is shown diagrammatically in FIG. 1b. The source comprises two lasers 1016 and 1018 operating at two closely spaced but different frequencies; non-polarizing beam-splitters 1030, 1036, 1040, and 1046; retroreflectors 1032 and 1042; and mirrors 1034, 1038, 1044, and 1048. The positions of retroreflectors 1032 and 1042 are controlled by transducers 1050 and 1052, respectively, according to signals 1054 and 1056, respectively, from electronic processor and controller 80. Beams 1020 and 1022 generated by lasers 1016 and 1018, respectively, are incident on non-polarizing beam-splitters 1030 and 1040, respectively. Beams 1020 and 1022 are plane polarized in a plane oriented at 45° with respect to the plane of FIG. 1b.

A first portion of beam 1020 is transmitted by beam-splitter 1030 and reflected by mirror 1034 and beam-splitter 1036 as a first component of a reference beam 1024 and a second portion of beam 1020 is reflected by beam-splitter 1030, mirror 1038, retroreflector 1032, mirror 1044, and beam-splitter 1046 as a first component of a measurement beam 1026. A first portion of beam 1022 is transmitted by beam-splitter 1040 and beam-splitter 1036 as a second component of reference beam 1024 and a second portion of beam 1022 is reflected by beam-splitter 1040, mirror 1048, retroreflector 1042, and transmitted by beam-splitter 1046 as a second component of measurement beam 1026.

A second set of measurement and reference beams are also generated as beams 1062 and 1060, respectively, that can be used as measurement and reference input beams for an interferometer system different from the interferometer system for which beams 1026 and 1024 are input measurement and reference beams, respectively. A third portion of beam 1020 is transmitted by beam-splitter 1030, reflected by mirror 1034, and transmitted by beam-splitter 1036 as a first component of a reference beam 1060 and a fourth portion of beam 1020 is reflected by beam-splitter 1030, mirror 1038, retroreflector 1032, and mirror 1044, and transmitted by beam-splitter 1046 as a first component of a measurement beam 1062. A third portion of beam 1022 is transmitted by beam-splitter 1040 and reflected by beam-splitter 1036 as a second component of reference beam 1060 and a fourth portion of beam 1022 is reflected by beam-splitter 1040, mirror 1048, retroreflector 1042, and beam-splitter 1046 as a second component of measurement beam 1062.

Displacements $x_1$ and $x_2$ of retroreflectors 1032 and 1042, respectively, by transducers 1050 and 1052, respectively, will introduced relative a phase shift $\Delta\phi_1$ between the first measurement and first reference beam components of beams 1026 and 1024 and a relative phase shift $\Delta\phi_2$ between the second measurement and second reference beam components of beams 1026 and 1024. The relationship between displacements $x_1$ and $x_2$ and the phase shifts $\Delta\phi_1$ and $\Delta\phi_2$ are given by the following formulae:

$$\Delta\phi_1 = -2kx_1,$$

$$\Delta\phi_2 = -2kx_2. \tag{24}$$

Reference and measurement beams 1024 and 1026 each with coextensive components may be used as spatially separated components of input beam 24 or combined by a non-polarizing beam-splitter (not shown in a figure) to form input beam 24 with spatially coextensive components for certain embodiments.

The general description is continued with reference to FIG. 1a. Input beam 24 is incident on interferometer 10 wherein reference beams and measurement beams are generated. The reference beams and measurement beams comprise one or two arrays of reference beams and one or two arrays of measurement beams, respectively, for measurements using measurement beams that comprise a single polarization state or two orthogonal polarization states, respectively, wherein the arrays may comprise arrays of one element. The arrays of measurement beams are focused on and/or in measurement object 60 and arrays of return measurement beams are generated by reflection/scattering by measurement object 60. The arrays of reference beams and return measurement beams are combined by a beam-splitter to form one or two arrays of output beams using measurement beams that comprise a single polarization state or two orthogonal polarization states, respectively. The arrays of output beams are mixed with respect to state of polarization either in interferometer 10 or in detector 70. The arrays of output beams are subsequently focused to spots on pixels of a multipixel detector and detected by a quantum detection process to generate the array of electrical interference signals 72.

The conjugated quadratures of fields of return measurement beams are obtained by using a single-, double-, bi-, quad-homodyne detection method or variant thereof. The bi- and quad-homodyne detection methods are described for example in cited U.S. patent application Ser. No. 10/765,368 (ZI-47). The variants of the bi- and quad-homodyne detection methods are described for example in cited U.S. patent application Ser. No. 10/816,180 (ZI-50).

For the single-homodyne detection method, input beam 24 comprises a single frequency component and sets of four or eight measurements of the array of electrical interference signals 72 is made in non-ellipsometric or ellipsometric measurements, respectively. For each of the measurements of the array of electrical interference signals 72 in non-ellipsometric and ellipsometric measurements, known phase shifts are introduced between each reference beam component and respective return measurement beam component of output beam 34. The subsequent data processing procedure used to extract the conjugated quadratures of fields of beams reflected and/or scattered by a substrate is described for example in commonly owned U.S. Pat. No. 6,445,453 (ZI-14) entitled "Scanning Interferometric Near-Field Confocal Microscopy" by Henry A. Hill, the contents of which are incorporated herein in their entirety by reference.

The double-homodyne detection method which is applicable to non-ellipsometric measurements uses input beam 24 comprising four frequency components and four detectors to obtain measurements of electrical interference signals that are subsequently used to obtain conjugated quadratures in non-ellipsometric measurements. Each detector element of the four detector elements obtains a different one of the four electrical interference signal values with the four electrical interference signal values obtained simultaneously to compute the conjugated quadratures for a field. Each of the four electrical interference signal values contains only information relevant to one orthogonal component of the conjugated quadratures. The double-homodyne detection used herein is related to the detection methods such as described in Section IV of the article by G. M D'ariano and M G. A. Paris entitled "Lower Bounds On Phase Sensitivity In Ideal And Feasible Measurements," *Phys. Rev.* A 49, pp 3022-3036 (1994). Accordingly, the double-homodyne detection method does not make joint determinations of conjugated quadratures of fields wherein each electrical interference signal value contains information simultaneously about each of two orthogonal components of the conjugated quadratures.

In the adaptation of the double-homodyne detection method to ellipsometric measurements, input beam 24 comprises eight frequency components and eight detectors to obtain measurements of eight electrical interference signals that are subsequently used to obtain conjugated quadratures. Each detector element of the eight detector elements obtains a different one of the eight electrical interference signal values with the eight electrical interference signal values obtained simultaneously to compute the conjugated quadratures of fields of scattered/reflected orthogonally polarized fields. Each of the eight electrical interference signal values contains only information relevant to one orthogonal component of one of the two conjugated quadratures.

The bi- and quad-homodyne detection methods obtain measurements of electrical interference signals wherein each measured value of an electrical interference signal contains simultaneously information about two orthogonal components of conjugated quadratures. The two orthogonal components correspond to orthogonal components of conjugated quadratures such as described in cited U.S. patent application Ser. No. 10/765,368 (ZI-47).

The variants of the bi- and quad-homodyne detection methods obtain measurements of electrical interference signals wherein each measured value of an electrical interference signal contains simultaneously information about two orthogonal components of each of two conjugated quadratures of fields of scattered/reflected orthogonally polarized beams. The two orthogonal components of the two conjugated quadratures correspond to orthogonal components of conjugated quadratures such as described in U.S. patent application Ser. No. 10/816,180 (ZI-50).

A first embodiment is shown schematically in FIG. 1c. The first embodiment comprises a first imaging system generally indicated as numeral 100, pinhole array beam-splitter 12, detector 70, and a second imaging system generally indicated as numeral 110. The second imaging system 110 is low power microscope having a large working distance, e.g. Nikon ELWD and SLWD objectives and Olympus LWD, ULWD, and ELWD objectives.

The first imaging system 100 is shown schematically in FIG. 1d. Imaging system 100 is a catadioptric system such as described in commonly owned U.S. Pat. No. 6,552,852 B2 (ZI-38) and U.S. Pat. No. 6,727,992 (ZI-43) both of which are entitled "Catoptric and Catadioptric Imaging System" wherein both applications are to Henry A. Hill, the contents of the two cited patents herein incorporated in their entirety by reference.

The description of interferometer 100, a source 18, beam-conditioner 22, detector 70, and electronic processor and controller 80 is the same as corresponding portions of the descriptions of catoptric and catadioptric imaging systems given in U.S. patent application Ser. No. 10/866,010 (ZI-52), entitled "Apparatus and Method for High Speed Scan for Subwavelength Defects in Semiconductor Metrology" by Henry A. Hill. The contents of the application are incorporated herein in their entirety by reference. A number of different catadioptric imaging systems for far-field and near-field interferometric confocal microscopy have been described such as in cited U.S. Pat. Nos. 6,552,852 (ZI-38) and 6,727,992 (ZI-43); in commonly owned U.S. Provisional Patent Application Nos. 60/447,254 (ZI-40) entitled "Transverse Differential Interferometric Confocal Microscopy," 60/448,360 (ZI-41) entitled "Longitudinal Differential Interferometric Confocal Microscopy," 60/448,250 (ZI-42) entitled "Thin Film Metrology Using Interferometric Confocal Microscopy," 60/442,892 (ZI-45) entitled "Interferometric Confocal Microscopy Incorporating Pinhole Array Beam-Splitter," 60/459,425 (ZI-50) entitled "Apparatus and Method for Joint Measurement Of Fields Of Orthogonally Polarized Beams Scattered/Reflected By An Object In Interferometry," 60/485,255 (ZI-53) entitled "Apparatus and Method for Ellipsometric Measurements with High Spatial Resolution," 60/501,666 (ZI-54) entitled "Catoptric and Catadioptric Imaging Systems With Adaptive Catoptric Surfaces," and 60/506,715 (ZI-56) entitled "Catoptric and Catadioptric Imaging Systems Comprising Pellicle Beam-Splitters And Non-Adaptive And Adaptive Catoptric Surfaces;" and U.S. patent applications Ser. No. 10/778,371 (ZI-40) entitled "Transverse Differential Interferometric Confocal Microscopy," Ser. No. 10/782,057 (ZI-41) entitled "Longitudinal Differential Interferometric Confocal Microscopy," Ser. No. 10/782,058 (ZI-42) entitled "Method And Apparatus For Dark Field Interferometric Confocal Microscopy," Ser. No. 10/765,229 (ZI-45) entitled "Interferometric Confocal Microscopy Incorporating Pinhole Array Beam-Splitter," and Ser. No. 10/816,180 (ZI-50) entitled "Apparatus and Method for Joint Measurement Of Fields Of Orthogonally Polarized Beams Scattered/Reflected By An Object In Interferometry," Ser. No. 10/886,157 (ZI-53) entitled "Apparatus and Method for Ellipsometric Measurements with High Spatial Resolution," Ser. No. 10/938,408 (ZI-54) entitled "Catoptric and Catadioptric Imaging Systems With Adaptive Catoptric Surfaces," and Ser. No. 10/948,959 (ZI-56) entitled "Catoptric and Catadioptric Imaging Systems Comprising Pellicle Beam-Splitters And Non-Adaptive And Adaptive Catoptric Surfaces." The two patents, the eight patent applications, and the eight provisional patent applications are all by Henry A. Hill and the contents of each of are incorporated herein in their entirety by reference. Other forms of non-catoptric or non-catadioptric microscopy imaging systems may be used for interferometer 100 without departing from the spirit or scope of the present invention.

With reference to FIG. 1c, a first portion of input beam 24 is transmitted by polarizing beam-splitter 54A and reflected by mirror 54D as measurement beam 24A. A second portion of beam 24 is reflected by beam-splitter 54A as reference beam 24B after reflection by mirrors 54B and 54C. Measurement beam 24A is incident on a slit-array 114 and a portion thereof transmitted as an array of diffracted measurement beams as shown in FIG. 1f. A diagram of slit-array 114 is shown in FIG. 1g where the width of the slits is c and the pitch of the slit array is d. The array of measurement beams is incident on non-polarizing beam-splitter 116 and a portion thereof transmitted as an array of measurement beams forming the measurement beam component of beam 26A. Reference beam 24B is incident on non-polarizing beam-splitter 116 and a portion thereof reflected as the reference beam component of the beam incident on pinhole array beam-splitter 112 (see FIG. 1e). The optical elements in FIG. 1f correspond to the optical elements in FIG. 1d.

The angle of incidence of the reference beam component incident on pinhole array beam-splitter 112 is selected to meet the condition specified with respect to the general property described following Eq. (15) herein. The very general property has to do with the absence of an x dependence in the interference cross-term between the reference beam and the reflected/scattered measurement beam from a given Porro type prism element in the electrical interference values.

The direction of the slits in slit-array 114 is parallel to the direction orthogonal to FIGS. 1c and 1d and parallel to the η direction (see FIG. 5 and related discussion). The width of the slits c is selected such that the affect of diffraction on the transmitted portion of measurement beam 24A is to generate for each beam of the array of diffracted measurement beams a beam divergence in the η direction that covers the desired range in η, i.e. $\eta_1 \leq \eta \leq \eta_2$ (see discussion related to FIG. 5).

The location of slit-array 114 is the conjugate position of pinhole array 112 as generated by beam-splitter 116. Thus the slit-array 114 and pinhole array 112 are imaged in the same plane in the space of measurement object 60.

Figure 2A:
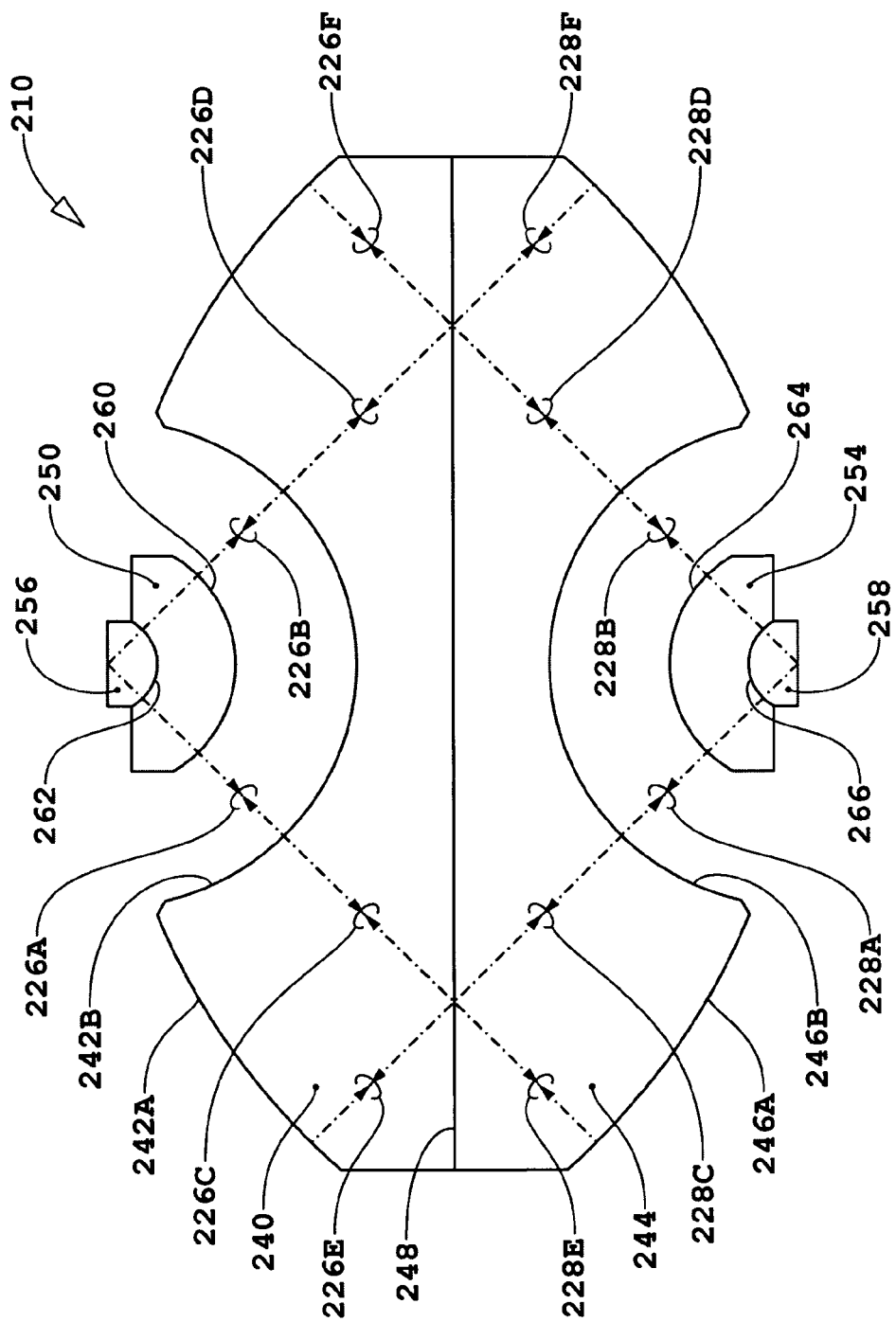
FIG. 2a is a schematic diagram of an achromatic astigmatic catadioptric imaging system.
Figure 2B:
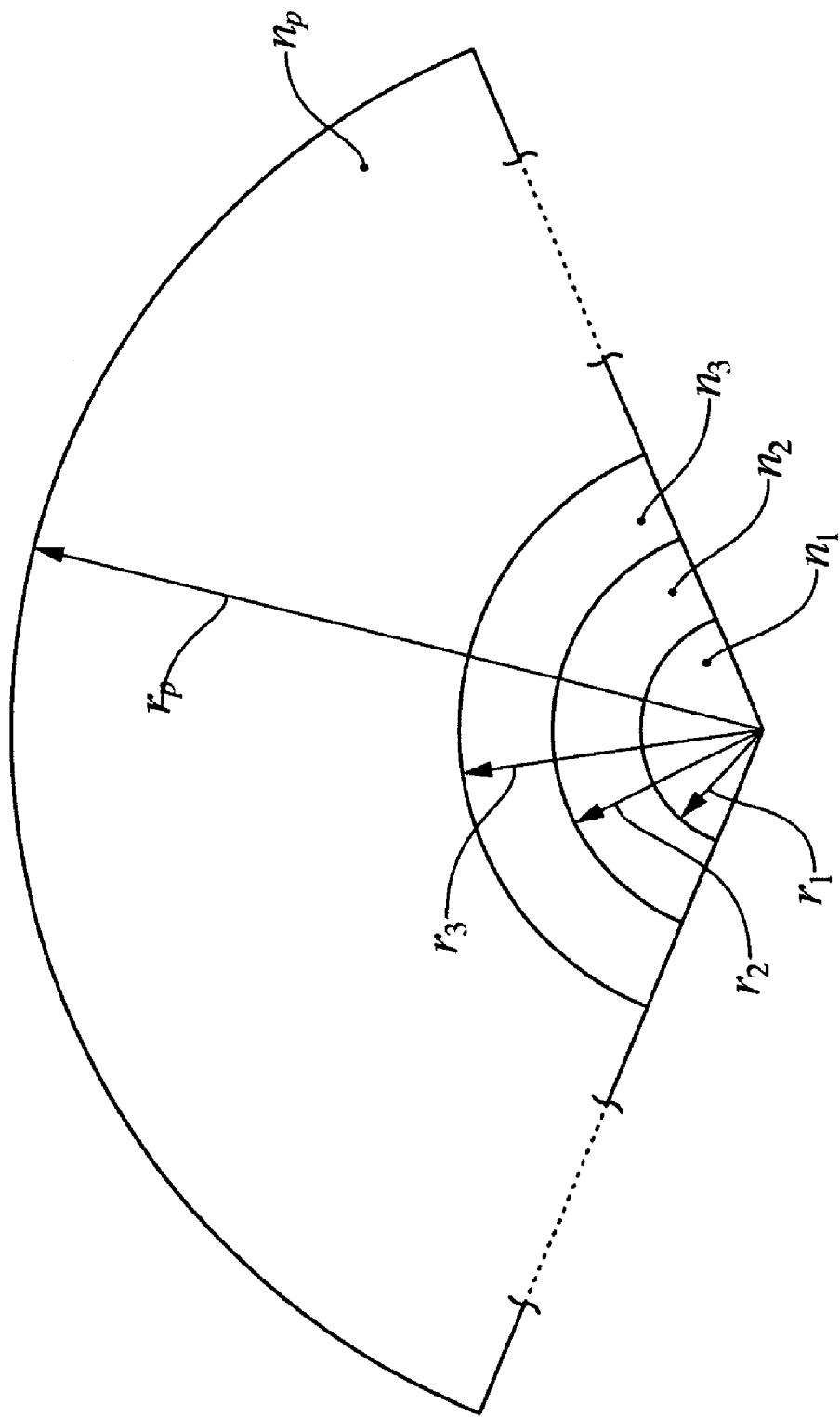
FIG. 2b is a diagram showing surfaces and corresponding radii of a catadioptric imaging system.
Figure 2C:
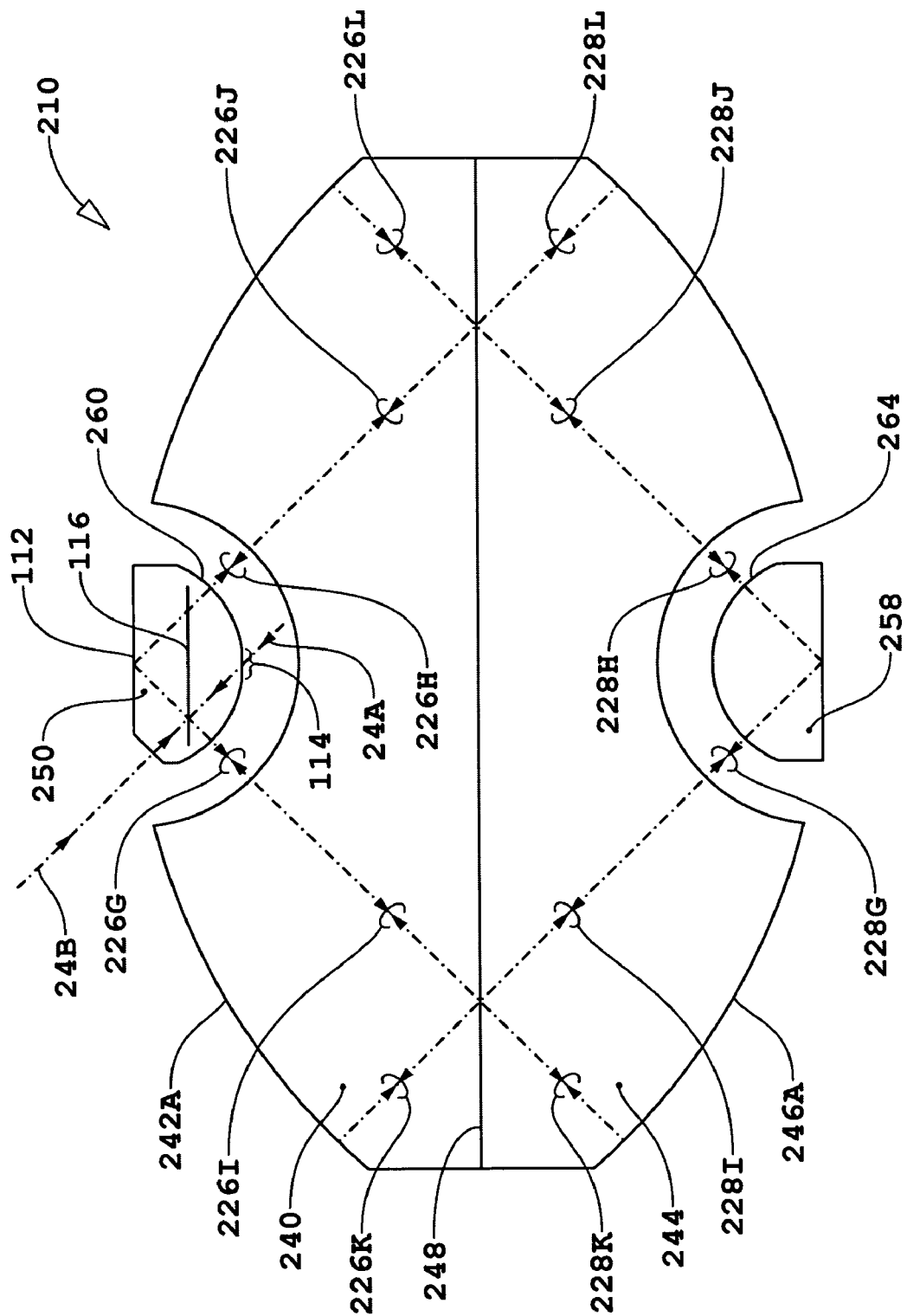
FIG. 2c is a diagram an astigmatic catadioptric imaging system and a beam-splitter system for introducing measurement and reference beams into an interferometric metrology system.

The use of slit-array 114 and non-polarizing beam-splitter 116 are also shown in FIG. 2c.

Catadioptric imaging system 100 comprises a section of catadioptric imaging system 200 shown schematically in FIG. 2a that corresponds to the section shown in FIG. 1d. Elements of catadioptric imaging system 200 shown in FIG. 2a comprise two different media in order to generate an achromatic anastigmat. Catadioptric imaging system 200 comprises catadioptric elements 240 and 244, beam-splitter 248, concentric lenses 250 and 254, and plano convex lenses 256 and 258. Surfaces 242A and 246A are convex spherical surfaces with nominally the same radii of curvature and the respective centers of curvature of surfaces 242A and 246A are conjugate points with respect to beam-splitter 248. Surfaces 242B and 246B are concave spherical surfaces with nominally the same radii of curvature. The centers of curvature of surfaces 242B and 246B are the same as the centers of curvature of surfaces 246A and 242A, respectively.

The centers of curvature of the surfaces of concentric lens 250 and plano convex lens 256 are nominally the same as the center of curvature of surfaces 242B and 246A. The centers of curvature of the surfaces of concentric lens 254 and plano convex lens 258 are nominally the same as the center of curvature of surfaces 242A and 246B. The radii of curvature of surfaces 260 and 264 are nominally the same and the radii of curvature of surfaces 262 and 266 are nominally the same. There may be a small gap between the convex surface and corresponding concave surface of lenses 256 and 250, respectively, and there may be a corresponding small gap between the convex surface and corresponding concave surface of lenses 258 and 254, respectively.

The sagittal field of catadioptric imaging system 200 is a flat field and the tangential field is also a flat field for a certain object field when the Petzval sum is zero, i.e.

$$2\sum_{j=1}^{p-1}\left(\frac{1}{n_j} - \frac{1}{n_{j+1}}\right)\frac{1}{r_j} + \frac{1}{n_p}\frac{2}{r_p} = 0 \quad (25)$$

where $r_j$ is the radius of curvature of surface j, $r_p$ is the radius of curvature of the mirror surface, and $n_j$ is the index of refraction of the media located on the beam incidence side of surface j such as shown diagrammatically in FIG. 2b'. The condition for the generation of an achromatic anastigmat at wavelength $\lambda_c$ is accordingly given by the equation $$\partial\frac{\left[2\sum_{j=1}^{p-1}\left(\frac{1}{n_j} - \frac{1}{n_{j+1}}\right)\frac{1}{r_j} + \frac{1}{n_p}\frac{2}{r_p}\right]}{\partial\lambda} = 0. \quad (26)$$

Two considerations in the selection of the radii of curvature of surfaces 242B and 246B and surfaces 162 and 166 are the area of the system pupil function of the imaging system 200 and the size of the object field that can be effectively used with respect to image quality. The first two considerations place competing demands of the selection of the radii of curvature of surfaces 242B and 246B and surfaces 162 and 166. Third and fourth considerations are with respect to the conditions set out in Eq. (25) and (26). A fifth consideration in the selection of the media of the lenses of imaging system 200 is the transmission properties of the media for the range of wavelengths to be used in an end use application.

For an example of an achromatic anastigmat design for deep UV operation, the media of elements 240, 244, 256, and 258 is selected as $CaF_2$ and the media of concentric lenses 252 and 254 is selected as a UV grade fused silica. Other parameters of the example achromatic anastigmat design such as the radii of curvature of surfaces are listed in Table 1 for $\lambda_c=250$ nm. With this choice of media, the operation range is down to 170 nm. For the achromatic anastigmat design parameters listed in Table 1, the contribution of geometric ray tracing effects is $\leq 40$ nm for an object field of 1.5 mm in diameter and a numerical aperture NA=0.970 in the object space just outside of the plane surface of plano convex lens 258.

TABLE 1

Achromatic Anastigmat Design for $\lambda_c$ = 250 nm

| Media | j | $n_j$ | $r_j$ (mm) |
| --- | --- | --- | --- |
| $CaF_2$ | 1 | 1.467297 | 3.600 |
| Fused Silica | 2 | 1.507446 | 9.256 |
| Vacuum | 3 | 1 | 18.000 |
| $CaF_2$ | 4 | 1.467297 | 50.000 |

A variant of catadioptric imaging system 200 is shown in FIG. 2c wherein catadioptric imaging system 110 is an anastigmat that is not achromatic. The media of elements 140 and 144 may comprise $CaF_2$, $BaF_2$, or $SrF_2$ for work down to 140 nm, fused silica doped with fluorine for operation to 160 nm, and UV grade fused silica for operation to 180 nm. The respective radii of curvature for anastigmat design at $\lambda=250$ nm using $CaF_2$ are listed in Table 2. For the anastigmat design listed in Table 2, the contribution of geometric ray tracing effects is $\leq 40$ nm for an object field of 1.5 mm and a numerical aperture NA=0.970 in the object space just outside of the plane surface of plano convex lens 258.

TABLE 2

Anastigmat Design for $\lambda$ = 250 nm

| Media | j | $n_j$ | $r_j$ (mm) |
| --- | --- | --- | --- |
| $CaF_2$ | 1 | 1.467297 | 7.950 |
| Air | 2 | 1 | 12.000 |
| $CaF_2$ | 3 | 1.467297 | 50.000 |

The respective radii of curvature for anastigmat design at $\lambda=250$ nm using fused silica are listed in Table 3. For the anastigmat design listed in Table 3, the contribution of geometric ray tracing effects is $\leq 40$ nm for an object field of 1.5 mm and a numerical aperture NA=0.970 in the object space just outside of the plane surface of plano convex lens 258.

TABLE 3

Anastigmat Design for $\lambda$ = 250 nm

| Media | j | $n_j$ | $r_j$ (mm) |
| --- | --- | --- | --- |
| Fused Silica | 1 | 1.467297 | 7.950 |
| Air | 2 | 1 | 12.000 |
| Fused Silica | 3 | 1.467297 | 50.000 |

Intrinsic birefringence of $SrF_2$ is less than the intrinsic birefringence of $CaF_2$ and $BaF_2$ at 140 nm. However, the intrinsic birefringence of any one of the three crystalline materials can be accommodated in the catadioptric imaging system 100 since only an azimuthal section of the lens elements are used and that section can be selected to significantly reduce the effects of intrinsic birefringence, e.g. with the [111] axis of the crystal aligned parallel to the optic axis of catadioptric imaging system 100 and the [110] axis of the crystal aligned parallel to the plane of FIG. 2a.

Also shown in FIG. 2c are measurement beam 24A and reference beam 24B, slit-array 114, and beam-splitter 116. The description of the generation of measurement beam 24A and reference beam 24B and the description of slit-array 114 and beam-splitter 116 are the same as the description given for the same element numbers shown in FIG. 1f.

Another form of catadioptric imaging system that may be used for catadioptric and catoptric imaging system 100 is the catadioptric imaging system such as described in cited U.S. patent application Ser. No. 10/816,172 (ZI-51).

Figure 2D:
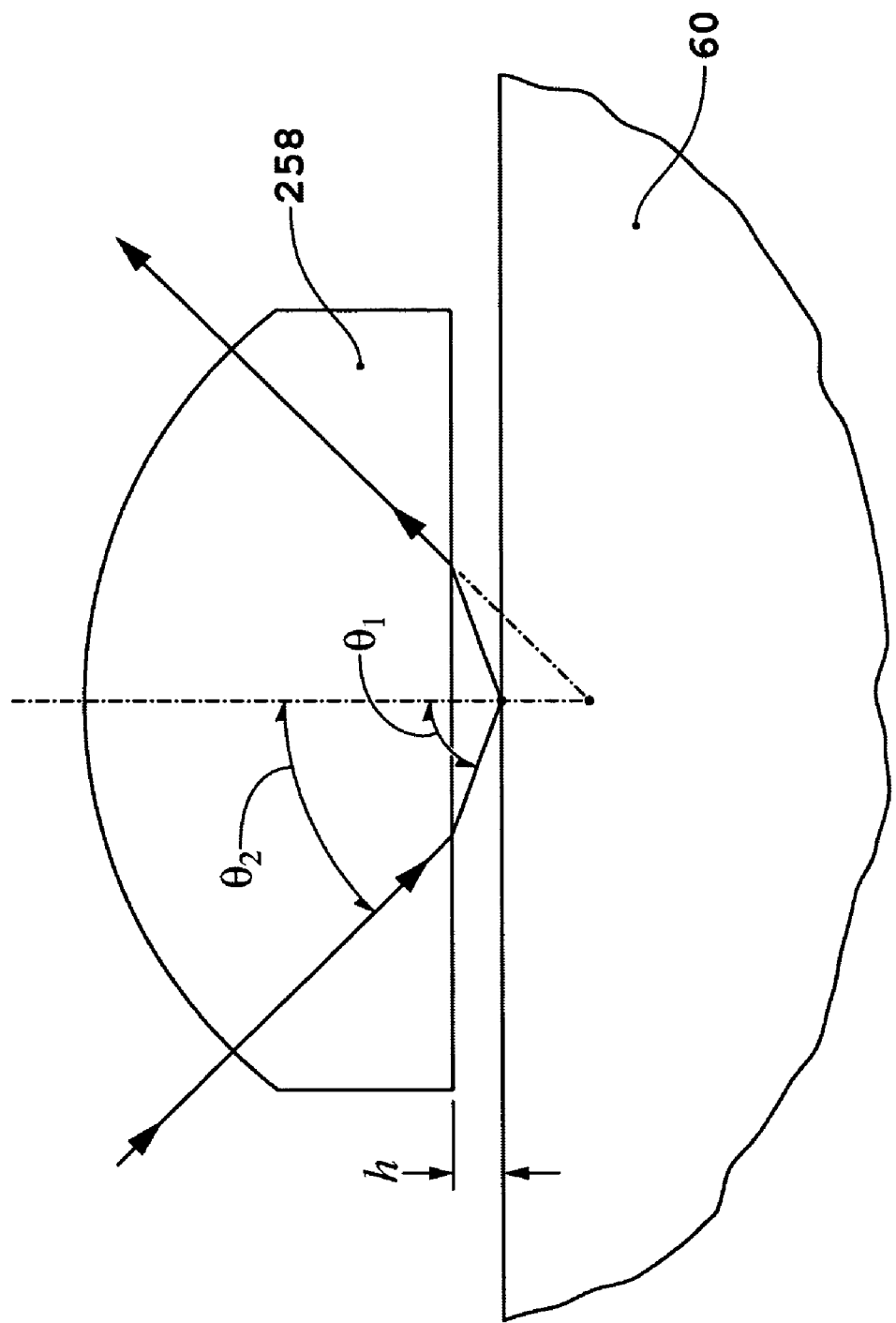
FIG. 2d is a schematic diagram of a section of a catadioptric imaging system located near a measurement object.
Figure 2E:
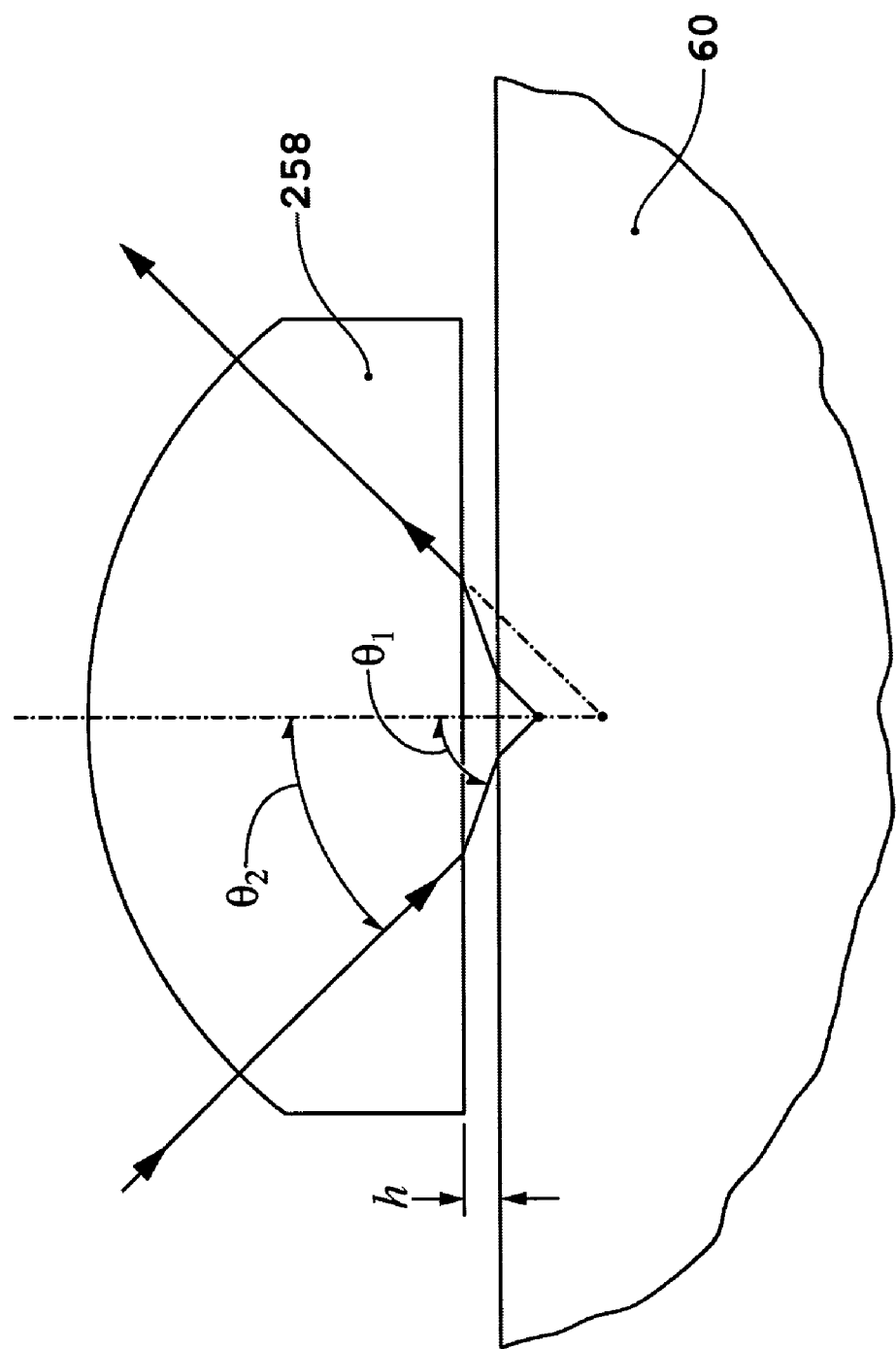
FIG. 2e is a schematic diagram of a section of a catadioptric imaging system located near a measurement object and imaging an interior section of the measurement object.

Another form of catadioptric imaging system that may be used for catadioptric and catoptric imaging system 100 is the catadioptric imaging system such as described in cited U.S. patent application Ser. No. 10/866,010 (ZI-52). The location of the object plane of catadioptric imaging system 200 is outside of piano convex lens 258 and on the surface of substrate 60 which is shown diagrammatically in FIG. 2d. The separation of the plane surface of piano convex lens 258 and the surface of substrate 60 is h. The object plane of catadioptric imaging system 200 may also be located in the interior of substrate 60 which is shown diagrammatically in FIG. 2e. Also the space between plano-convex lens 258 and the surface of substrate 60 may be filled with a coupling fluid to increase the numerical aperture of the measurement beam at substrate 60 and achieve the benefits of emersion coupling. The coupling fluid may be an index matching fluid to reduce aberrations generated by index of refraction mismatch at the plane surface of plano-convex lens 258.

An advantage of the catadioptric imaging system 210 is that as a consequence of the spherical aberration introduced by transmission through plane surfaces, the effective angle of incidence $\theta_1$ (see FIG. 2d) can be scanned by introducing a scan in h.

For those end use applications where compensation is required for the spherical aberration introduced by transmission through plane surfaces, procedures may be use such as described in cited U.S. patent application Ser. No. 10/771,785 (ZI-44).

The description of imaging system 100 is continued with reference to FIG. 1d. Lens sections 40 and 44 are pie sections of lens 240 and 244 shown in FIG. 2a. Lens elements 250, 256, 254, and 258 in FIG. 1d are the same elements lens elements 250, 256, 254, and 258 in FIG. 2a. Convex lens 52 has a center of curvature the same as the center of curvature of convex lens 250. Convex lenses 250 and 52 are bonded together with pinhole beam-splitter 12 in between. The position of pinhole array beam-splitter 12 is shown in FIG. 1d. The pattern of pinholes in pinhole array beam-splitter is chosen so that the image of pinhole beam-splitter 12 on detector 70 to match the pixel pattern of detector 70. An example of a pattern is a two dimensional array of equally spaced pinholes in two orthogonal directions. The pinholes may comprise circular apertures, rectangular apertures, or combinations thereof such as described in commonly owned U.S. patent application Ser. No. 09/917,402 (ZI-15) entitled "Multiple-Source Arrays for Confocal and Near-field Microscopy" by Henry A. Hill and Kyle Ferrio of which the contents thereof are incorporated herein in their entirety by reference. The pinholes may also comprise microgratings such as described in cited U.S. Provisional Patent Application No. 60/459,425. A non-limiting example of a pinhole array for pinhole array beam-splitter 12 is shown in FIG. 1e having a spacing between pinholes of b with aperture size a.

Two different modes are described for the acquisition of the electrical interference signals 72 of the first embodiment. The first mode to be described is a step and stare mode wherein substrate 60 is stepped between fixed locations corresponding to locations where image information is desired. The second mode is a scanning mode. In the step and stare mode for generating a one-dimensional, a two-dimensional or a three-dimensional profile of substrate 60, substrate 60 mounted in wafer chuck 84 is translated by stage 90 (see FIG. 1c). The position of stage 90 is controlled by transducer 82 according to servo control signal 78 from electronic processor and controller 80. The horizontal position of stage 90 is measured by metrology system 88 and position information acquired by metrology system 88 is transmitted to electronic processor and controller 80 to generate an error signal for use in the position control of stage 90. Metrology system 88 may comprise for example linear displacement and angular displacement interferometers and cap gauges.

Electronic processor and controller 80 translates wafer stage 90 to a desired position and then acquires a set of electrical interference signal values. After the acquisition of the set of electrical interference signals, electronic processor and controller 80 repeats the procedure for the next desired position of stage 90. The elevation and angular orientation of substrate 60 is controlled by transducers 86A and 86B. The vertical position of stage 90 is measured by a vertical metrology system (not shown) and vertical position information acquired by the vertical metrology system is transmitted to electronic processor and controller 80 to generate an error signal for use in the vertical position control of stage 90. The vertical metrology system may comprise for example linear displacement and angular displacement interferometers and cap gauges.

The second mode for the acquisition of the electrical interference signal values is next described wherein the electrical interference signal values are obtained with the position of stage 90 scanned in one or more directions. In the scanning mode, source 18 is pulsed at times controlled by signal 92 from signal processor and controller 80. Source 18 is pulsed at times corresponding to the registration of the conjugate image of pinholes of pinhole array beam-splitter 12 with positions on and/or in substrate 60 for which image information is desired.

The statistical and systematic errors obtained in the first embodiment are further reduced as a consequence of the design of imaging system 100 and of pinhole array 12 and slit array 114 to permit the simultaneous acquisition of information using oblique measurement beams.

The detected changes in the vertical position and angular orientation of substrate 60 by the vertical metrology system are used to correct the measured arrays of conjugated quadratures obtained for the oblique and complimentary oblique measurement beams for changes in the vertical position and angular orientation of the measurement object that occur during the scanning of the measurement object. The changes in vertical position may be introduced so as to image spots on substrate 60 that are on different surface layers, e.g. measuring properties of features to determine overlay error, and/or the result of errors introduced in the translation of stage 90 and wafer chuck 84.

Additional information about defects and height profile of a surface of substrate 60 is obtained in the first embodiment as required by the use of another interferometer system designed to make interferometric measurements with non-oblique measurement beams such as described herein in the third embodiment of the present invention and in cited U.S. patent application Ser. No. 10/778,371 (ZI-40); Ser. No. 10/782,057 (ZI-41); and Ser. No. 10/782,058 (ZI-42). The measured height profile of the surface or height of a feature is used in conjunction with the arrays of measured conjugated quadratures obtained for the oblique and complimentary oblique measurement beams to obtain information about the location of features on the surface of the measurement object in a plane parallel to the surface of the measurement object.

A second embodiment of the present invention is described for the joint measurement of the conjugated quadratures of fields of complimentary oblique measurement beams reflected/scattered by Porro type prism elements of features and other features of a measurement object. The complimentary oblique measurement beams correspond to two measurement beams that have angles or average angles of incidence that are equal in magnitude but opposite in sign. The information obtained for each of the two measurement beams is the same as the information obtained respectively by using the first embodiment of the present invention with the measurement object in a non-rotated and in a rotated orientation. The rotation axis for changing the orientation of the measurement object is parallel to the optic axis of the interferometric metrology system shown in FIG. 1c. The difference between the second embodiment and the use of the first embodiment with the measurement object in a non-rotated and in a rotated orientation is that the information obtained for the two different orientations of the measurement object is obtained sequentially in the latter case and is obtained jointly in the case of the second embodiment. The difference may also be stated in terms of values of $\theta_I$ and $\theta_D$ for the two different measured quantities.

The second embodiment comprises the apparatus of embodiments described in cited U.S. patent application Ser. No. 10/816,172 (ZI-51) with certain modifications. The certain modifications have to do with the introduction of the measurement and reference beams to the interferometry metrology system of the second embodiment and the use of a phase-shifter 46C shown in FIG. 1e of cited U.S. patent application Ser. No. 10/816,172 (ZI-51). The description of the use of phase-shifter 46C to separate the forward and backscattered components of measurement beams is the same as the corresponding portions of descriptions given in cited U.S. patent application Ser. No. 10/816,172 (ZI-51).

The modification of the introduction of the measurement beam corresponds to the introduction of two complimentary oblique measurement beams comprising two measurement beams that have angles or average angles of incidence that are equal in magnitude but opposite in sign at slit-array 114 shown in FIGS. 1f and 2c and overlap at slit-array 114. The modification of the introduction of the reference beam corresponds to the introduction of two complimentary oblique reference beams comprising two reference beams that have angles or average angles of incidence that are equal in magnitude but opposite in sign at beam-splitter 116 shown in FIGS. 1f and 2c and overlap at pinhole array beam-splitter 12.

The remaining description of the second embodiment is the same as corresponding portions of the description given for the first embodiment herein.

A variant of the second embodiment obtains the information of the second embodiment in a non-joint manner. The variant of the second embodiment comprises the apparatus of the second embodiment with a set of shutters without phase-shifter 46C. The set of shutters are configured to shutter the input measurement and reference beams and the forward scattered measurement beams. The variant of the second embodiment corresponds to using the first embodiment of the present invention with the measurement object in a non-rotated and in a rotated orientation.

A third embodiment of the present invention is described for the measurement of the conjugated quadratures of fields of complimentary oblique measurement beams reflected/scattered by Porro type prism elements of measurement object features and/or of non-oblique measurement beams that are reflected/scattered by the measurement object. The third embodiment obtains information about the measurement object using one or more of two complimentary oblique measurement beams and non-oblique measurement beams with a single interferometric metrology system. The complimentary oblique measurement beams correspond to two measurement beams that have angles or average angles of incidence that are equal in magnitude but opposite in sign. The non-oblique measurement beams have a nominally zero angle of incidence at the measurement object and may comprise for example two complimentary oblique measurement beams simultaneously. The corresponding measured conjugated quadratures comprise conjugated quadratures of measured fields of the forward reflected/scattered and backscattered non-oblique measurement beam by the measurement object.

The information obtained for each of the two complimentary oblique measurement beams is the same as the information obtained respectively by using the first embodiment of the present invention with the measurement object in non-rotated and in a rotated orientations. The information obtained with the non-oblique measurement beam exhibits sensitivity to lateral shifts of the measurement object that is different from the sensitivity of the information obtained with either of the two complimentary oblique measurement beams to lateral shifts of the measurement object. The information obtained with the non-oblique measurement beams is used for example for defect detection and surface profiling and may be the same as obtained from differential or non-differential interferometric microscopy systems such as described in cited U.S. Provisional Patent Application Nos. 60/447,254 (ZI-40), Ser. No. 60/448,360 (ZI-41), Ser. No. 60/448,250 (ZI-42), Ser. No. 60/459,425 (ZI-50), and Ser. No. 60/460,129 (ZI-51); in cited U.S. patent application Ser. Nos. 10/778,371 (ZI-40), Ser. No. 10/782,057 (ZI-41), Ser. No. 10/782,058 (ZI-42), Ser. No. 10/816,180 (ZI-50), and 10/816,172 (ZI-51); and in commonly owned U.S. Provisional Patent Application No. 60/507,675 (ZI-55) and U.S. patent application Ser. No. 10/954,625 (ZI-55) depending upon the specific imaging system used for 10 of FIG. 1a. U.S. Provisional Patent Application No. 60/507,675 (ZI-55) and U.S. patent application Ser. No. 10/954,625 (ZI-55) are both entitled "Method And Apparatus For Enhanced Resolution of High Spatial Frequency Components of Images using Standing Wave Beams in Non-Interferometric and Interferometric Microscopy," both are by Henry A. Hill, and the contents of both are here within incorporated in their entirety by reference.

The third embodiment comprises the same apparatus of certain of the embodiments described in cited U.S. patent application Ser. No. 10/816,172 (ZI-51) with certain other modifications such as shown schematically in FIGS. 1k and 1l. The certain other modifications are with respect to the introduction of the reference and measurement beams to the interferometric metrology system of the third embodiment and with respect to spatial filtering of the reference beam, the complimentary oblique and the non-oblique measurement beams, and the fields of the two complimentary oblique measurement beams and the non-oblique measurement beam forward reflected/scattered and/or backscattered by the measurement object. The spatial filtering determines which type of information is being detected by a given pixel of detector 70, e.g. information corresponding to a non-oblique measurement beam, to an oblique measurement beam with a given non-zero angle of incidence on the measurement object, or an complimentary oblique measurement beam with a complimentary non-zero angle of incidence at the measurement object.

The interferometer system of the third embodiment is the same as the interferometer system of the first embodiment of the present invention shown in FIG. 1c except with respect to the first imaging system 100 and to the certain other modifications for the introduction of the reference and measurement beams and the spatial filtering. First imaging system 100 for the third embodiment comprises a catadioptric imaging system such as shown as imaging system 200 in FIG. 1k and also such as corresponding catadioptric imaging systems described in cited U.S. patent application Ser. No. 10/816,172 (ZI-51).

The description of the imaging properties of catadioptric imaging system 200 is broken into two different descriptions with one description of the system functioning as imaging system 100 of the first embodiment for complimentary oblique measurement beams and with a second description of the system functioning as an imaging system for non-oblique reference and measurement beams. The properties of spatial filters or masks 112B and 114B (see FIG. 1l) determine which of the two descriptions is applicable for a given pinhole of pinhole array beam-splitter 112A. Pinhole array beam-splitter 112A functions as a beam-splitter for combining reference and measurement beams of an interferometer and the description of this function is the same as the corresponding portion of the description given for the imaging properties of catadioptric imaging system 10 in cited U.S. patent application Ser. No. 10/765,229 (ZI-45).

Figure 1K:
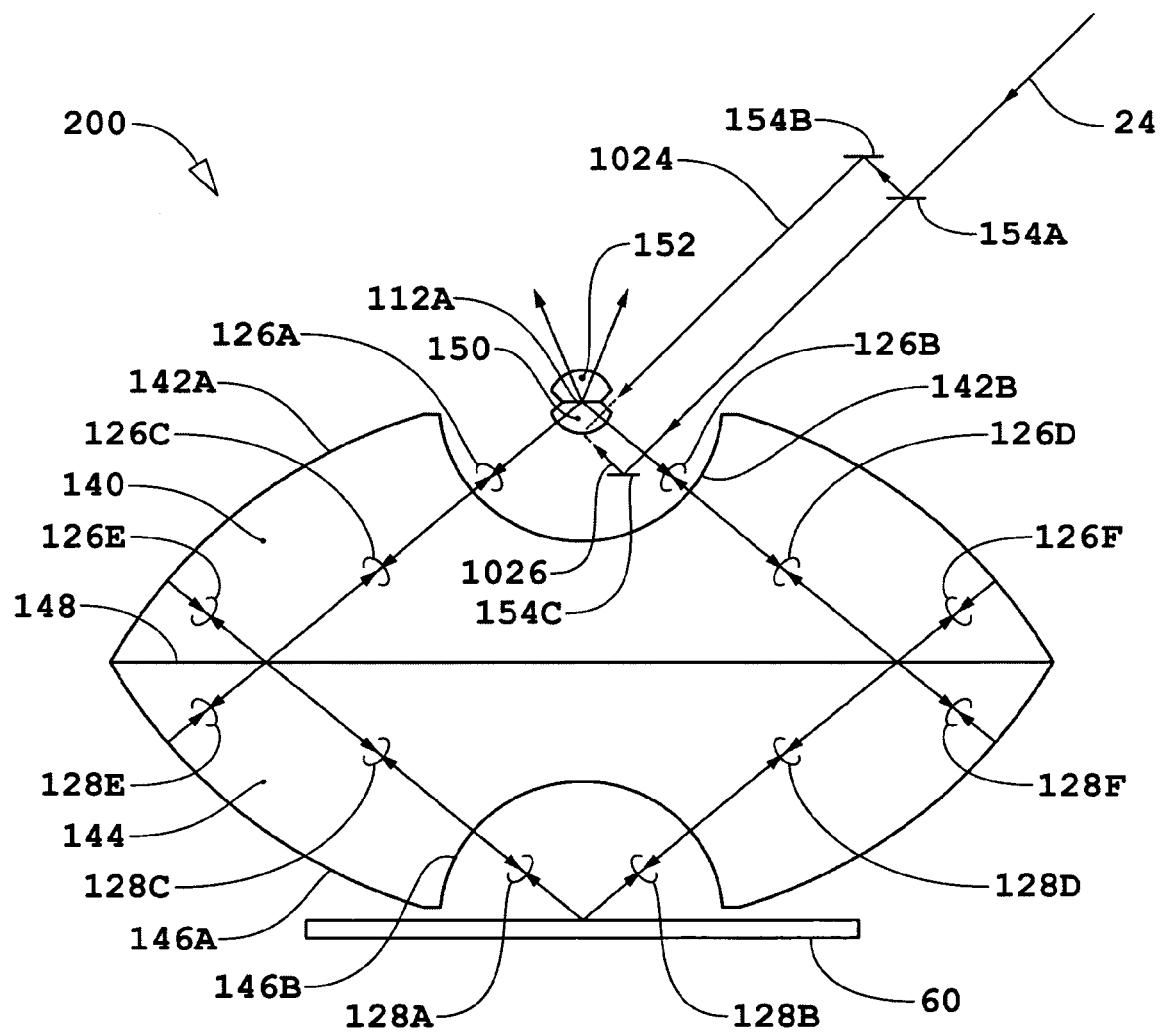
FIG. 1k is a schematic diagram of a catadioptric imaging system.

Input beam 24 comprises spatially separated reference and measurement beams 1024 and 1026, respectively, (see FIG. 1b) with the same directions of propagation. Reference beam 1024 is redirected relative to the direction of propagation of measurement beam 1026 by mirror 154A as shown in FIG. 1k. Reference and measurement beams 1024 and 1026 are incident on imaging system 200 wherein reference beam components of output beam 30A and 30B are generated and a measurement beam components of beams 126A and 126B are generated. The measurement beam components 126A and 126B are imaged as components of beams 128A and 128B to an array of image spots in an image plane close to or on substrate 60. A portion of the components of beams 128A and 128B incident on substrate 60 are reflected and/or scattered as return measurement beam components of beams 128A and 128B. Return measurement beam components of beams 128A and 128B are imaged by catadioptric imaging system 200 in the plane of pinhole array beam-splitter 112A and a portion thereof is transmitted as return measurement beam components of output beams 30A and 30B.

The certain other modifications for the introduction of the measurement beam corresponds to the introduction of two complimentary oblique measurement beams comprising two measurement beams that have angles or average angles of incidence that are equal in magnitude but opposite in sign at slit-array 114A shown in FIG. 1*l* and which overlap at slit-array 114A. The modification for the introduction of the reference beam corresponds to the introduction of two complimentary reference beams comprising two reference beams that have angles or average angles of incidence that are equal in magnitude but opposite in sign at beam-splitter 116 shown in FIG. 1*l* and overlap at pinhole array beam-splitter 112A.

With reference to FIG. 1*l*, first and second portions of measurement beam component 1026 of input beam 24 are reflected and transmitted, respectively, by non-polarizing beam-splitter 154D as measurement beams 1026A and 1026B, respectively, wherein measurement beams 1026A and 1026B have been reflected by mirrors 154F and 154H, respectively. Measurement beams 1026A and 1026B are incident on slit-array 114A with angles of incidence that have the same magnitude and opposite signs. A portion of measurement beams 1026A and 1026B incident on slit-array 114A is transmitted as an array of diffracted measurement beams.

Figure 1M:
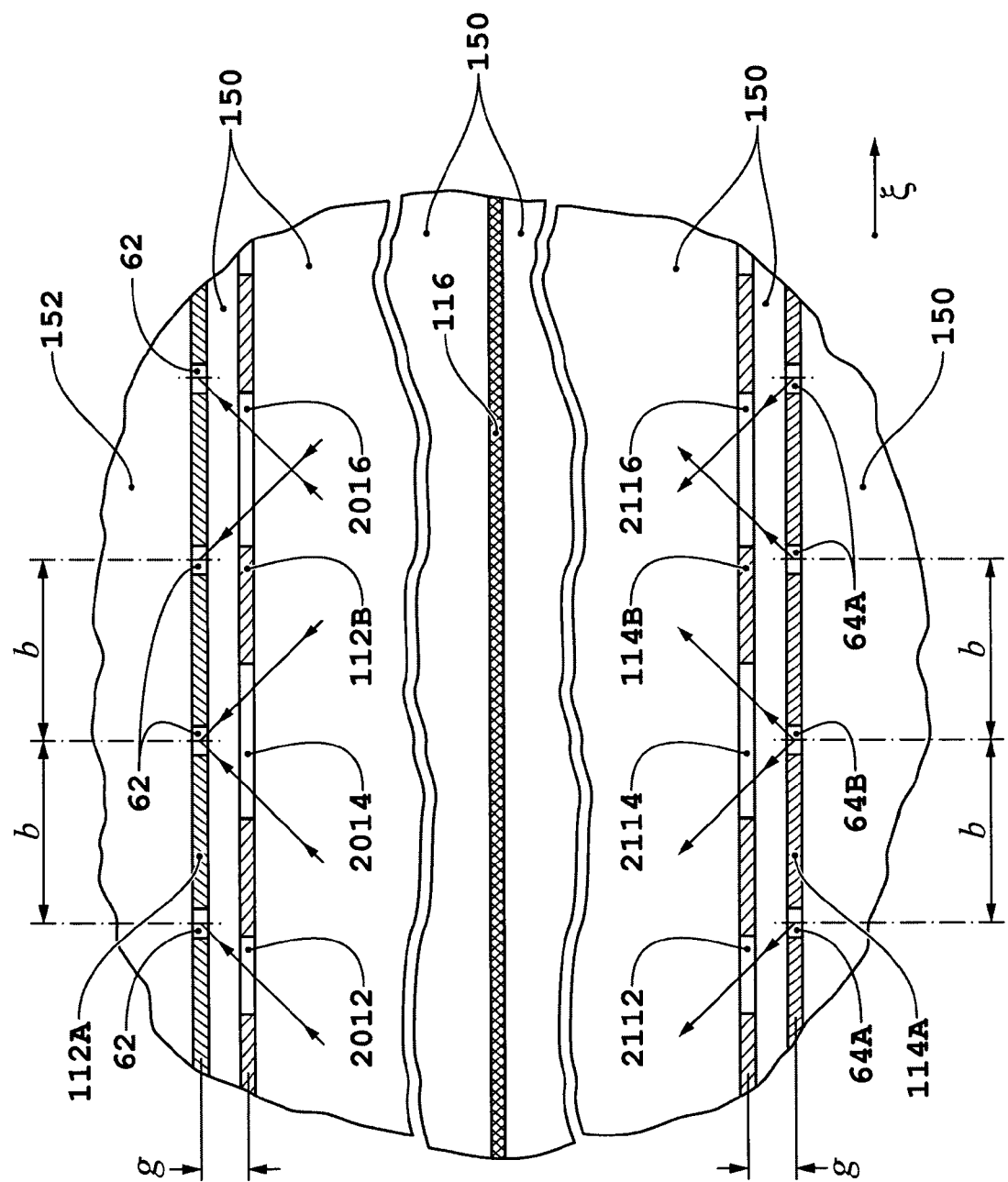
FIG. 1m is a schematic diagram of arrays of pinholes, slits, and apertures used in the introduction of reference and measurement beams to an interferometric imaging system and for the selection of the mode of operation of the interferometric imaging system for a particular spot of a measurement object being imaged.
Figure 1N:
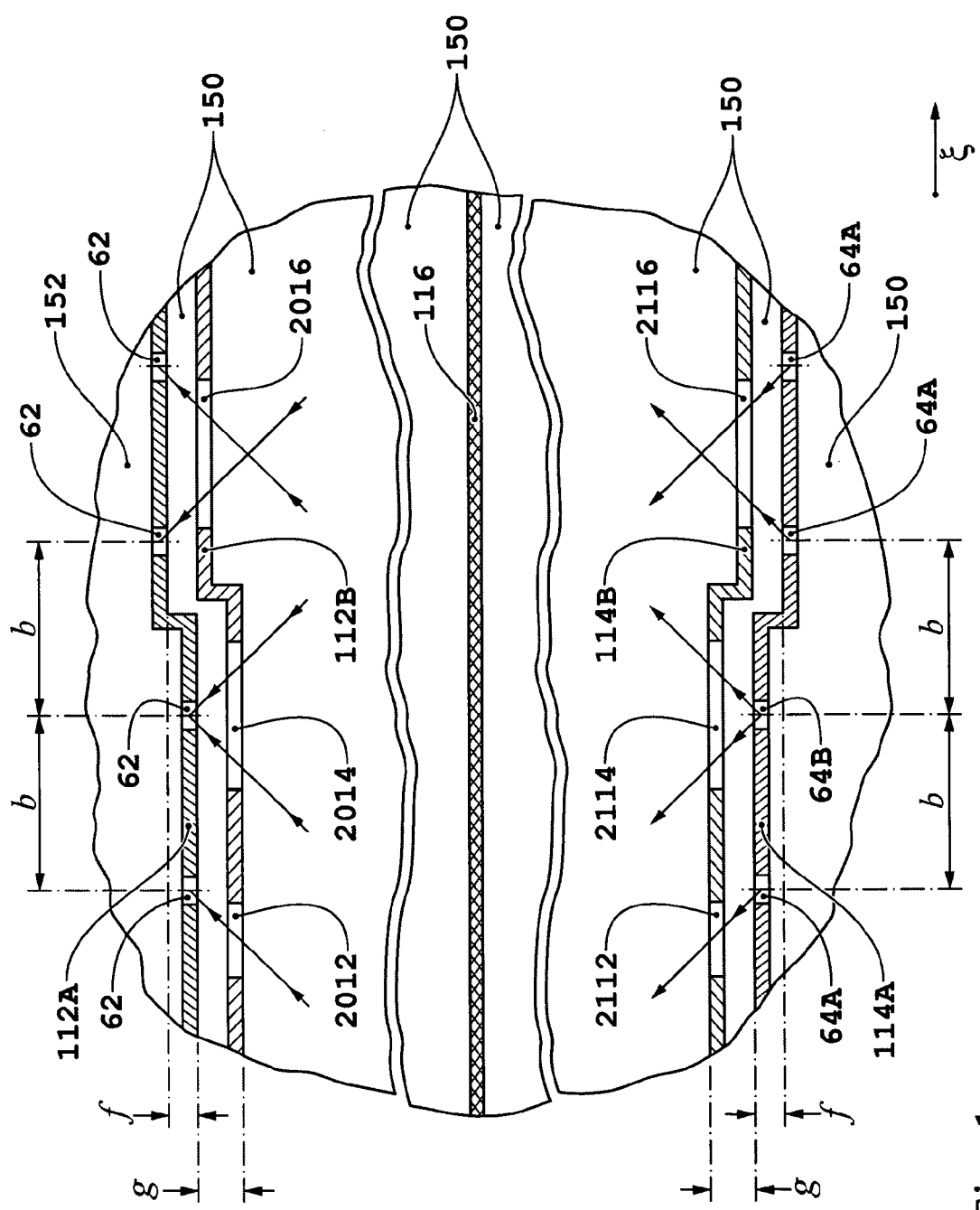
FIG. 1n is a schematic diagram of arrays of pinholes, slits, and apertures used in the introduction of reference and measurement beams to an interferometric imaging system and for the selection of the mode of operation of the interferometric imaging system for a particular spot of a measurement object being imaged.
Figure 1O:
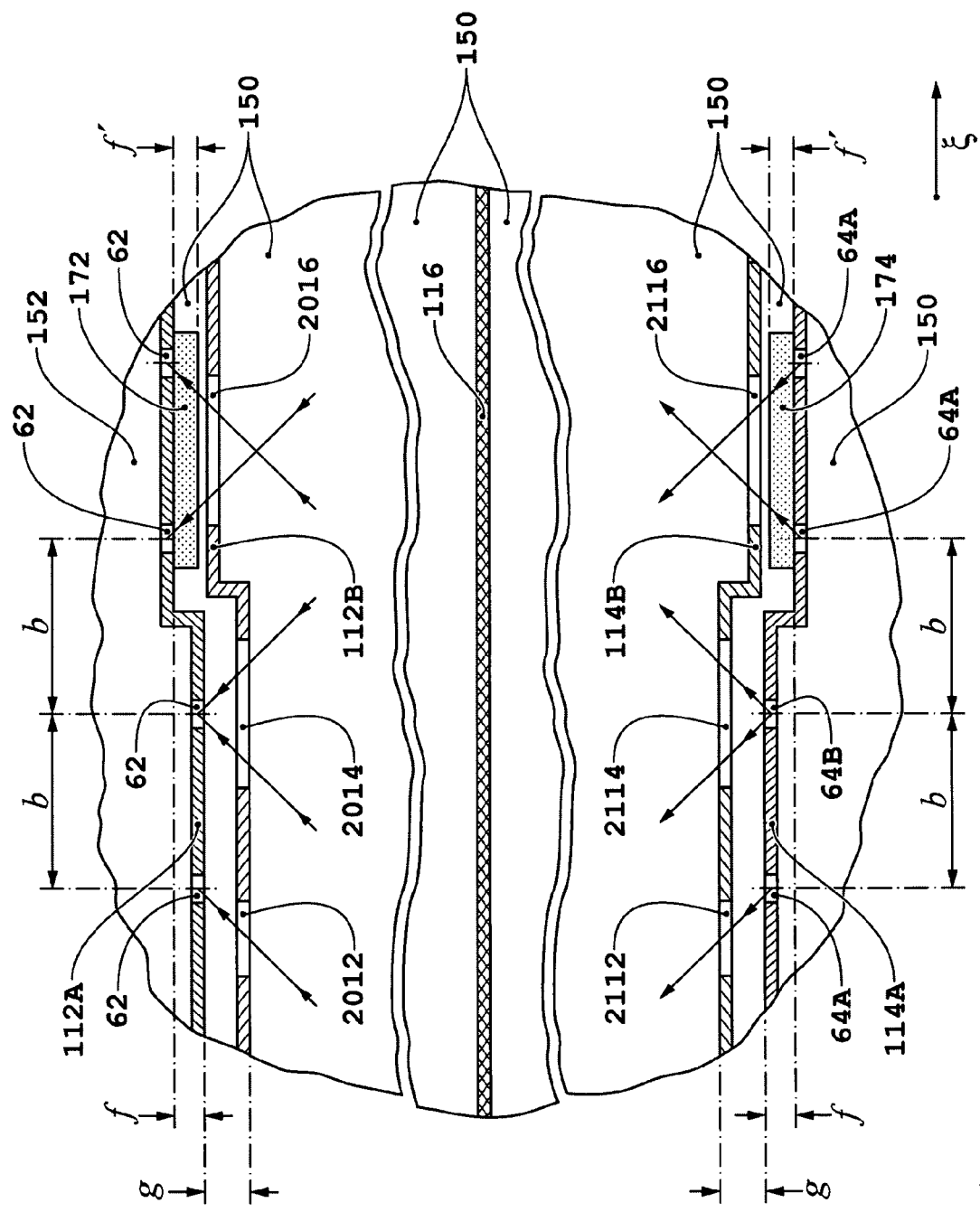
FIG. 1o is a schematic diagram of arrays of pinholes, slits, and apertures used in the introduction of reference and measurement beams to an interferometric imaging system and for the selection of the mode of operation of the interferometric imaging system for a particular spot of a measurement object being imaged.

Pinhole array 112A may comprise an array of pinholes that are formed on a single surface such as that shown for pinhole array 12 in FIGS. 1*e* and 1*m* or on two or more surfaces such as shown diagrammatically in FIGS. 1*n* and 1*o*. The system of arrays of pinholes, slits, and apertures shown in FIG. 1*m* is a special case of the system of arrays of pinholes, slits, and apertures shown in FIG. 1*n* where displacement f shown in FIG. 1*n* is set to zero, i.e. f=0. FIGS. 1*n* and 1*o* are schematic diagrams of arrays of pinholes, slits, and apertures used in the introduction of reference and measurement beams to an interferometric imaging system and for the selection of the mode of operation of the interferometric imaging system for a particular spot of a measurement object or substrate being imaged.

The system of arrays of pinholes, slits, and apertures shown in FIGS. 1*n* and 1*o* are used when imaging portions of two surfaces of a substrate that are spatially separated in the z direction by a medium of refractive index equal to 1 and different from 1, respectively. An example of an application of the arrays of pinholes, slits, and apertures shown in FIG. 1*o* is the measurement of overlay error wherein the patterns 726 (see FIG. 1*i*) are located in the interior of the substrate. When using the system of arrays of pinholes, slits, and apertures shown in FIGS. 1*m*, changes in vertical position of substrate 60 may be introduced so as to image spots on substrate 60 that are on different surface layers, e.g. measuring properties of features to determine overlay error. The changes in vertical position are introduced and controlled by the vertical metrology system and transducers 86A and 86B described in the description of the first embodiment of the present invention.

In FIG. 1*n*, an example of pinhole array 112A is shown as comprising pinholes on two separate planes separated by a spacing f. The pinhole array 112A shown in FIG. 1*n* is used when measurements are made of properties of two surfaces of the measurement object such as encountered when making measurements of overlay between patterns on two different surfaces of a wafer or mask and spacing f is the conjugate displacement of the two different surfaces.

Slit-array 114A comprises slits 64A which are at conjugate locations with reference to beam-splitter 116 of pinholes 62 of pinhole array 112A. The apertures of mask 114B are at corresponding locations to pinholes of pinhole array 112A that are at conjugate locations with reference to beam-splitter 116 of apertures of mask 112B as shown schematically in FIGS. 1*l* and 1*n*. The spacing between mask 112B and pin-hole array 112A and the spacing between mask 114B and slit-array 114A is in each case g as shown in FIG. 1*m*. The apertures 2012 and 2016 of mask 112B, slits 64A of slit-array 114A, and apertures 2112 and 2116 of mask 114B are used to generate the two complimentary oblique reference and measurement beams and the apertures 64B of slit-array 114A and apertures 2014 and 2114 of the masks 112B and 114B, respectively, are used to generate the non-oblique reference and measurement beams. The function of generation of the two complimentary oblique reference and measurement beams and generation of the non-oblique reference and measurement beams can be achieved for example with g=b/4 such as shown schematically in FIG. 1*n*.

The description of slits of slit-array 114A is the same as the corresponding portion of the description given for slits of slit-array 114 of the first embodiment of the present invention. Spatial filters or masks 112B and 114B comprise masks that have sections which transmit beams and sections that do not transmit beams as shown schematically in FIG. 1*n* and are used to define in part the pupil functions of imaging system 200 for respective pinholes of pinhole array beam-splitter 112A. In particular, apertures 2014 and 2114 permit beams to pass from a respective pinhole or slit that are associated with both positive and negative values of pupil coordinate ξ while apertures 2012, 2112, 2016, and 2116 permit beams to pass from a respective pinhole or slit that are associated with either a positive and a negative value of pupil coordinate ξ but not both.

The description of the system of arrays of pinholes, slits, and apertures shown in FIG. 1*o* is the same as the description of system of arrays of pinholes, slits, and apertures shown in FIG. 1*n* except with respect to element 172 located in between pinhole array 112A and mask 112B and element 174 located between slit array 114A and mask 114B. Elements 172 and 174 are used to compensate for the effects of index mismatch at substrate 60 when imaging portions of two surfaces of the substrate that are spatially separated in the z direction by a medium of refractive index different from 1. The indices of refraction and thicknesses f and f' are selected to compensate for the effects of the index mismatch, such as described in cited U.S. patent application Ser. No. 10/771,785 (ZI-44).

Continuing with reference to FIG. 1*l*, first and second portions of the reference beam component 1024 of input beam 24 are transmitted and reflected, respectively, by non-polarizing beam-splitter 154E as reference beams 1024A and 1024B wherein reference beams 1024A and 1024B have been reflected by mirrors 154I and 154G, respectively. Reference beams 1024A and 1024B are incident on non-polarizing beam-splitter 116 with angles of incidence that have the same magnitude and of opposite signs.

The angles of incidence of the reference beam components incident on pinhole array beam-splitter 112A are selected to meet the condition specified with respect to the general property described following Eq. (15) herein. The general property has to do with the absence of a x or lateral dependence in the interference cross-term between the reference beam and the reflected/scattered complimentary oblique measurement beams from a given Porro type prism element in the electrical interference signal values.

The first description of the propagation of two complimentary oblique measurement beams through imaging system 200 that are portions of the diffracted measurement beams transmitted by slits of mask 114B and reflected by non-polarizing beam-splitter 116 and the description of the reflected/scattered measured beams through imaging system 200 and transmitted by non-polarizing beam-splitter 116 and apertures of conjugate mask 112B is the same as the corresponding portions of the descriptions given with respect to the first embodiment of the present invention for the propagation of the measurement beams and the reflected/scattered measurement beams through imaging system 100.

Continuing with the second description of the imaging properties of imaging system 200, reference is made to FIG. 1k. Catadioptric imaging system 200 comprises catadioptric elements 140 and 144, beam splitter 148, and convex lens 150. Surfaces 142A and 146A are convex spherical surfaces with nominally the same radii of curvature and the respective centers of curvature of surfaces 142A and 146A are conjugate points with respect to beam splitter 148. Surfaces 142B and 146B are concave spherical surfaces with nominally the same radii of curvature. The centers of curvature of surfaces 142B and 146B are the same as the centers of curvature of surfaces 146A and 142A, respectively. The center of curvature of convex lens 150 is the same as the center of curvature of surfaces 142B and 146A.

The radius of curvature of surface 146B is selected so as to minimize the loss in efficiency of the imaging system 200 and to produce a working distance for imaging system 200 acceptable for an end use application. The radius of curvature of surface 160 of convex lens 150 is selected so that the off-axis aberrations of the catadioptric imaging system 200 are compensated. The description of the selection procedure is the same as corresponding portions of the description given herein with respect to imaging systems shown in FIGS. 1d and 2a. The medium of elements 140 and 144 may be for example fused silica or commercially available glass such as SF11. The medium of convex lens 150 may be for example fused silica, YAG, or commercially available glass such as SF11. An important consideration in the selection of the medium of elements 140 and 144 and convex lens 150 will the transmission properties for the frequencies of beam 24. Examples of solutions are given in U.S. patent application Ser. No. 10/866,010 (ZI-52) (see Tables 2 and 3 and related discussion with respect to FIG. 2f of application Ser. No. 10/866,010).

Convex lens 152 has a center of curvature the same as the center of curvature of convex lens 150. Convex lenses 150 and 152 are bonded together with pinhole beam-splitter 112A in between. Pinhole array beam-splitter 112A is the same as pinhole array beam-splitter 112 shown in FIG. 1e. The pattern of pinholes in pinhole array beam-splitter is chosen to match the requirements of an end use application. An example of a pattern is a two dimensional array of equally spaced pinholes in two orthogonal directions. The pinholes may comprise circular apertures, rectangular apertures, or combinations thereof such as described in cited U.S. patent application Ser. No. 09/917,402 (ZI-15). The spacing between pinholes of pinhole array beam-splitter 112A is the same as shown in FIG. 1e as b with aperture size a.

The non-oblique measurement beams may comprise a oblique and a complimentary measurement beams such that the measurement beams generate standing wave patterns at the measurement object such as described in cited U.S. patent application Ser. No. 10/954,625 (ZI-55).

An advantage of the third embodiment is that information can be obtained about the measurement object using one or more of the two complimentary oblique measurement beams and non-oblique measurement with a single interferometric metrology system without rotation of either the measurement object or the interferometric metrology system and without changes in the relative location of the single interferometric metrology system with respect to the measurement object in the z direction to make for example overlay metrology measurements. In particular, information about two different surfaces of a measurement object can be obtained simultaneously.

In the third embodiment of the present invention, the information obtained about the location of feature on a measurement object in a plane parallel to the surface of the measurement object is obtained operating in a scanning mode as with each of various embodiments of the present invention. The statistical and systematic errors in the phases of the measured conjugated quadratures obtained when operating in a scanning mode are reduced as a consequence of using the bi-homodyne detection method or variants thereof. The statistical and systematic errors are also reduced as a consequence of the detection of information about a large array of image spots on a substrate simultaneously as a consequence of using a detector comprising a large array of pixels. This feature leads to reduced sensitivity to vibrations and a high throughput.

The statistical and systematic errors obtained in the third embodiment of the present invention are further reduced as a consequence of the design of the pinhole array 112A, the slit array 114A, and the masks 112B and 114B, respectively, to permit the simultaneous acquisition of information using oblique measurement beams, complimentary oblique measurement beams, and non-oblique measurement beams. The information obtained with the non-oblique measurement beams is used to measure the height profile of a surface of a measurement object and in particular the height of features in or on the measurement object, to locate the presence of and location of defects, and to detect changes in the vertical position and angular orientation of the measurement object about axes of rotation parallel to the surface of the measurement object that occur during the scanning of the measurement object.

The detected changes in the vertical position and angular orientation of the measurement object are used to correct the measured arrays of conjugated quadratures obtained for the oblique and complimentary oblique measurement beams for changes in the vertical position and angular orientation of the measurement object that occur during the scanning of the measurement object.

The measured height profile of the surface or height of a feature is used in conjunction with the arrays of measured conjugated quadratures obtained for the oblique and complimentary oblique measurement beams to obtain information about the location of features on the surface of the measurement object in a plane parallel to the surface of the measurement object.

In the third embodiment and in other embodiments of the present invention, the conjugated quadratures of fields of reflected/scattered measurement beams may be measured as a function of the angle of incidence of the measurement beams at the measurement object and/or as a function of the angle of reflection or scattering of the reflected/scattered measurement beam. The angles of incidence and the angles of reflection or scattering are selected for example by the design of the relative locations apertures in the masks 114B and 112B, respectively. Also the range in angles of incidence and the range in the angles of reflection or scattering for a given pixel of the detector are selected for example by the design of the sizes of the apertures in the masks 114B and 112B, respectively. Accordingly, the information about the two different angular dependent properties of the measured conjugated quadratures is obtained simultaneously with corresponding benefits.

A fourth embodiment of the present invention is described for the joint measurement of the conjugated quadratures of fields of complimentary measurement beams reflected/scattered by Porro type prism elements of features of a measurement object. The complimentary measurement beams correspond to two measurement beams that have orthogonal states of linear polarization. The fourth embodiment comprises the apparatus of embodiments described in cited U.S. patent application Ser. No. 10/816,180 (ZI-50) and the apparatus and procedures of the first embodiment described herein.

For each of the first, second, third, and fourth embodiments of the present invention and variants thereof, the interferometric metrology systems may be configured in other embodiments to obtain information in the form of joint and non-joint measurements of the angular distribution of differential conjugated quadratures of reflected/scattered beams from Porro type prism elements in features of measurement objects. The other embodiments comprise the apparatus described in U.S. patent application Ser. No. 10/938,408 (ZI-54) for the acquisition of information about angular distributions.

A fifth embodiment of the present invention is described for the measurement of the CDs using optical coherence-domain reflectometry (OCDR). The fifth embodiment may be described as a variant of the Mirau interferometer wherein the variant thereof is configured to measure properties of backscattered reference and measurement beams instead of beams reflected or forward scattered by reference and measurement objects, respectively. The apparatus of the fifth embodiment comprises the apparatus of the first embodiment except with respect to the generation of the measurement and reference beams and the source 18 and beam-conditioner 22. In the fifth embodiment, source 18 is a pulsed source with each pulse of input beam 24 produced with a short coherence length.

In the fifth embodiment, the measurement and reference beams are generated in element 1258 shown diagrammatically in FIG. 1h. Element 1258 is used in place of element 258 of the first embodiment shown in FIG. 1d. Elements 54A, 54B, and 54C shown in FIG. 1d are not used in the fourth embodiment so that input beam 24 enters interferometer 100 as 24A. Measurement beam 24A is incident on slit-array 114 and a portion thereof transmitted as an array of diffracted input beams as shown in FIG. 1f. A diagram of slit-array 114 is shown in FIG. 1g where the width of the slits is c and the pitch of the slit array is d. The array of input beams is incident on non-polarizing beam-splitter 116 and a portion thereof reflected as an array of input beams forming the input beam component of beam 26A. The optical elements in FIG. 1f correspond to the optical elements in FIG. 1d.

The input beam component of beam 26A is incident on catadioptric elements 40 and 44 and exit elements 40 and 44 as an array of input beams forming the input beam component of beam 28A. As shown diagrammatically in FIG. 1h, input beam component of beam 28A is incident on non-polarizing beam splitter 1116 after transmission by lens 254 and a portion of lens 1258. First and second portions of the input beam component incident on beam-splitter 1116 are transmitted and reflected as measurement and referenced beams, respectively. The measurement beam is subsequently transmitted by the plane facet of lens 1258 and incident on measurement object 60. The reference beam is incident on reference object 1114 comprising an array of scattering sites, i.e., Porro type elements such as shown in FIG. 4a. The description of lens 1258 is other wise the same as the description of lens 258.

A portion of the measurement beam incident on measurement object 60 is backscattered by scattering sites, e.g. Porro type prism elements and gratings, and transmitted by beam-splitter 1116 to form the return measurement beam. A portion of the reference beam incident on reference object 1114 is backscattered by the scattering sites and reflected by beam-splitter 1116 to form the return reference beam.

The return measurement and the return reference beams are imaged on pinhole array 12 by the catadioptric imaging system of interferometer 100. A portion of the return measurement and the return reference beams that are imaged on pinhole array 12 are transmitted and imaged by second imaging system 110 on pixels of detector 70 as a mixed beam. The mixed beam is detected by a quantum detection process by detector 70 to generate signal 72.

The detection of the backscattered measurement beam in the OCDR is accomplished by the method of white-light interferometry in which the location of measurement object 60 is adjustable. This method utilizes the fact that interference fringes will appear in the recombined, i.e. mixed, beam only when the difference in the optical path length between the reference and measurement paths is less than the coherence length of the beam.

Information about the height and transverse locations of the scattering sites in measurement object 60 are obtained by processing signal 72 in a manner such as used with the Mirau interferometer. For information about the transverse location of scattering sites such as formed for example by surfaces 520 and 540 of a Porro type prism element shown in FIG. 4a, the measurement object is scanned with either interferometer 100 or measurement object rotated by 180 degrees.

If the profile of the wafer surface is not flat, there will be an error introduced in the measured location of features in the scan direction. The profile of the wafer surface is measured by the use of a differential interferometric confocal and/or an interferometric non-confocal microscopy system preferentially operating in a dark field mode. The differential interferometric microscopy systems are such as described herein in the section entitled "Differential Interferometric Microscopy Systems." The differential interferometric microscopy systems may in addition be used to detect defects at either of the two sites. The measured profile and the sensitivity function $\partial \Phi_m / \partial z_0$ given by Eq. (23) is used to compute the correction that needs to be made to the measured location of features in the scan direction to obtain a value corrected for a non-flat profile.

A variant of the fifth embodiment is configured to obtain the information of the fifth embodiment without rotation of interferometer 100 or measurement object 60 by 180 degrees. The variant of the fifth embodiment comprises the apparatus of the fifth embodiment with a set of shutters such as used in the variant of the second embodiment of the present invention. The remaining portion of the description of the variant of the fourth embodiment is the same as corresponding portions of the fourth embodiment and the variant of the second embodiment.

It will be apparent to those skilled in the art that there are other embodiments of the present invention comprising apparatus of the described embodiments of the present invention that within the same instrument, the required measurements and analyses for overlay, the alignment mark, the CD metrology systems can be achieved without departing from the spirit and scope of the present invention.

Embodiments of the present invention can be extended to operate not only into the VUV but also into the EUV. This is achieved by the use of pellicle type beam-splitters such as described in U.S. patent application Ser. No. 10/948,959 (ZI-56) and self supporting beam-splitters such as described by T. Haga, M. C. K. Tinone, M. Shimada. T. Ohkubo, and A. Ozawa in a article entitled "Soft x-ray multilayer beam splitters," *J. Synchrotron Rad.*, 5, pp 690 (1998). The description herein of techniques used in source 18 and beam-conditioner 22 for the generation of UV and VUV measurement and reference beams also can be used to generate EUV measurement and reference beams.

For the extension of operation of at least some the embodiments of the present invention into the EUV, a beam combining beam-splitter in a respective interferometric imaging system with a beam combining thin fluorescent layer or interface may be beneficially used such as described in cited U.S. patent application Ser. No. 10/948,959 (ZI-56). The use of a fluorescent layer impacts on the performance specifications required of optical elements and/or detector that follow the beam combining function to achieve a certain end use performance. The thin fluorescent layer, e.g. lumogen, absorbs light at one wavelength, e.g. the UV, VUV, or EUV and emits light at a longer wave length, e.g. in the visible. Thus there is a concomitant reduction in the required performance specifications of the subsequent optical elements because the subsequent optical elements serve only to transmit beams and generate optical images at the longer wavelength instead of at the shorter wavelength beam.

Differential Interferometric Microscopy Systems

The differential interferometric microscopy systems of the confocal and non-confocal type are used in at least some embodiments of the present invention. The embodiment of the present invention that comprises a differential interferometric confocal microscopy system is the same as the differential interferometric confocal microscopy system described in U.S. patent application Ser. No. 10/816,180 (ZI-50). The differential interferometric confocal microscopy system is configured to operate in a dark field mode preferably and compares interferometrically the properties of two transversely separated sections of an open or filled feature of a mask, patterned wafer, or an unpatterned wafer. If the properties of the two transversely separated sections are identical as the mask, patterned wafer, or unpatterned wafer is scanned, there will be no change in the measured conjugated quadratures. However, if at a certain location on the mask or patterned wafer, there is a difference in the two interferometrically compared sections, there will be a change in the measured conjugated quadratures.

The difference in properties may be in the form of a surface profile, widths of the two sections, depths of the two sections, or a particle located on the surface or in one of the two sections. A difference in the two widths will generate a difference in the amplitudes of the beams scattered by the entrance plane aperture formed by the feature sections. A difference in the depths of the two sections or the presence of a particle located in one of the two sections will modify the properties of the leaky guided wave modes that are excited in the features by the respective measurement beams. The description of the excited leaky guided wave modes and the fields radiated by the excited leaky guided wave modes is the same as described in commonly owned U.S. patent application Ser. No. 10/765,254 (ZI-46), entitled "Leaky Guided Wave Modes Used in Interferometric Confocal Microscopy to Measure Properties of Trenches," by Henry A. Hill and incorporated herein in its entirety by reference.

The sensitivity of the change in measured conjugated quadratures to changes in CDs and to depths are measured using independent measurements of the CDs or a simplified inversion analysis. The inversion analysis is simplified as a consequence of the primary measurements being differential. Detailed knowledge of the reflecting properties of two sections that are being compared interferometrically is required when the composition of the two sections are materially different. Because of the high level of modal structure of masks and patterned wafers, a detailed knowledge of the mask and patterned wafer structure is not required in the location of errors in CDs.

Figure 3:
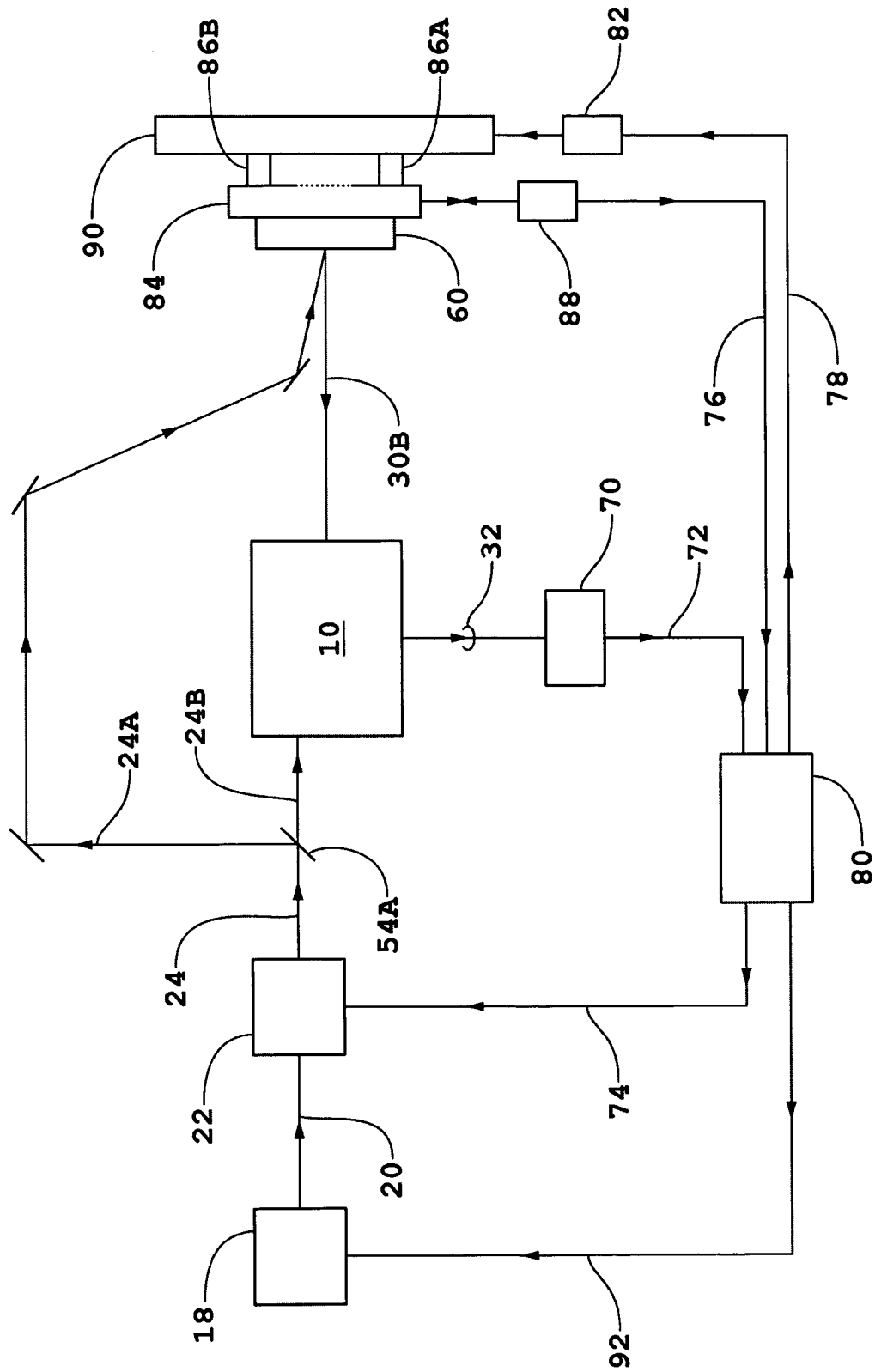
FIG. 3 is a diagram of an interferometric non-confocal microscopy system.

A differential interferometric non-confocal is shown generally in FIG. 3. The description of FIG. 3 is the same as the description given for FIG. 1a except with respect to measurement beam 24A. In FIG. 3, measurement beam 24A is incident on measurement object 60 with an angle of incidence that is nominally zero. The primary difference between the information obtained about the open or filled transparent features using the confocal and non-confocal interferometric microscopy systems is with respect to the properties of the leaky guided wave modes that are excited.

Information is obtained about the surface profile or the horizontal surface of an open or filled transparent feature or features with a reduced lateral spatial resolution and a reduced depth discrimination of the incident measurement beam for the non-confocal interferometric microscopy system. However, there is an advantage with the non-confocal interferometric microscopy system in that the amplitudes of the excited guided wave modes will generally be larger for the non-confocal interferometric microscopy system as compared to the corresponding confocal system. Another advantage for the non-confocal interferometric microscopy system is that the orders of the excited guided wave modes will generally comprise a smaller set as compared to the corresponding confocal system.

Thus the information obtained about errors in surface profiles, CDs, depths, and the presence of defects in the form of particles from the confocal and the non-confocal interferometric microscopy systems are complimentary and will impact on the selection of one or the other of the confocal or non-confocal systems in an end use application.

In another embodiment of the present invention, the confocal and non-confocal interferometric microscopy systems are combined in a single interferometric microscopy system. The another embodiment comprises the apparatus of the confocal interferometric microscopy system and a beam delivery system for the measurement beam that switches the measurement beam 24A between a slit-array 114 (see FIGS. 1f and 2c) and to object 60 with a nominal zero angle of incidence.

Other embodiments of the present invention are described wherein joint measurements are obtained of the conjugated quadratures of fields of complimentary measurement beams reflected/scattered by defects of a measurement object. The complimentary measurement beams correspond to two measurement beams that have orthogonal states of linear polarization. The other embodiments comprise the apparatus of embodiments described in cited U.S. patent application Ser.

No. 10/816,180 (ZI-50) and the apparatus and procedures of the first embodiment described herein.

In yet other embodiments of the present invention, the interferometric metrology systems may be configured to obtain information in the form of joint and non-joint measurements about the angular distribution of the reflected/scattered beams by defects in measurement objects. The yet other embodiments comprise the apparatus described in U.S. patent application Ser. No. 10/938,408 (ZI-54) for the acquisition of information about angular distributions.

Many of the embodiments of the present invention can be configured for operation in the transmission mode consistent with properties of the mask or wafer for which alignment mark, overlay, and/or CD information is required. The description of these embodiments is the same as the descriptions of interferometric metrology systems as described for example in U.S. patent application Ser. No. 10/948,959 (ZI-56).

Interferometric Microscopy Systems: Near- and Evanescent-Field Probe Beams

Other embodiments of the present invention may be configured to operate with measurement beams that have the properties of a near-field or an evanescent field at the wafer. Evanescent fields are generated by selecting the angle of incidence $\theta_2$ (see FIG. 2d) of the measurement beams at the plane surface of plano-convex lens 258 to be greater than that required to produce total internal reflection and the separation $h \leq \lambda/4$ such as described in cited U.S. patent application Ser. No. 10/866,010 (ZI-52) and Ser. No. 10/948,959 (ZI-56). The angle of incidence may be selected by the relative locations of apertures used in a mask such as mask 114B of the third embodiment of the present invention.

The non-oblique measurement beams at substrate 60 may be in the form of near-fields when an array of transmitting sub-wavelength apertures is located on the plane surface of plano-convex lens 258 and the separation $h \leq \lambda/4$ such as described in cited U.S. Pat. No. 6,445,453 (ZI-14).

The information obtained with other embodiments of the present invention has for example the high sensitivities of an interferometric metrology system to vertical displacements of a surface and to asymmetries at a site on a wafer. The high sensitivities of interferometric metrology systems based on use of near- or evanescent-field measurement beams lead to high accuracies in overlay, alignment mark, CD metrology systems, and defect detection. The complexity of inversion procedures used in the overlay, alignment mark, and CD metrology systems based on a rigorous treatment of scattering is generally reduced because the patterns on the wafer under measurement need not be overlapping in order to obtain the desired information with required accuracy.

The interferometric metrology systems described above can be especially useful in alignment mark identification on a stepper or scanner of lithography applications used for fabricating large scale integrated circuits such as computer chips and the like and in a stand-alone metrology system for measuring CD and overlay performance of the stepper or scanner. The interferometric metrology systems described above can also be especially useful in inspection of masks used in the stepper or scanner and in the inspection of wafers at different stages of the fabrication of large-scale integrated circuits.

Lithography is the key technology driver for the semiconductor manufacturing industry. In particular, overlay improvement is one of the five most difficult challenges down to and below 100 nm line widths (design rules), see, for example, the *Semiconductor Industry Roadmap*, pp 82 (1997). Since a lithography tool may produce $50-100M/year of product, the economic value from improving (maintaining) performance of the lithography tool is substantial. Each 1% increase (loss) in yield of the lithography tool results in approximately $1M/year economic benefit (loss) to the integrated circuit manufacturer and a substantial competitive advantage or disadvantage to the lithography tool vendor.

Overlay is measured by printing one pattern on one level of a wafer and a second pattern on a consecutive level of the wafer and then measuring, on a stand-alone metrology system, the difference in the position, orientation, and distortion of the two patterns.

A stand-alone metrology system for measuring overlay comprises a microscope system for viewing the patterns, such as the catadioptric imaging systems described above, connected to laser gauge-controlled stage for measuring the relative positions of the patterns, and a wafer handling system.

The function of a lithography tool is to direct spatially patterned radiation onto a photoresist-coated wafer. The process involves determining which location of the wafer is to receive the radiation (alignment) and applying the radiation to the photoresist at that location.

To properly position the wafer, the wafer includes alignment marks on the wafer that can be measured by dedicated sensors such as the interferometric metrology systems described above. The measured positions of the alignment marks define the location of the wafer within the tool. This information, along with a specification of the desired patterning of the wafer surface, guides the alignment of the wafer relative to the spatially patterned radiation. Based on such information, a translatable stage supporting the photoresist-coated wafer moves the wafer such that the radiation will expose the correct location of the wafer.

During exposure, a radiation source illuminates a patterned reticle, which scatters the radiation to produce the spatially patterned radiation. The reticle is also referred to as a mask, and these terms are used interchangeably below. In the case of reduction lithography, a reduction lens collects the scattered radiation and forms a reduced image of the reticle pattern. Alternatively, in the case of proximity printing, the scattered radiation propagates a small distance (typically on the order of microns) before contacting the wafer to produce a 1:1 image of the reticle pattern. The radiation initiates photo-chemical processes in the resist that convert the radiation pattern into a latent image within the resist.

When a mask is made, it must be perfect. Any defects in the pattern will destroy the functionality of the semiconductor circuit that is printed with that mask. Before a mask is delivered to the semiconductor manufacturing line, it is passed through an automated mask inspection system that searches for any defects in the pattern. There are two possible strategies in mask inspection, known as die-to-database and die-to-die inspection. The first method involves an automated scanning microscope or an interferometric metrology system described herein that compares the mask pattern directly with the computer data used to generate the mask. This requires a very large data handling capability, similar to that needed by the mask writer itself. Any discrepancy between the inspected mask pattern and the data set used to create it is flagged as an error. The interferometric metrology systems described above are especially well suited for automated mask inspection with its advantages in background reduction and in the substantially simultaneous acquisition of one-dimensional line section images and two-dimensional section images.

In general, the lithography system, also referred to as an exposure system, typically includes an illumination system and a wafer positioning system. The illumination system includes a radiation source for providing radiation such as ultraviolet, visible, x-ray, electron, or ion radiation, and a reticle or mask for imparting the pattern to the radiation, thereby generating the spatially patterned radiation. In addition, for the case of reduction lithography, the illumination system can include a lens assembly for imaging the spatially patterned radiation onto the wafer. The imaged radiation exposes resist coated onto the wafer. The illumination system also includes a mask stage for supporting the mask and a positioning system for adjusting the position of the mask stage relative to the radiation directed through the mask. The wafer positioning system includes a wafer stage for supporting the wafer and a positioning system for adjusting the position of the wafer stage relative to the imaged radiation. Fabrication of integrated circuits can include multiple exposing steps. For a general reference on lithography, see, for example, J. R. Sheats and B. W. Smith, in *Microlithography: Science and Technology* (Marcel Dekker, Inc., New York, 1998), the contents of which is incorporated herein by reference.

Figure 7A:
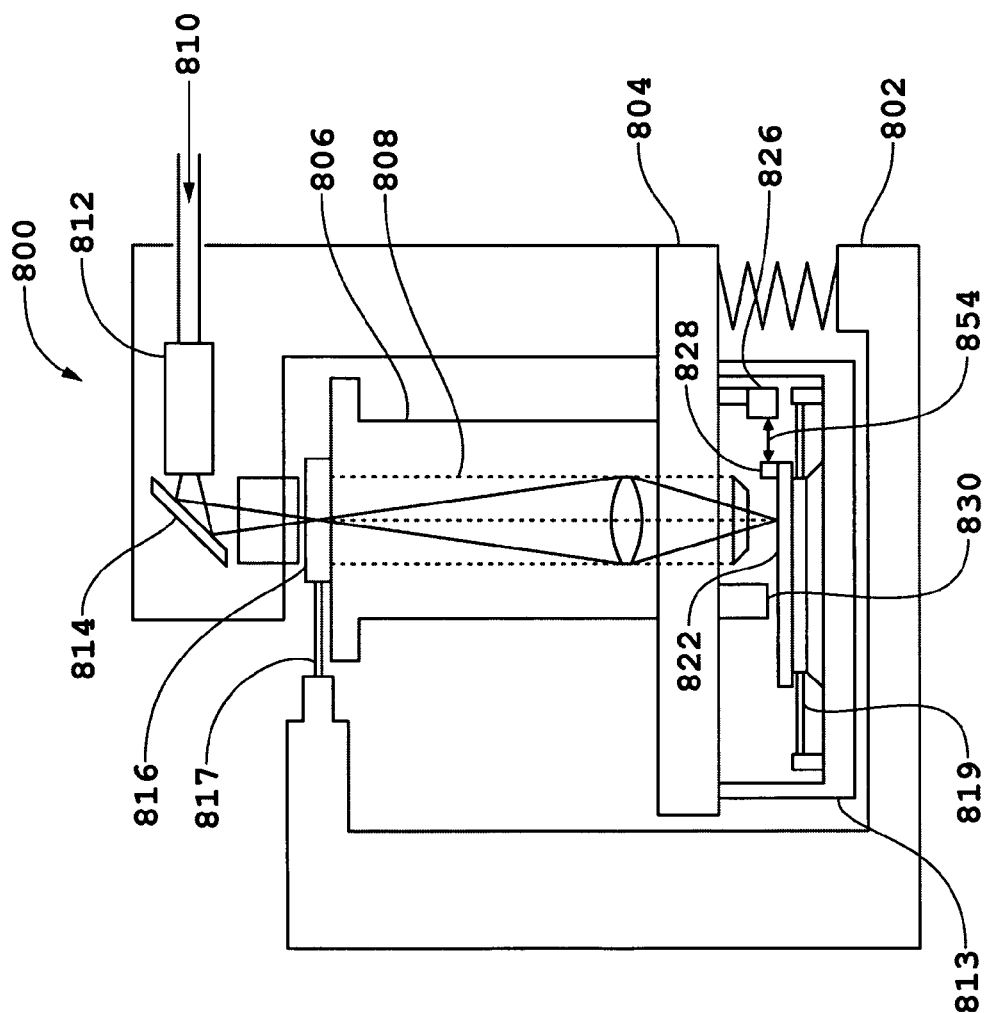
FIG. 7a is a schematic diagram of a lithography tool that uses an interferometric metrology system.

An example of a lithography scanner 800 using an interferometric metrology system 830 is shown in FIG. 7a. Interferometric metrology system 830 is used to precisely locate the position of alignment marks on the wafer (not shown) within an exposure system. Here, stage 822 is used to position and support the wafer relative to an exposure station. Scanner 800 includes a frame 802, which carries other support structures and various components carried on those structures. An exposure base 804 has mounted on top of it a lens housing 806 atop of which is mounted a reticle or mask stage 816, which is used to support a reticle or mask. A positioning system for positioning the mask relative to the exposure station is indicated schematically by element 817. Positioning system 817 can include, e.g. piezoelectric transducer elements and corresponding control electronics. Although, it is not included in this described embodiment, one or more interferometry systems are used to precisely measure the position of the mask stage as well as other moveable elements whose position must be accurately monitored in processes for fabricating lithographic structures (see supra Sheats and Smith *Microlithography: Science and Technology*).

Suspended below exposure base 804 is a support base 813 that carries wafer stage 822. Stage 822 includes a plane mirror 828 for reflecting a measurement beam 854 directed to the stage by interferometry system 826. A positioning system for positioning stage 822 relative to interferometry system 826 is indicated schematically by element 819. Positioning system 819 can include, e.g. piezoelectric transducer elements and corresponding control electronics. The measurement beam reflects back to the interferometry system, which is mounted on exposure base 804.

During operation, a radiation beam 810, e.g. an UV beam from a UV laser (not shown), passes through a beam shaping optics assembly 812 and travels downward after reflecting from mirror 814. Thereafter, the radiation beam passes through a mask (not shown) carried by mask stage 816. The mask (not shown) is imaged onto a wafer (not shown) on wafer stage 822 via a lens assembly 808 carried in a lens housing 806. Base 804 and the various components supported by it are isolated from environmental vibrations by a damping system depicted by spring 820.

Interferometric metrology system 830 such as described above is used to locate the position of alignment marks on the wafer and/or the wafer stage 816

Figure 7B:
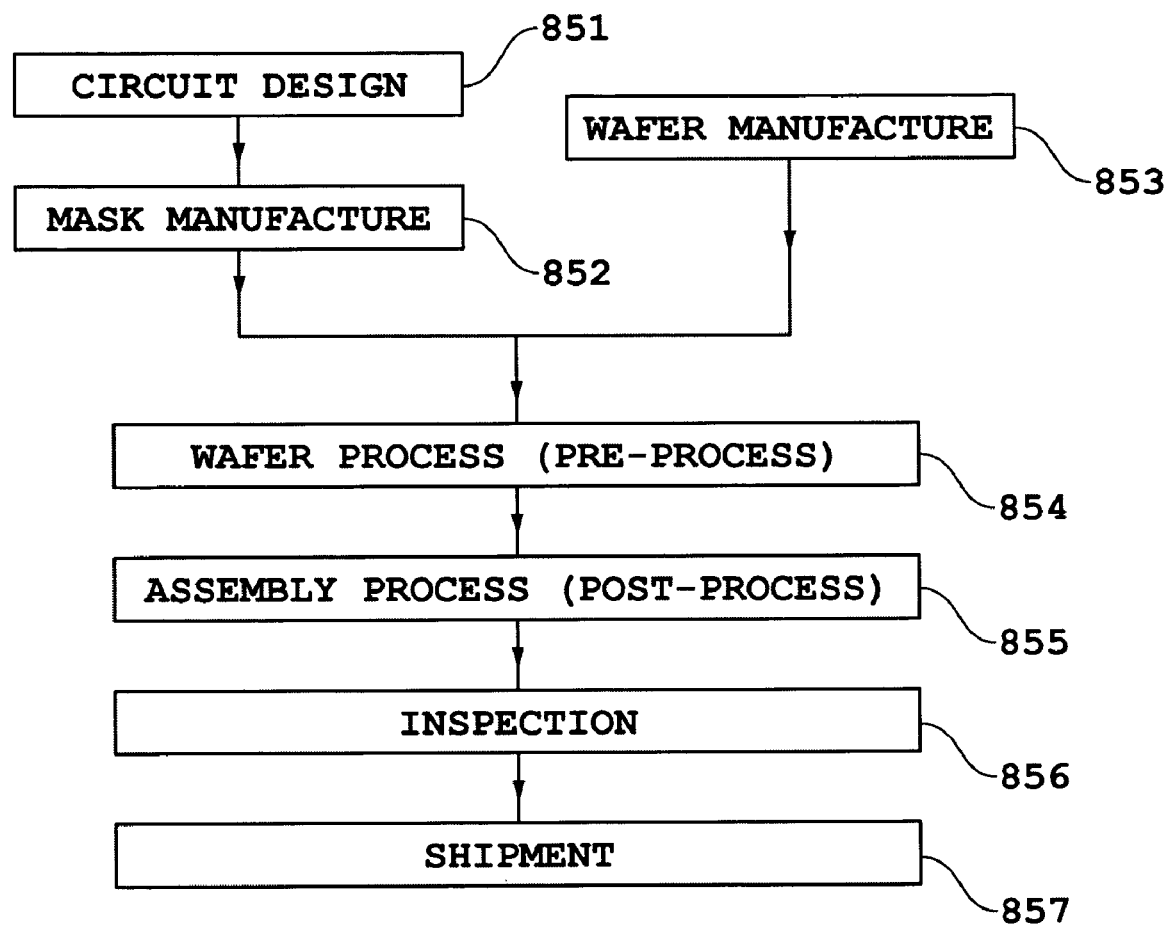
FIG. 7b is a flow chart of the sequence of manufacturing steps of a semiconductor device.

As is well known in the art, lithography is a critical part of manufacturing methods for making semiconductor devices. For example, U.S. Pat. No. 5,483,343 outlines steps for such manufacturing methods. These steps are described below with reference to FIGS. 7b and 7c. FIG. 7b is a flow chart of the sequence of manufacturing a semiconductor device such as a semiconductor chip (e.g. IC or LSI), a liquid crystal panel or a CCD. Step 851 is a design process for designing the circuit of a semiconductor device. Step 852 is a process for manufacturing a mask on the basis of the circuit pattern design. Step 853 is a process for manufacturing a wafer by using a material such as silicon.

Step 854 is a wafer process, which is called a pre-process wherein, by using the so prepared mask and wafer, circuits are formed on the wafer through lithography. To form circuits on the wafer that correspond with sufficient spatial resolution those patterns on the mask, interferometric positioning of the lithography tool relative the wafer is necessary. The catadioptric imaging systems described herein can be especially useful to inspect the surface of the wafer and internal layers generate on the wafer by wafer processing to check and monitor the effectiveness of the lithography used in the wafer process. Step 855 is an assembling step, which is called a post-process wherein the wafer processed by step 854 is formed into semiconductor chips. This step includes assembling (dicing and bonding) and packaging (chip sealing). Step 856 is an inspection step wherein operability check, durability check and so on of the semiconductor devices produced by step 855 are carried out. With these processes, semiconductor devices are finished and they are shipped (step 857).

Figure 7C:
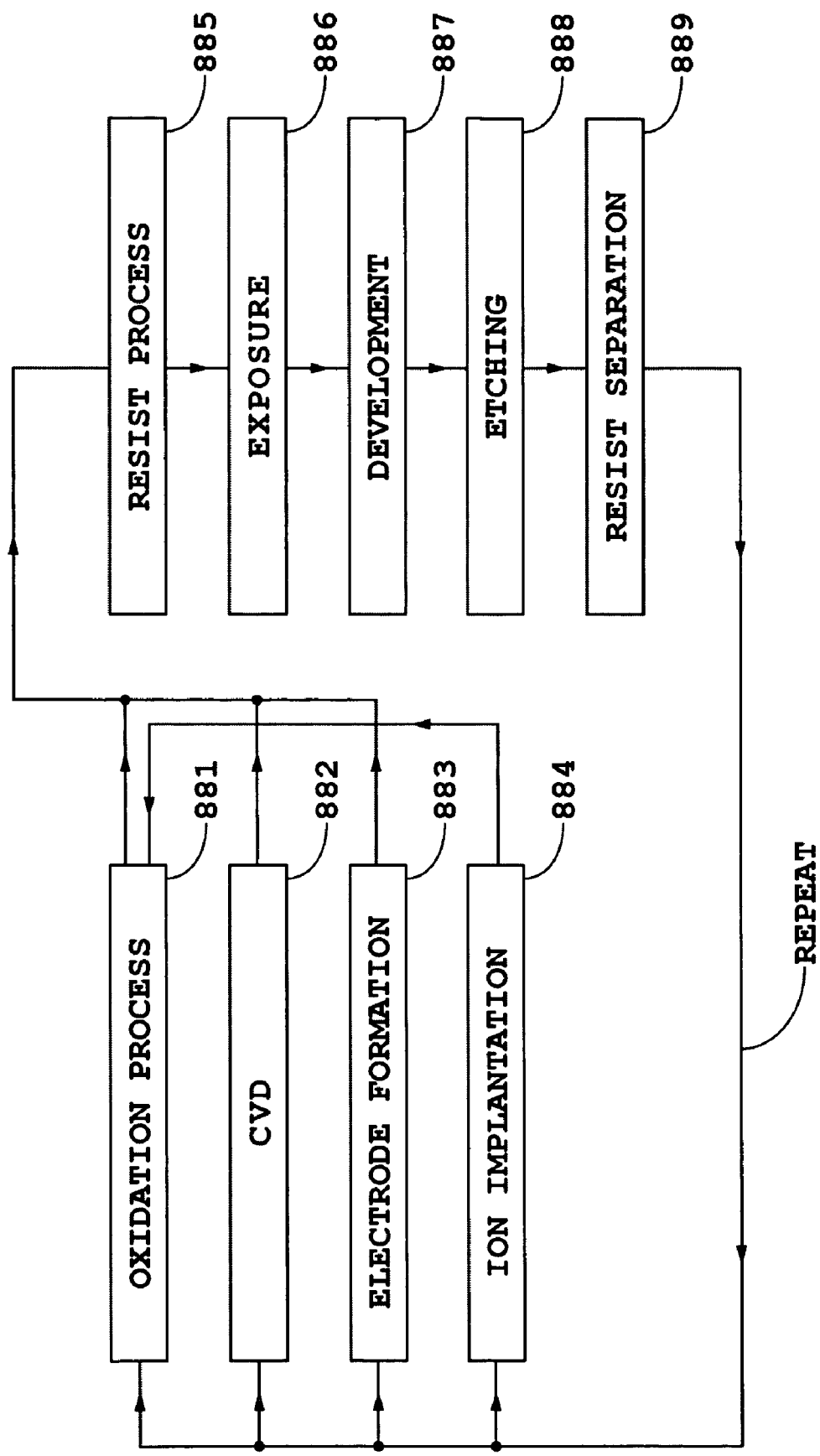
FIG. 7c is a flow chart showing steps of the wafer process.

FIG. 7c is a flow chart showing details of the wafer process. Step 861 is an oxidation process for oxidizing the surface of a wafer. Step 862 is a CVD process for forming an insulating film on the wafer surface. Step 863 is an electrode forming process for forming electrodes on the wafer by vapor deposition. Step 864 is an ion implanting process for implanting ions to the wafer. Step 865 is a resist process for applying a resist (photosensitive material) to the wafer. Step 866 is an exposure process for printing, by exposure (i.e., lithography), the circuit pattern of the mask on the wafer through the exposure apparatus described above. Once again, as described above, the use of the catadioptric imaging systems described herein improve the accuracy, resolution, and maintenance of such lithography steps.

Step 867 is a developing process for developing the exposed wafer. Step 868 is an etching process for removing portions other than the developed resist image. Step 869 is a resist separation process for separating the resist material remaining on the wafer after being subjected to the etching process. By repeating these processes, circuit patterns are formed and superimposed on the wafer.

Figure 8:
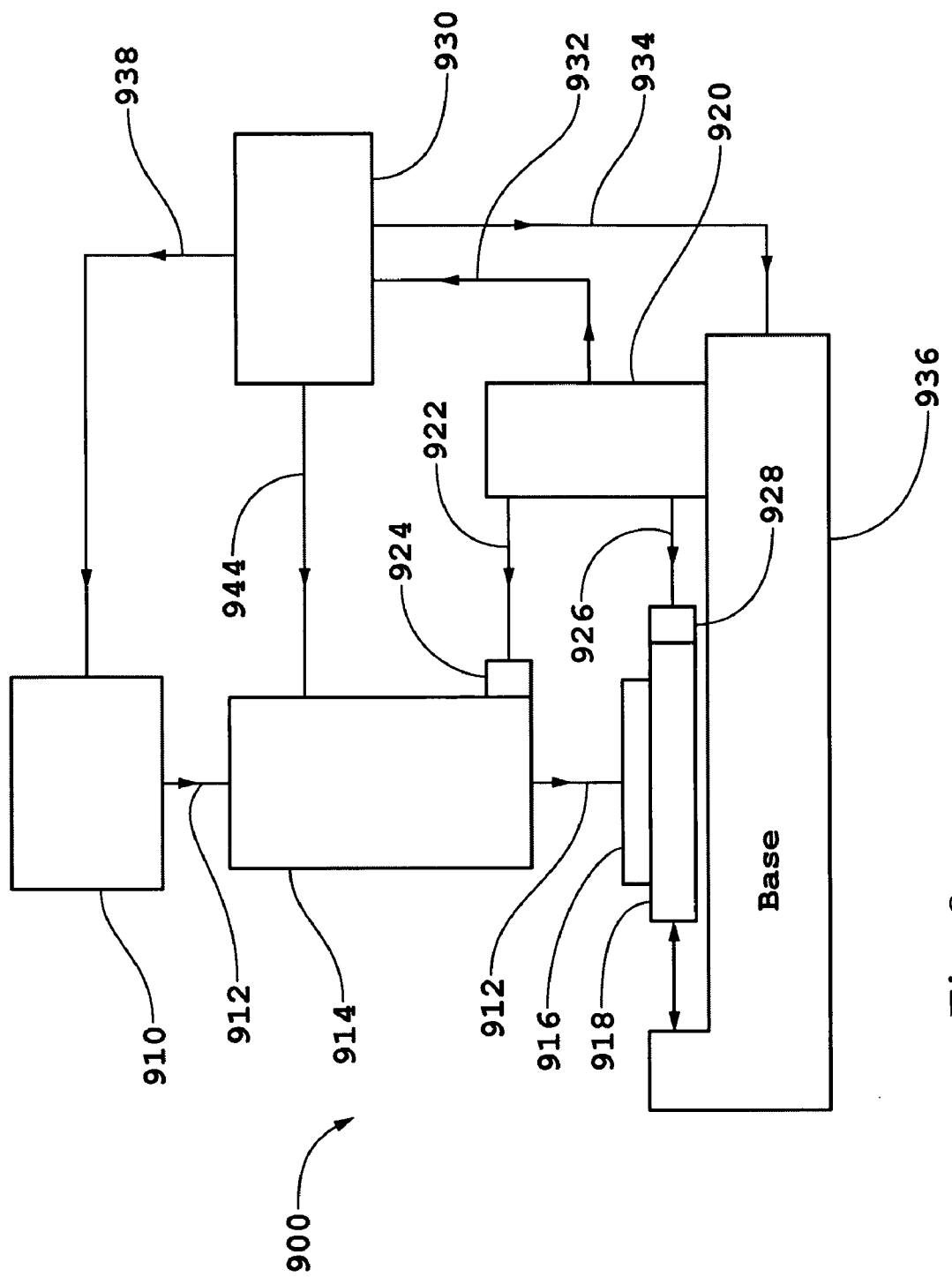
FIG. 8 is a schematic diagram of an inspection tool that uses an interferometric metrology system.

An important application of the interferometric metrology systems described herein is the inspection of patterns on masks and reticles used in the lithography methods described previously, the measurement of CD's and overlay on wafers and the inspection of the masks, reticles, and wafers for defects. As an example, a schematic of a mask and wafer inspection system 900 is shown in FIG. 8. A source 910 generates a source beam 912 and an interferometric metrology system 914 such as described herein directs the radiation beam to a substrate 916 supported by a movable stage 918. To determine the relative position of the stage, an interferometry system 920 directs a reference beam 922 to a mirror 924 mounted on beam focusing assembly 914 and a measurement beam 926 to a mirror 928 mounted on stage 918. Changes in the position measured by the interferometry system correspond to changes in the relative position of write beam 912 on substrate 916. Interferometry system 920 sends a measurement signal 932 to controller 930 that is indicative of the relative position of inspection beam 912 on substrate 916. Controller 930 sends an output signal 934 to a base 936 that supports and positions stage 918.

Controller 930 can cause interferometric metrology system assembly 914 to scan the inspection beam over a region of the substrate, e.g. using signal 944. As a result, controller 930 directs the other components of the system to inspect the substrate. The mask and wafer inspection measures overlay and compares the mask, reticle, or wafer pattern obtained with interferometric metrology system 914 directly with computer data used to generate the mask, reticle or the pattern on the wafer.

Other embodiments are within the following claims:

What is claimed is:

1. An interferometry system for examining a surface of an object, said system comprising:
    a source assembly that generates a first measurement beam and a second measurement beam;
    a detector assembly that includes a first detector element and a second detector element;
    an interferometer that includes a source imaging system that focuses the first measurement beam onto a first spot on a first plane that is in or on the object and focuses the second measurement beam onto a second spot on second plane below the first plane and an object imaging system that images the first spot onto the first detector element as a first interference beam to generate a first interference signal therefrom and images the second spot onto the second detector element as a second interference beam to generate a second interference signal therefrom, said object imaging system combining a first return measurement beam coming from the first spot with a first reference beam to produce the first interference beam and combining a second return measurement beam coming from the second spot with a second reference beam to produce the second interference beam, wherein the first measurement beam upon interaction with the object produces a first backscattered component and a first forward-scattered component and the second measurement beam upon interaction with the object produces a second backscattered component and a second forward-scattered component; and
    a processor programmed to determine oblique angle-of-incidence information about a feature of the object by using the first and second backscattered components but not either of the first and second forward scattered components.

2. The interferometry system of claim 1, wherein the source assembly has an optical axis and includes a pinhole array beam splitter that has a first portion and a second portion that is displaced from the first portion in a direction that is along said optical axis, wherein said first portion produces the first measurement beam and said second portion produces the second measurement beam.

3. The interferometry system of claim 2, wherein the first portion is located in a plane that is conjugate to the first plane and the second portion is locate in a plane that is conjugate to the second plane.

4. The interferometry system of claim 1, wherein the object imaging system has an optical axis and includes a pinhole array beam combiner that has a first portion and a second portion that is displaced from the first portion in a direction that is along said optical axis, wherein said first portion combines the first return measurement beam with the first reference beam and said second portion combines the second return measurement beam with the second reference beam.

5. The interferometry system of claim 4, wherein the first portion is located in a plane that is conjugate to the first plane and the second portion is locate in a plane that is conjugate to the second plane.

6. The interferometry system of claim 1, wherein the object imaging system is configured to collect the first and second backscattered components but not the first and second forward scattered components to generate the first and second return measurement beams.

7. The interferometry system of claim 1, wherein the source imaging system generates the first measurement beam such that it has an angle of incidence relative to the surface of the object that range between $\theta_1$ and $\theta_2$, wherein $\theta_1$ and $\theta_2$ are angles that are less than 90° and wherein $\theta_1 < \theta_2$.

8. The interferometry system of claim 1, wherein the interferometer is a linear displacement interferometer.

9. The interferometry system of claim 1, wherein the interferometer is a scanning, linear displacement interferometer.

10. The interferometry system of claim 1, further comprising a catadioptric imaging system that implements at least part of both the source imaging system and the object imaging system.

11. The interferometry system of claim 1, wherein the feature is overlay alignment on the object.

12. An interferometry system for examining a surface of an object, said system comprising:
    a source assembly that generates a first measurement beam and a second measurement beam;
    a detector assembly that includes a first detector element and a second detector element; and
    an interferometer that includes a source imaging system that focuses the first measurement beam onto a first spot on a first plane on or in the object and focuses the second measurement beam onto a second spot on a second plane that is below the first plane and an object imaging system that images the first spot onto the first detector element as a first interference beam to generate a first interference signal therefrom and images the second spot onto the second detector element as a second interference beam to generate a second interference signal therefrom, said object imaging system combining a first return measurement beam coming from the first spot with a first reference beam to produce the first interference beam and combining a second return measurement beam coming from the second spot with a second reference beam to produce the second interference beam,
    wherein the source imaging system causes the first and second measurement beams that arrive at the surface of the object to have average angles of incidence that are oblique to the surface of object,
    wherein each of the first and second measurement beams upon interaction with the object produces corresponding first and second backscattered and forward-scattered components, and
    wherein the object imaging system is configured to collect the first and second backscattered components but not either of the first and second forward scattered components to generate the first and second return measurement beams, respectively.

13. The interferometry system of claim 12, wherein the object imaging system is configured to collect the first and second backscattered components but not the first and second forward scattered components to generate the first and second return measurement beams.

14. The interferometry system of claim 12, wherein the source imaging system generates the first measurement beam such that it has an angle of incidence relative to the surface of the object that range between $\theta_1$ and $\theta_2$, wherein $\theta_1$ and $\theta_2$ are angles that are less than 90° and wherein $\theta_1 < \theta_2$.

15. The interferometry system of claim 12, wherein the interferometer is a linear displacement interferometer.

16. The interferometry system of claim 12, wherein the interferometer is a scanning, linear displacement interferometer.

17. The interferometry system of claim 12, further comprising a catadioptric imaging system that implements at least part of both the source imaging system and the object imaging system.

18. An interferometry system for examining a surface of an object, said system comprising:
   a source assembly that generates a first array of measurement beams and a second array of measurement beams;
   a detector assembly that includes a first array of detector elements and a second array of detector elements;
   an interferometer that includes a source imaging system that focuses the first array of measurement beams onto a first array of spots on a first plane on or in the object and focuses the second array of measurement beams onto a second array of spots on a second plane that is below the first plane and an object imaging system that images the first array of spots onto the first array of detector elements as a first array of interference beams and images the second array of spots onto the second array of detector elements as a second array of interference beams, said object imaging system combining a first array of return measurement beams coming from the first array of spots with a first array of reference beams to produce the first array of interference beams and combining a second array of return measurement beams coming from the second array of spots with a second array of reference beams to produce the second array of interference beams, wherein the first and second arrays of measurement beams upon interaction with the surface of the object produce corresponding first and second arrays of backscattered components and corresponding first and second arrays of forward-scattered components; and
   a processor programmed to determine oblique angle-of-incidence information about a feature on the object by using the first and second arrays of backscattered components but not the first and second arrays of forward scattered components.

19. The interferometry system of claim 18, wherein the source assembly has an optical axis and includes a pinhole array beam splitter that has a first portion and a second portion that is displaced from the first portion in a direction that is along said optical axis, wherein said first portion produces the first array of measurement beams and said second portion produces the second array of measurement beams.

20. The interferometry system of claim 19, wherein the first portion is located in a plane that is conjugate to the first plane and the second portion is locate in a plane that is conjugate to the second plane.

21. The interferometry system of claim 18, wherein the object imaging system assembly has an optical axis and includes a pinhole array beam combiner that has a first portion and a second portion that is displaced from the first portion in a direction that is along said optical axis, wherein said first level combines the first array of return measurement beams with the first array of reference beams and said second portion combines the second array of return measurement beams with the second array of reference beams.

22. The interferometry system of claim 21, wherein the first portion is located in a plane that is conjugate to the first plane and the second portion is locate in a plane that is conjugate to the second plane.

23. The interferometry system of claim 18, wherein the feature is overlay alignment on the object.

24. A method of interferometrically examining a surface of an object, said method comprising:
   generating a measurement beam;
   focusing the measurement beam onto a first spot on a first plane on or in the object wherein upon interaction with the surface of the object at the first spot the measurement beam produces a backscattered component and a forward-scattered component;
   combining a return measurement beam from the first spot with a reference beam to generate an interference beam;
   generating an interference signal from the interference beam for the first spot;
   focusing the measurement beam onto a second spot on a second plane on or in the object that is below the first plane wherein upon interaction with the surface of the object at the second spot the measurement beam produces a backscattered component and a forward-scattered component;
   combining a return measurement beam from the second spot with a reference beam to generate an interference beam;
   generating an interference signal from the interference beam for the second spot;
   by using at least the interference signals for the first and second spots, determining oblique angle-of-incidence information about a feature of the object, wherein determining involves using the backscattered components but none of the forward scattered components from the first and second spots.

25. The method of claim 24, further comprising for the first spot collecting the backscattered component from the surface of the object but not the forward scattered component to generate the return measurement beam for the first spot and for the second spot collecting the backscattered component from the surface of the object but not the forward scattered component to generate the return measurement beam for the second spot.

* * * * *